(12) United States Patent
Yamazaki et al.

(10) Patent No.: US 9,894,762 B2
(45) Date of Patent: Feb. 13, 2018

(54) ELEMENT AND FORMATION METHOD OF FILM

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Teppei Oguni, Kanagawa (JP); Kiyofumi Ogino, Kanagawa (JP); Hisao Ikeda, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 15/416,610

(22) Filed: Jan. 26, 2017

(65) Prior Publication Data

US 2017/0139508 A1    May 18, 2017

Related U.S. Application Data

(63) Continuation of application No. 14/548,814, filed on Nov. 20, 2014, now Pat. No. 9,572,253.

(30) Foreign Application Priority Data

Dec. 2, 2013 (JP) .................................. 2013-249210
Dec. 2, 2013 (JP) .................................. 2013-249212
Jun. 12, 2014 (JP) .................................. 2014-121142

(51) Int. Cl.
*H05K 1/09* (2006.01)
*G06F 3/044* (2006.01)
(Continued)

(52) U.S. Cl.
CPC .............. *H05K 1/09* (2013.01); *G06F 3/044* (2013.01); *H01B 1/04* (2013.01); *H05K 3/06* (2013.01);
(Continued)

(58) Field of Classification Search
CPC .......... H05K 1/09; H05K 1/092; H05K 1/095; H05K 1/097
See application file for complete search history.

(56) References Cited

U.S. PATENT DOCUMENTS 3,705,846 A    12/1972   Kato et al.
6,495,013 B2   12/2002   Mazur et al.
(Continued)

OTHER PUBLICATIONS

Singh.V et al., "Graphene based materials: Past, present and future", Progress in Materials Science , 2011, vol. 56, pp. 1178-1271, ELSEVIER.
(Continued)

*Primary Examiner* — Jeremy C Norris
(74) *Attorney, Agent, or Firm* — Nixon Peabody LLP; Jeffrey L. Costellia

(57) ABSTRACT

A novel element is provided. A novel film formation method is provided. A novel element manufacturing method is provided. Furthermore, a film including graphene is formed at low cost and high yield. The element includes a first electrode and a second electrode located apart from the first electrode. The first electrode and the second electrode include graphene. The film including graphene is formed through a first step of forming a film including graphene oxide over a substrate, a second step of immersing the film including graphene oxide in an acidic solution, and a third step of reducing graphene oxide included in the film including graphene oxide. Furthermore, before graphene oxide included in the film including graphene oxide is reduced, the film including graphene oxide is selectively removed by a photolithography technique.

18 Claims, 30 Drawing Sheets

(51) Int. Cl.
*H01B 1/04* (2006.01)
*H05K 3/06* (2006.01)
H01L 27/32 (2006.01)
H01L 51/52 (2006.01)

(52) U.S. Cl.
CPC .. *G06F 2203/04103* (2013.01); *H01L 27/323* (2013.01); *H01L 27/3244* (2013.01); *H01L 51/5246* (2013.01); *H01L 2251/5307* (2013.01); *H01L 2251/5315* (2013.01); *H05K 2201/0323* (2013.01); *H05K 2201/10151* (2013.01)

(56) References Cited

U.S. PATENT DOCUMENTS

| | | |
|---|---|---|
| 8,317,984 B2 | 11/2012 | Gilje |
| 8,470,477 B2 | 6/2013 | Miwa et al. |
| 8,709,654 B2 | 4/2014 | Takeuchi et al. |
| 8,883,351 B2 | 11/2014 | Todoriki et al. |
| 2007/0131915 A1 | 6/2007 | Stankovich et al. |
| 2009/0110627 A1 | 4/2009 | Choi et al. |
| 2010/0079384 A1 | 4/2010 | Grivna |
| 2010/0105834 A1 | 4/2010 | Tour et al. |
| 2010/0303706 A1 | 12/2010 | Wallace et al. |
| 2011/0070146 A1 | 3/2011 | Song et al. |
| 2013/0045156 A1 | 2/2013 | Nomoto et al. |
| 2013/0065120 A1 | 3/2013 | Miwa et al. |
| 2013/0084384 A1 | 4/2013 | Yamakaji |
| 2013/0134051 A1 | 5/2013 | Takahashi et al. |
| 2013/0156942 A1 | 6/2013 | Yamakaji et al. |
| 2013/0164619 A1 | 6/2013 | Yamakaji et al. |
| 2013/0212879 A1 | 8/2013 | Ogino |
| 2013/0266859 A1 | 10/2013 | Todoriki et al. |
| 2013/0337320 A1 | 12/2013 | Yukawa |
| 2014/0028597 A1 | 1/2014 | Cho et al. |
| 2014/0104508 A1 | 4/2014 | Yamazaki et al. |
| 2014/0361980 A1 | 12/2014 | Iwaki et al. |
| 2014/0375660 A1 | 12/2014 | Tamaki |
| 2015/0062525 A1 | 3/2015 | Hirakata |
| 2015/0103023 A1 | 4/2015 | Iwaki |

OTHER PUBLICATIONS

Seo.D et al., "Fully transparent InGaZnO thin film transistors using indium tin oxide/graphene multilayer as source/drain electrodes", Appl. Phys. Lett. (Applied Physics Letters), 2010, vol. 97, pp. 172106-1-172106-3.

Blake.P et al., "Graphene-Based Liquid Crystal Device", Nano Letters, Apr. 30, 2008, vol. 8, No. 6, pp. 1704-1708.

Li.N et al., "High Performance Organic Light-Emitting-Diodes on Graphene Electrode and Thin c-Si TFT for Flexible Display and Lighting", SID Digest '13 : SID International Symposium Digest of Technical Papers, 2013, pp. 848-851.

Park.S et al., "Chemical structures of hydrazine-treated graphene oxide and generation of aromatic nitrogen doping", Nature Communications, Jan. 24, 2012, vol. 3, pp. 638-1-638-8.

Pei.S et al., "Direct reduction of graphene oxide films into highly conductive and flexible graphene films by hydrohalic acids", Carbon, 2010, vol. 48, pp. 4466-4474, ELSEVIER.

Tung.V et al., "High-throughput solution processing of large-scale graphene", Nature Nanotechnology, Nov. 9, 2008, vol. 4, No. 1, pp. 25-29.

Wang.G et al., "Highly efficient and large-scale synthesis of graphene by electrolytic exfoliation", Carbon, 2009, vol. 47, pp. 3242-3246, ELSEVIER.

Wu.X et al., "Highly Conductive and Uniform Graphene hybrid Electrode with Chemical Reduction for Flexible Organic Light-Emitting Diodes", SID Digest '14 : SID International Symposium Digest of Technical Papers, Jun. 3, 2014, pp. 1336-1339.

Xin.G et al., "Graphene Sheet Synthesized with Microwave Irradiation and Interlinked by Carbon Nanotubes for High-Performance Transparent Flexible Electrodes", IDW '10 : Proceedings of the 17th International Display Workshops, 2010, pp. 1671-1674.

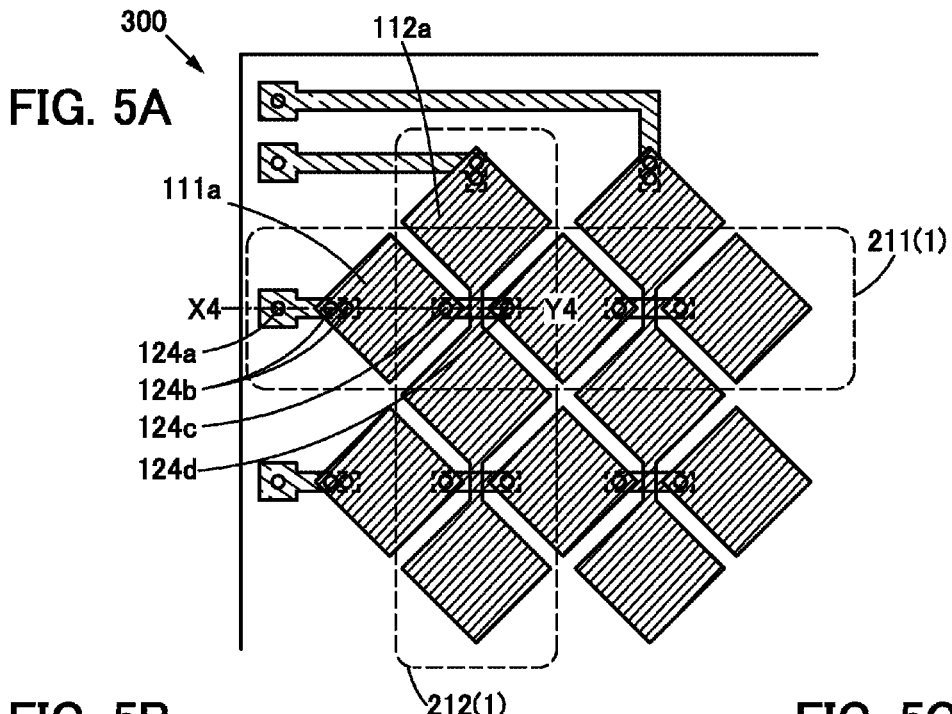
FIG. 5A
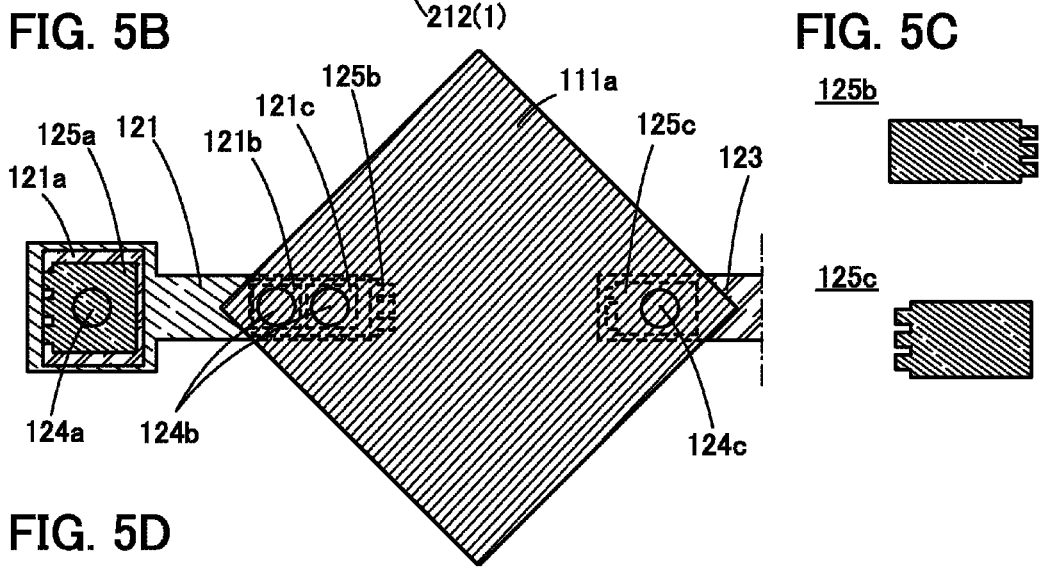
FIG. 5B
FIG. 5C
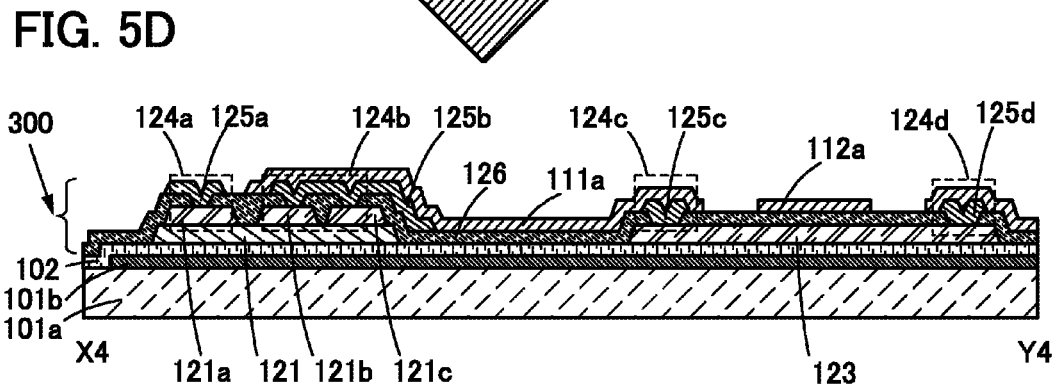
FIG. 5D

ELEMENT AND FORMATION METHOD OF FILM

BACKGROUND OF THE INVENTION

1. Field of the Invention

One embodiment of the present invention relates to a film, an element, a formation method of a film, or a manufacturing method of an element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification and the like include a semiconductor device, a display device, a liquid crystal display device, a light-emitting device, a lighting device, a power storage device, a memory device, an input device, an input/output device, a method for driving any of them, and a method for manufacturing any of them.

2. Description of the Related Art

Graphene is a one-atom-thick sheet of sp2-bonded carbon atoms that form a honeycomb-like hexagonal lattice structure. Strictly speaking, graphene is as defined above; however, in this specification, a carbon film consisting of a plurality of (2 to 100) such sheets stacked is also referred to as graphene.

Graphene is made by a variety of methods; the Hummers method is a simple method and has been used in many researches (see Patent Documents 1 and 2). In the Hummers method, graphite is oxidized with an oxidizer, first. Potassium permanganate is used as the oxidizer, and an acid such as a sulfuric acid is generally added together to promote an oxidation effect.

The oxidized graphite (graphite oxide) retains the layered structure, in which the interlayer distance is, however, larger than that of graphite; thus, the layered structure can be easily broken by ultrasonic treatment or the like, whereby oxidized graphene (graphene oxide) can be obtained. The resulting graphene oxide may have at least one sheet of carbon atoms.

When the graphene oxide is deposited on an appropriate object surface in the form of a thin film shape and reduced, an extremely thin carbon film (graphene) can be formed.

REFERENCE

Patent Document

[Patent Document 1] United States Patent Application Publication No. 2007/0131915
[Patent Document 2] United States Patent Application Publication No. 2010/0303706
[Patent Document 3] U.S. Pat. No. 3,705,846
[Patent Document 4] U.S. Pat. No. 6,495,013

SUMMARY OF THE INVENTION

Graphene is a material having both a light-transmitting property and conductivity and has a possibility of usage in a variety of devices. An object of one embodiment of the present invention is to provide a novel element. Another object is to provide a novel formation method of a film. Another object is to provide a novel manufacturing method of an element. Another object is to provide a formation method of a film including graphene at low cost. Another object is to provide a formation method of a film including graphene at high yield. Another object is to provide a novel element provided with a film including graphene. Another object is to provide a manufacturing method of a novel element provided with a film including graphene. Another object is to provide a novel touch sensor, a driving method of a novel touch sensor, or a manufacturing method of a novel touch sensor. Another object is to provide a novel input device, a driving method of a novel input device, or a manufacturing method of a novel input device. Another object is to provide a novel semiconductor device, a driving method of a novel semiconductor device, or a manufacturing method of a novel semiconductor device.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

An element of one embodiment of the present invention includes a first electrode and a second electrode located apart from the first electrode, a first conductive film electrically connected to the first electrode, and a second conductive film electrically connected to the second electrode. In the element, the first electrode and the second electrode include graphene.

The element of one embodiment of the present invention may further include a first electrode group in which a plurality of first electrodes extending in a row direction are arranged in stripes, a second electrode group in which a plurality of second electrodes extending in a column direction are arranged in stripes, a first conductive film electrically connected to the first electrodes, and a second conductive film electrically connected to the second electrodes. In the element, the first electrodes each include a plurality of pieces including graphene and a third conductive film that electrically connects the pieces to each other and intersects with any one of the second electrodes with an insulating film sandwiched between the any one of the second electrodes and the third conductive film.

The element of one embodiment of the present invention may further include an insulating film sandwiched between the first electrode and the first conductive film or between the second electrode and the second conductive film. In the element, the insulating film includes a first opening at which the first electrode is electrically connected to the first conductive film and a second opening at which the second electrode is electrically connected to the second conductive film.

The above-described element of one embodiment of the present invention includes a first electrode and a second electrode located apart from the first electrode, and the first electrode and the second electrode include graphene. Thus, the first electrode and the second electrode can form a capacitor. As a result, a novel element can be provided.

A formation method of a film including graphene of one embodiment of the present invention includes a first step of forming a film including graphene oxide by applying a dispersion liquid in which graphene oxide is dispersed over a substrate and removing dispersion medium from the applied dispersion liquid, a second step of immersing the film including graphene oxide in an acidic solution, and a third step of reducing graphene oxide included in the film including graphene oxide. The first step, the second step, and the third step are performed in this order.

A formation method of a film including graphene of one embodiment of the present invention includes a first step of forming a film including graphene oxide by applying a dispersion liquid in which graphene oxide is dispersed over a substrate and removing dispersion medium from the applied dispersion liquid, a second step of immersing the film including graphene oxide in an acidic solution, a third step of selectively removing the film including graphene oxide by a photolithography technique, and a fourth step of reducing graphene oxide included in the film including graphene oxide remaining through the photolithography technique. The first step, the second step, the third step, and the fourth step are performed in this order.

A formation method of a film including graphene of one embodiment of the present invention includes a first step of forming a film including graphene oxide by applying a dispersion liquid in which graphene oxide is dispersed over a substrate and removing dispersion medium from the applied dispersion liquid, a second step of forming a stacked film consisting of films including graphene oxide by further performing the first step n times (n is a natural number of more than or equal to 1), a third step of immersing the stacked film in an acidic solution, and a fourth step of reducing graphene oxide included in the stacked film. The first step, the second step, the third step, and the fourth step are performed in this order.

A formation method of a film including graphene of one embodiment of the present invention includes a first step of forming a film including graphene oxide by applying a dispersion liquid in which graphene oxide is dispersed over a substrate and removing dispersion medium from the applied dispersion liquid, a second step of forming a stacked film consisting of films including graphene oxide by further performing the first step n times (n is a natural number of more than or equal to 1), a third step of immersing the stacked film in an acidic solution, a fourth step of selectively removing the stacked film by a photolithography technique, and a fifth step of reducing graphene oxide included in the stacked film remaining through the photolithography technique. The first step, the second step, the third step, the fourth step, and the fifth step are performed in this order.

In the above-described formation method of a film including graphene, the substrate may have flexibility.

In the above-described formation method of a film including graphene, the dispersion liquid in which graphene oxide is dispersed may be applied using a blade.

In the formation methods of a film including graphene of the above embodiments of the present invention, the same kind of solution may be used as the acidic solution used in the step of immersing the stacked film in the acidic solution and a solution used for separating a resist mask in the step of selectively removing the stacked film by a photolithography technique.

An element provided with a film including graphene formed by any one of the above embodiments of the present invention may be manufactured. An example of the element is a touch sensor.

With one embodiment of the present invention, a film including graphene can be formed at low cost. With one embodiment of the present invention, a film including graphene can be formed at high yield. With one embodiment of the present invention, a novel element provided with a film including graphene can be provided. With one embodiment of the present invention, a manufacturing method of a novel element provided with a film including graphene can be provided. With one embodiment of the present invention, a novel touch sensor, a driving method of a novel touch sensor, or a manufacturing method of a novel touch sensor can be provided. With one embodiment of the present invention, a novel input device, a driving method of a novel input device, or a manufacturing method of a novel input device can be provided. With one embodiment of the present invention, a novel semiconductor device, a driving method of a novel semiconductor device, or a manufacturing method of a novel semiconductor device can be provided.

Note that the description of these effects does not disturb the existence of other effects. One embodiment of the present invention does not necessarily achieve all of these effects. Other effects will be apparent from and can be derived from the description of the specification, the drawings, the claims, and the like.

BRIEF DESCRIPTION OF THE DRAWINGS

In the accompanying drawings:

FIGS. 5A to 5D illustrate a structure of an element of an embodiment;

DETAILED DESCRIPTION OF THE INVENTION

Figure 1A:
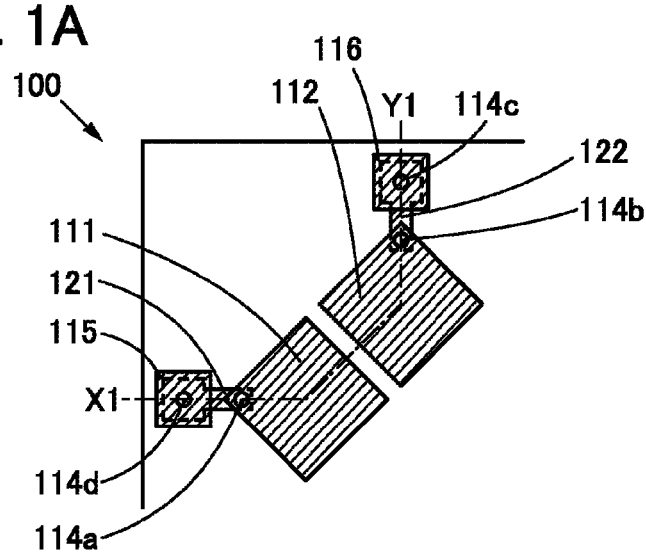
FIGS. 1A to 1C illustrate a structure of an element of an embodiment.

Embodiments will be described in detail with reference to drawings. Note that the present invention is not limited to the following description and it will be readily appreciated by those skilled in the art that modes and details can be modified in various ways without departing from the spirit and the scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Note that the position, the size, the range, or the like of each structure illustrated in drawings and the like is not accurately represented in some cases for easy understanding. Therefore, the invention disclosed in this specification and the like is not necessarily limited to the position, size, range, or the like disclosed in the drawings and the like.

It is also noted that in this specification and the like, ordinal numbers such as "first" and "second" are used in order to avoid confusion among components, and the terms do not limit the components numerically.

Note that the terms "film" and "layer" can be interchanged depending on the case or circumstances. For example, the term "conductive layer" can be changed to the term "conductive film" in some cases. Also, the term "insulating film" can be changed to the term "insulating layer" in some cases.

Embodiment 1

In this embodiment, a structure of an element of one embodiment of the present invention will be described with reference to FIGS. 1A to 1C.

Figure 1B:
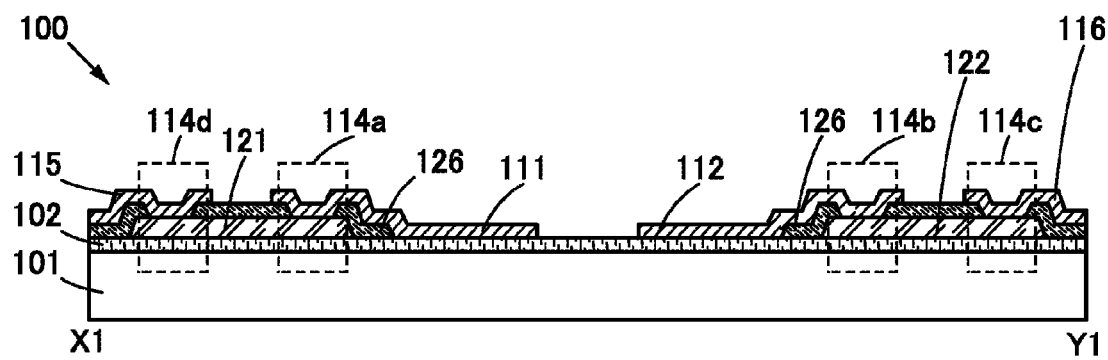
Figure 1C:
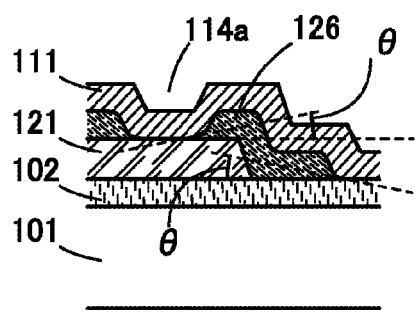

FIGS. 1A to 1C illustrate a structure of an element of one embodiment of the present invention. FIG. 1A is a top view of the element of one embodiment of the present invention, and FIG. 1B is a cross-sectional view of the structure of the element along X1-Y1 in FIG. 1A.

<Element Structure Example 1>

An element 100 described in this embodiment includes a first electrode 111, a second electrode 112 located apart from the first electrode 111, a first conductive film 121 electrically connected to the first electrode 111, and a second conductive film 122 electrically connected to the second electrode 112 (see FIGS. 1A and 1B).

The first electrode 111 and the second electrode 112 include graphene.

The element 100 includes the first electrode 111 and the second electrode 112, whereby a capacitor including the first electrode 111 and the second electrode 112 can be formed. As a result, a novel element can be provided.

Furthermore, the element 100 that is an example described in this embodiment may include an insulating film 126 sandwiched between the first electrode 111 and the first conductive film 121 or between the second electrode 112 and the second conductive film 122.

The insulating film 126 is provided with a first opening 114a in which the first electrode 111 is electrically connected to the first conductive film 121 and a second opening 114b in which the second electrode 112 is electrically connected to the second conductive film 122.

The element 100 includes the insulating film 126 in which the first opening 114a and the second opening 114b are formed; the first electrode 111 and the first conductive film 121 between which the insulating film 126 is sandwiched; and the second electrode 112 and the second conductive film 122 between which the insulating film 126 is sandwiched, whereby the first electrode 111 can be electrically connected to the first conductive film 121 in the first opening 114a, and the second electrode 112 can be electrically connected to the second conductive film 122 in the second opening 114b. As a result, a novel element can be provided.

Furthermore, the insulating film 126 is provided with a third opening 114c and a fourth opening 114d. In the element 100, an electrode 116 is electrically connected to the second conductive film 122 in the third opening 114c, and an electrode 115 is electrically connected to the first conductive film 121 in the fourth opening 114d. The electrode 115 and the electrode 116 can each function as a connection terminal to a flexible printed circuit (FPC), for example.

Note that the element 100 may be supported by a substrate 101 (see FIG. 1B). A base film 102 may be provided between the element 100 and the substrate 101. Furthermore, an insulating film may be provided so that the first electrode 111 and the second electrode 112 are positioned between the substrate 101 and the insulating film.

Individual components included in the element 100 are described below. Note that in some cases, these components cannot be clearly distinguished and one component may also serve as another component or include part of another component.

<<Whole Structure>>

The element 100 includes the first electrode 111, the second electrode 112, the first conductive film 121, and the second conductive film 122.

In addition, the element 100 may include the insulating film 126 in which the first opening 114a and the second opening 114b are formed.

Furthermore, the element 100 may include the insulating film 126 in which the third opening 114c and the fourth opening 114d are formed.

Furthermore, the element 100 may include the electrode 115 and the electrode 116.

Furthermore, the element 100 may include the substrate 101 and the base film 102.

<<Operation of Element>>

Since the first electrode 111 is separated from the second electrode 112, the potential of the first electrode 111 can be set different from the potential of the second electrode 112. Accordingly, the capacitor including the first electrode 111 and the second electrode 112 can be formed. As a result, a change in capacitance in a space between the first electrode 111 and the second electrode 112 can be detected with the element 100.

For example, when the element 100 is connected to a detection circuit, a finger, a hand, or the like that approaches the first electrode 111 or the second electrode 112 can be detected.

In particular, when the first electrode 11 and the second electrode 112 are each formed using a light-transmitting conductive film, the element 100 can have a light-transmitting property. This allows the element 100 to overlap with a display device or the like without hindering display of the display device or the like, for example. Furthermore, the element 100 can be provided so as to overlap with a lighting window or the like.

<<First Electrode and Second Electrode>>

The first electrode 111 and the second electrode 112 have conductivity and include graphene.

The first electrode 111 and the second electrode 112 transmit visible light. For example, the first electrode 111 and the second electrode 112 can transmit 80% or more of light having wavelengths from 300 nm to 900 nm.

The first electrode 111 and the second electrode 112 have such a small thickness as to have flexibility, for example, a thickness of more than or equal to 0.3 nm and less than or equal to 50 nm.

As the substrate 101 that supports the first electrode 111 and the second electrode 112, a flexible substrate can be used. The first electrode 111 and the second electrode 112 formed over the flexible substrate can be bent together with the substrate 101. For example, bending at a curvature radius of 5 mm or less is possible.

Graphene included in the first electrode 111 and the second electrode 112 includes carbon and oxygen, and the percentage of oxygen in the graphene calculated from the results of X-ray photoelectron spectroscopy (XPS) is more than or equal to 0 atomic % and less than or equal to 20 atomic %, preferably more than or equal to 0 atomic % and less than or equal to 10 atomic %. In addition, a thin sheet of graphene has a lateral length, which is a length from one end to the other end, of more than or equal to 0.5 µm and less than or equal to 1000 µm, preferably more than or equal to 10 µm and less than or equal to 500 µm.

Note that the first electrode 111 and the second electrode 112 may include graphene oxide. Graphene oxide included in the first electrode 111 and the second electrode 112 includes carbon and oxygen, and the percentage of oxygen in the graphene oxide calculated from the results of XPS is more than or equal to 20 atomic % and less than or equal to 40 atomic %, preferably more than or equal to 30 atomic % and less than or equal to 40 atomic %. In addition, a thin sheet of graphene oxide has a lateral length, which is a length from one end to the other end, of more than or equal to 0.5 µm and less than or equal to 1000 µm, preferably more than or equal to 10 µm and less than or equal to 500 µm.

For example, the sheet resistance of the first electrode 111 and the second electrode 112 is more than or equal to 10Ω/□ and less than or equal to $10^4$Ω/□.

Moreover, by processing the same starting film as that of the first electrode 111 and the second electrode 112, the electrode 115 and the electrode 116 can be obtained.

<<Substrate>>

The element 100 may be supported using the substrate 101.

A substrate which has resistance to heat in the manufacturing process and a thickness and a size that are acceptable to the manufacturing apparatus and which prevents diffusion of impurities to the element 100 can be used as the substrate 101.

As a material of the flexible substrate 101, an organic material, an inorganic material, or a composite material of an organic material and an inorganic material can be used.

Examples of the material of the substrate 101 are organic materials such as a resin, a resin film, and a plastic film.

Examples of the material of the substrate 101 are inorganic materials such as a metal plate and a thin glass plate with a thickness of more than or equal to 10 µm and less than or equal to 50 µm.

Examples of the material of the substrate 101 are composite materials such as resin films to which a metal plate, a thin glass plate, or a film of an inorganic material is attached.

Examples of the material of the substrate 101 are composite materials such as resin films into which a fibrous or particulate metal, glass, or inorganic material is dispersed.

Specifically, a resin film or resin plate of polyester, polyolefin, polyamide, polyimide, polycarbonate, an acrylic resin, or the like can be used.

Specifically, non-alkali glass, soda-lime glass, potash glass, crystal glass, or the like can be used.

Specifically, a metal oxide film, a metal nitride film, a metal oxynitride film, or the like can be used. For example, a silicon oxide film, a silicon nitride film, a silicon oxynitride film, an alumina film, or the like can be used.

Specifically, SUS, aluminum, or the like can be used.

<<Base Film>>

The base film 102 may be provided between the element 100 and the substrate 101.

A material having resistance to heat in the manufacturing process and preventing diffusion of impurities to the element 100 can be used as the base film 102.

For the base film 102, an organic material, an inorganic material, or a composite material of an organic material and an inorganic material can be used.

Examples of the material of the base film 102 are silicon nitride, silicon oxynitride, and polyimide.

The base film 102 that can be separated from a different substrate may be used. After the element 100 is formed over the base film 102 formed over a different substrate, the element 100 can be separated from the different substrate together with the base film 102.

A structure including the base film 102 and the element 100 that are separated from the different substrate can be referred to as a "separated layer" (the structure before separation is referred to as a "layer to be separated"). The separated layer separated from the different substrate can be transferred onto the substrate 101 with an adhesive layer or the like.

<<Separation Layer>>

A rigid substrate having heat resistance provided with a separation layer on its surface may be used as the different substrate. The layer to be separated is formed over the separation layer by treatment that requires high temperature. After the treatment that requires high temperature, the layer to be separated can be separated and transferred onto the substrate 101 having lower heat resistance but having flexibility.

By this method, the element 100 can be placed over the substrate 101 that does not have resistance to the processing temperature that is required in manufacturing the element 100.

For example, the separation layer can be an organic material or an inorganic material. Specifically, polyimide or an oxide of tungsten can be used. Any of a variety of materials that have heat resistance to the temperature applied in the process can be used as the different substrate.

Specifically, a layer including an oxide of tungsten formed on a surface of a borosilicate glass substrate can be used as the separation layer, and a film including silicon oxynitride or the like formed in contact with the layer including an oxide of tungsten can be used as the base film.

<<First Conductive Film and Second Conductive Film>>

The first conductive film 121 and the second conductive film 122 have conductivity. The first conductive film 121 and the second conductive film 122 can also serve as wirings, terminals, or the like.

The first conductive film 121 and the second conductive film 122 may have a single-layer structure or a stacked-layer structure of two or more layers.

For example, a film including a metal, a metal nitride, or a metal oxide can be used as the first conductive film 121 and the second conductive film 122.

Specifically, a metal element selected from aluminum, chromium, copper, tantalum, titanium, molybdenum, tungsten, nickel, yttrium, zirconium, silver, and manganese; an alloy including any of the above-described metal elements; an alloy including any of the above-described metal elements in combination; or the like can be used. In particular, one or more elements selected from aluminum, chromium, copper, tantalum, titanium, molybdenum, and tungsten are preferably included.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Specifically, a stacked structure in which an alloy film or a nitride film which contains one or more elements selected from titanium, tantalum, tungsten, molybdenum, chromium, neodymium, and scandium is stacked over an aluminum film can be used.

Alternatively, a light-transmitting conductive material including indium oxide, tin oxide, or zinc oxide may be used. Specifically, indium tin oxide containing silicon oxide, indium tin oxide, zinc oxide, indium zinc oxide, gallium-doped zinc oxide, or the like can be used.

<<Insulating Film>>

The insulating film 126 has lower conductivity than the first electrode 111 and the second electrode 112. The insulating film 126 has an inclined surface on its end portion. An angle θ between the inclined surface of the insulating film 126 and a component which the insulating film 126 is in contact with at the end portion is preferably less than or equal to 30°, particularly preferably more than 0° and less than or equal to 15° (see FIG. 1C). The angle θ between the component which the insulating film 126 is in contact with and the inclined surface of the insulating film 126 may be increased from the end portion toward the thickness increasing direction of the insulating film 126.

The insulating film 126 covers an end portion of the first conductive film 121, and the insulating film 126 covers an end portion of the second conductive film 122.

The first opening 114a is formed in the insulating film 126 in a position overlapping with the first conductive film 121. The second opening 114b is formed in the insulating film 126 in a position overlapping with the second conductive film 122.

Moreover, the third opening 114c is formed in the insulating film 126 in a position overlapping with the second conductive film 122. The fourth opening 114d is formed in the insulating film 126 in a position overlapping with the first conductive film 121.

For example, when the angle θ between the inclined surface of the insulating film 126 and the base film 102 which the insulating film 126 is in contact with or the angle θ between the inclined surface of the insulating film 126 and the first conductive film 121 which the insulating film 126 is in contact with is sufficiently small, the first electrode 111 is not easily disconnected at the end portion of the insulating film 126. By forming the end portion of the insulating film 126 in such a shape, the first electrode 111 is not easily disconnected at the end portion of the insulating film 126 even in the case of forming the first electrode 111 using an extremely thin film including graphene.

The first electrode 111 and the first conductive film 121 are electrically connected to each other at the first opening 114a, and the second electrode 112 and the second conductive film 122 are electrically connected to each other at the second opening 114b.

Furthermore, the electrode 116 and the second conductive film 122 are electrically connected to each other at the third opening 114c, and the electrode 115 and the first conductive film 121 are electrically connected to each other at the fourth opening 114d.

A material having resistance to heat in the manufacturing process can be used as the insulating film 126.

For the insulating film 126, an organic material, an inorganic material, or a composite material of an organic material and an inorganic material can be used.

Examples of the material of the insulating film 126 are organic materials such as insulating resins.

Examples of the material of the insulating film 126 are insulating inorganic materials such as metal oxides or metal nitrides.

Examples of the material of the insulating film 126 are composite materials in which an inorganic material and an organic material are stacked.

Specifically, a resin such as polyester, polyolefin, polyamide, polyimide, polycarbonate, or an acrylic resin can be used. In particular, it is preferable to use photopolymer to simplify the manufacturing process.

Specifically, a metal oxide film, a metal nitride film, a metal oxynitride film, or the like can be used. For example, silicon oxide, silicon nitride, silicon oxynitride, an alumina film, or the like can be used. In particular, the inorganic materials are preferable because of its superiority in heat resistance over the organic materials.

<Element Structure Example 2>

Another structure of the element of one embodiment of the present invention is described with reference to FIGS. 2A to 2C.

Figure 2A:
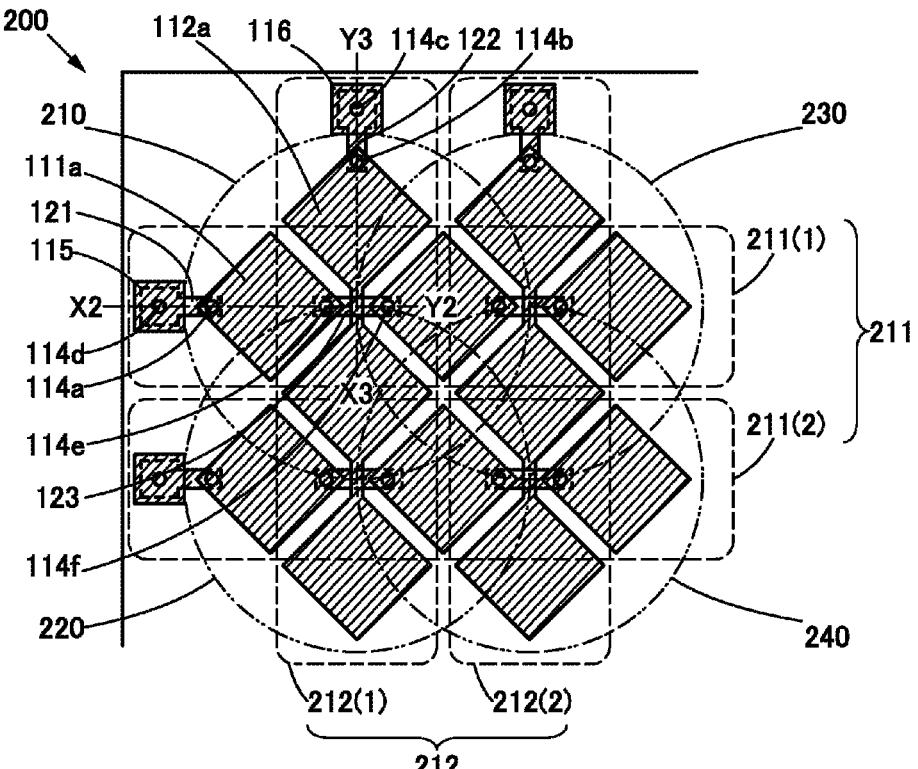
FIGS. 2A to 2C illustrate a structure of an element of an embodiment.
Figure 2B:
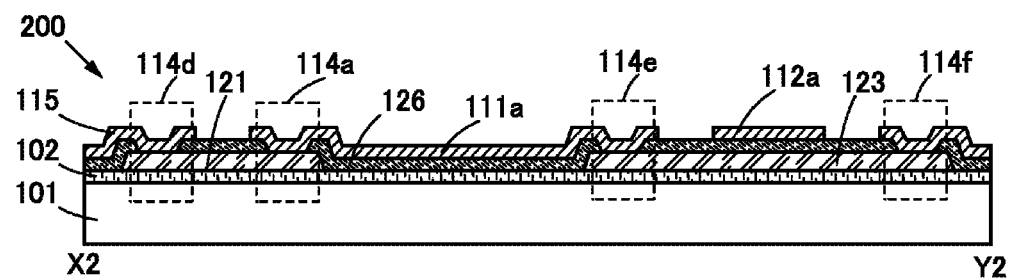
Figure 2C:
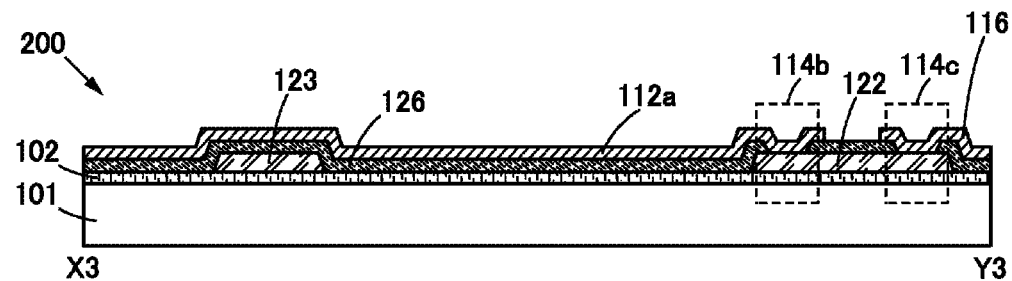

FIGS. 2A to 2C illustrate a structure of an element 200 of one embodiment of the present invention.

FIG. 2A is a top view of the element 200 of one embodiment of the present invention.

FIG. 2B is a cross-sectional view of the structure of the element 200 along X2-Y2 in FIG. 2A.

FIG. 2C is a cross-sectional view of the structure of the element 200 along X3-Y3 in FIG. 2A.

The element 200 described in this embodiment includes a first electrode 211(1), a second electrode 212(1) located apart from the first electrode 211(1), the first conductive film 121 electrically connected to the first electrode 211(1), the second conductive film 122 electrically connected to the second electrode 212(1), a first electrode group 211 in which a plurality of electrodes including the first electrode 211(1) and a first electrode 211(2) extending in a row direction are arranged in stripes, and a second electrode group 212 in which a plurality of electrodes including the second electrode 212(1) and a second electrode 212(2) extending in a column direction are arranged in stripes.

Furthermore, the first electrode 211(1) and the second electrode 212(1) include graphene.

The first electrode 211(1) includes a plurality of pieces 111a including graphene and a third conductive film 123 that electrically connects the pieces 111a to each other and intersects with the second electrode 212(1) with the insulating film 126 sandwiched therebetween.

The second electrode 212(1) includes an electrode 112a including graphene.

The element 200 includes the first electrode 211(1) and the second electrode 212(1) which are separated from each other. Accordingly, a group of capacitors formed using the first electrode group 211 and the second electrode group 212 and arranged in a matrix can be formed. As a result, a novel element can be provided.

Furthermore, the element 200 that is an example described in this embodiment may include the insulating film 126 sandwiched between the first electrode 211(1) and the first conductive film 121 or between the second electrode 212(1) and the second conductive film 122.

The insulating film 126 is provided with the first opening 114a in which the piece 111a of the first electrode 211(1) is electrically connected to the first conductive film 121 and the second opening 114b in which the electrode 112a of the second electrode 212(1) is electrically connected to the second conductive film 122.

The element 200 includes the insulating film 126 in which the first opening 114a and the second opening 114b are formed, the piece 111a of the first electrode 211(1) and the first conductive film 121 between which the insulating film 126 is sandwiched; and the electrode 112a of the second electrode 212(1) and the second conductive film 122 between which the insulating film 126 is sandwiched, whereby the piece 111a can be electrically connected to the first conductive film 121 in the first opening 114a, and the second electrode 112a can be electrically connected to the second conductive film 122 in the second opening 114b. As a result, a novel element can be provided.

Furthermore, the insulating film 126 is provided with the third opening 114c and the fourth opening 114d. In the element 200, the electrode 116 is electrically connected to the second conductive film 122 in the third opening 114c, and the electrode 115 is electrically connected to the first conductive film 121 in the fourth opening 114d. The electrode 115 and the electrode 116 can each function as a connection terminal to an FPC, for example.

In addition, the insulating film 126 is provided with a fifth opening 114e and a sixth opening 114f. In the element 200, one of two adjacent pieces 111a is electrically connected to the third conductive film 123 in the fifth opening 114e, and the other of the two adjacent pieces 111a is electrically connected to the third conductive film 123 in the sixth opening 114f.

Note that the element 200 may be supported by the substrate 101 (see FIG. 2B). A base film 102 may be provided between the element 200 and the substrate 101. Furthermore, although not shown, an insulating film may be provided so that the pieces 111a and the electrode 112a are positioned between the substrate 101 and the insulating film.

Individual components included in the element 200 are described below. Note that in some cases, these components cannot be clearly distinguished and one component may also serve as another component or include part of another component.

For example, the element 200 is different from the element 100 described with reference to FIGS. 1A to 1C in that one first electrode extends in the row direction, that one second electrode extends in the column direction, that a plurality of first electrodes are arranged in stripes so as to intersect with one second electrode, that a plurality of second electrodes are arranged in stripes so as to intersect with one first electrode, and that a combination of one first electrode and one second electrode can be selected. Here, such different structures will be described in detail, and the above description is referred to for the other similar structures.

<<Whole Structure>>

The element 200 includes the first electrode 211(1), the second electrode 212(1), the first conductive film 121, the second conductive film 122, the third conductive film 123, the first electrode group 211, and the second electrode group 212 (see FIG. 2A).

In addition, the element 200 may include the insulating film 126 in which the first opening 114a and the second opening 114b are formed.

Furthermore, the element 200 may include the insulating film 126 in which the third opening 114c, the fourth opening 114d, the fifth opening 114e, and the sixth opening 114f are formed.

Furthermore, the element 200 may include the electrode 115 and the electrode 116.

Furthermore, the element 200 may include the substrate 101 and the base film 102.

<<Operation of Element>>

Since the first electrode 211(1) is separated from the second electrode 212(1), the potential of the first electrode 211(1) can be set different from the potential of the second electrode 212(1). Accordingly, a capacitor including the first electrode 211(1) and the second electrode 212(1) can be formed. As a result, a change in capacitance in a space between the first electrode 211(1) and the second electrode 212(1) can be detected with the element 200.

The first electrode 211(1) and the first electrode 211(2) extending in the row direction are arranged in stripes to form the first electrode group 211. In addition, the second electrode 212(1) and the second electrode 212(2) extending in the column direction are arranged in stripes to form the second electrode group 212. This allows selection of a combination of one first electrode and one second electrode.

For example, in the case where a combination of the first electrode 211(1) and the second electrode 212(1) is selected, a change in capacitance in a space between the first electrode 211(1) and the second electrode 212(1) in a region 210 in the upper left of FIG. 2A can be detected.

For example, in the case where a combination of the first electrode 211(2) and the second electrode 212(1) is selected, a change in capacitance in a space between the first electrode 211(2) and the second electrode 212(1) in a region 220 in the lower left of FIG. 2A can be detected.

For example, in the case where a combination of the first electrode 211(1) and the second electrode 212(2) is selected, a change in capacitance in a space between the first electrode 211(1) and the second electrode 212(2) in a region 230 in the upper right of FIG. 2A can be detected.

For example, in the case where a combination of the first electrode 211(2) and the second electrode 212(2) is selected, a change in capacitance in a space between the first electrode 211(2) and the second electrode 212(2) in a region 240 in the lower right of FIG. 2A can be detected.

Thus, by using the element 200, a driving circuit that sequentially selects one first electrode and one second electrode of the element 200, and a detection circuit, the distribution of the capacitance in a space between the first electrode group 211 and the second electrode group 212 can be detected. This, for example, allows detection of the position of a finger, a hand, or the like that approaches the element 200 with respect to the element 200.

In particular, when the first electrode group 211 and the second electrode group 212 are each formed using a light-transmitting film, the element 200 can have a light-transmitting property. This allows the element 200 to overlap with a display device or the like without hindering display of the display device or the like, for example. Furthermore, the element 200 can be provided so as to overlap with a lighting window or the like.

Note that the element 200 can also be referred to as a touch sensor.

<<First Electrode Group and First Electrode>>

The first electrode group 211 includes the plurality of first electrodes, such as the first electrode 211(1) and the first electrode 211(2).

Furthermore, the first electrode group 211 extends in the row direction. The first electrode 211(1) is provided with the pieces 111a and the third conductive film 123.

The pieces 111a have conductivity and include a film including graphene. A film having the same structure as the first electrode 111 described in Element structure example 1 can be used for the pieces 111a.

The third conductive film 123 has conductivity. A conductive film having the same structure as the first conductive film 121 or the second conductive film 122 described in this embodiment can be used for the third conductive film 123.

Note that when a light-transmitting conductive material including indium oxide, tin oxide, or zinc oxide is used for the third conductive film 123, the light-transmitting property of the element 200 can be increased. Specifically, indium tin oxide containing silicon oxide, indium tin oxide, zinc oxide, indium zinc oxide, gallium-doped zinc oxide, or the like can be used.

<<Second Electrode Group and Second Electrode>>

The second electrode group 212 includes the plurality of second electrodes, such as the second electrode 212(1) and the second electrode 212(2).

Furthermore, the second electrode group 212 extends in the column direction. The second electrode 212(1) includes a film including graphene. A film having the same structure as the second electrode 112 described in Element structure example 1 can be used for the second electrode 212(1).

<Element Structure Example 3>

Another structure of the element of one embodiment of the present invention is described with reference to FIGS. 5A to 5D.

FIGS. 5A to 5D illustrate a structure of an element 300 of one embodiment of the present invention.

FIG. 5A is a top view of the element 300 of one embodiment of the present invention. In FIG. 5A, some components are not illustrated for easy understanding.

FIG. 5B is an enlarged view of part of the first electrode 211(1) illustrated in FIG. 5A. FIG. 5C is a drawing for explaining the shape of a conductive film 125b and a conductive film 125c illustrated in FIG. 5B.

FIG. 5D is a cross-sectional view of the structure of the element 300 along X4-Y4 in FIG. 5A.

The element 300 described in this embodiment is different from the element 200 described with reference to FIGS. 2A to 2C in including a conductive film 125a and including a conductive film 121a that is provided between the conductive film 125a and the first conductive film 121 and electrically connected to both the conductive film 125a and the first conductive film 121.

Furthermore, the element 300 is different from the element 200 in including a conductive film 121b and a conductive film 121c that are electrically connected to the first conductive film 121.

In addition, the element 300 is different from the element 200 in including the conductive film 125b that is provided between the conductive films 121b and 121c and the piece 111a and is electrically connected to both the conductive films 121b and 121c and the piece 111a and in including the conductive film 125c and a conductive film 125d that are each provided between the piece 111a and the third conductive film 123 and are electrically connected to both the piece 111a and the third conductive film 123.

In the element 300, the conductive film 125a is electrically connected to the conductive film 121a in a first opening 124a formed in the insulating film 126. The conductive film 125b is electrically connected to the conductive films 121b and 121c in a second opening 124b formed in the insulating film 126. The conductive film 125c is electrically connected to the third conductive film 123 in a third opening 124c formed in the insulating film 126. The conductive film 125d is electrically connected to the third conductive film 123 in a fourth opening 124d formed in the insulating film 126.

The element 300 includes the first electrode 211(1) and the second electrode 212(1) which are separated from each other. Accordingly, a group of capacitors formed using the first electrode group 211 and the second electrode group 212 and arranged in a matrix can be formed. As a result, a novel element can be provided.

Note that the element 300 may be supported by a substrate 101a on which a separation layer 101b is formed. The base film 102 may be provided between the element 300 and the separation layer 101b (see FIG. 5D). In other words, the layer to be separated including the element 300 and the base film 102 may be supported by the substrate 101a on which the separation layer 101b is formed.

Note that the layer to be separated can be separated at the separation layer 101b. After the layer to be separated including the element 300 is formed over the substrate 101a, the layer is separated at the separation layer 101b, so that the substrate 101a can be removed. This enables the element 300 to be thin, lightweight, and flexible. For example, the element 300 can be bonded to a substrate having a different property from the substrate 101a.

<<Conductive Film>>

The conductive film 121a, the conductive film 121b, the conductive film 121c, the conductive film 125a, the conductive film 125b, the conductive film 125c, and the conductive film 125d have conductivity. Any of the materials that can be used for the first conductive film 121 and the second conductive film 122 described in Element structure example 1 can be used for these conductive films.

In particular, a material that does not easily cause a reduction in characteristics due to oxidation in the manufacturing process (e.g., lowering of the conductivity of the conductive film in contact with graphene oxide due to oxidization of the conductive film), such as a conductive metal oxide, can be preferably used for these conductive films.

For example, in the case where the pieces 111a including graphene are formed by reducing a film including graphene oxide, the film including graphene oxide might be in contact with and oxidizes the first conductive film 121 through the opening formed in the insulating film 126 in the manufacturing process and thereby might lower the conductivity of the first conductive film 121. Such a phenomenon can be avoided by providing the conductive film 125b, the conductive film 121b, and the conductive film 121c formed of a material having oxidation resistance between the piece 111a and the first conductive film 121 as illustrated in FIG. 5D.

By providing the conductive film 125b, the conductive film 125c, and the conductive film 125d, the pieces 111a of the first electrode 211(1) can be prevented from being disconnected at the openings formed in the insulating film 126.

Specifically, as illustrated in FIG. 5D, the second opening 124b, the third opening 124c, and the fourth opening 124d formed in the insulating film 126 are covered with the conductive film 125b, the conductive film 125c, and the conductive film 125d, respectively. This can make steps at the openings formed in the insulating film 126 small, so that disconnection of the pieces 111a at the openings formed in the insulating film 126 is less likely to be caused even when the pieces 111a are formed using an extremely thin film including graphene.

Furthermore, the conductive film 125b and/or the conductive film 125c may have uneven surfaces at their end portions. The uneven surfaces at the end portions elongate or enlarge the contact portion between these conductive films and the pieces 111a, which is preferable because electrical connection therebetween can be ensured (see FIGS. 5B and 5C). Furthermore, the conductive film 125a and/or the conductive film 125d may have uneven surfaces at their end portions.

<Element Structure Example 4>

Another structure of the element of one embodiment of the present invention is described with reference to FIGS. 21A and 21B.

Figure 21A:
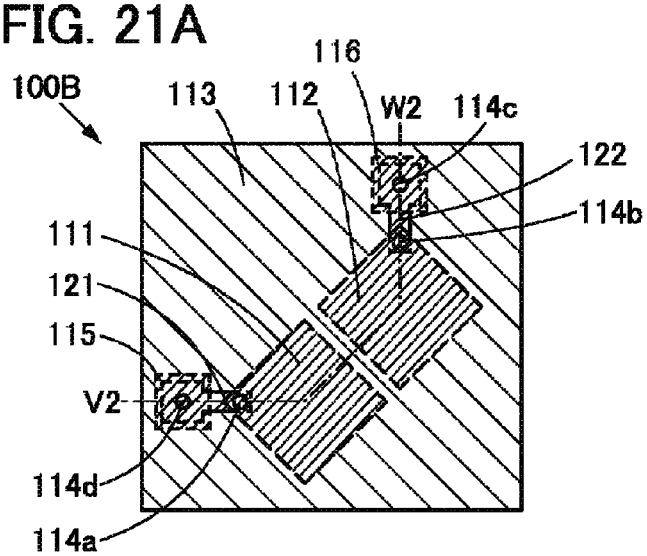
FIGS. 21A and 21B illustrate a structure of an element of an embodiment.
Figure 21B:
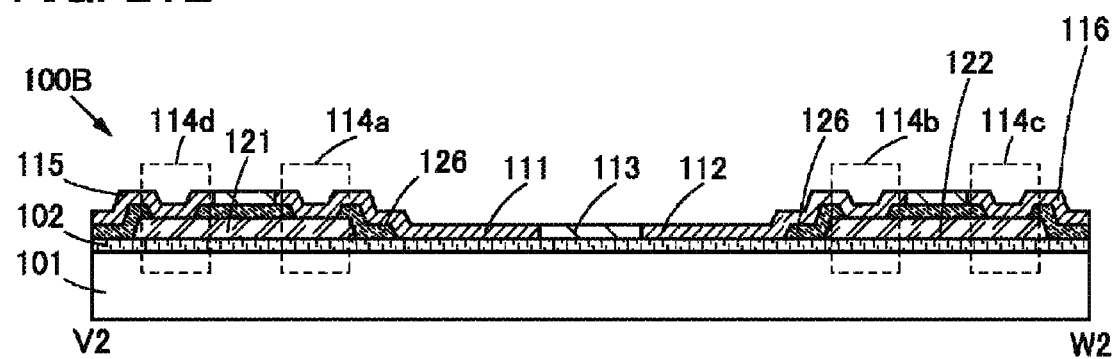

FIGS. 21A and 21B illustrate a structure of an element 100B of one embodiment of the present invention.

FIG. 21A is a top view of the element 100B of one embodiment of the present invention.

FIG. 21B is a cross-sectional view of the element 100B along V2-W2 in FIG. 21A.

The element 100B described in this embodiment is different from the element 100 described with reference to FIGS. 1A to 1C in including a divider 113 between the first electrode 111 and the second electrode 112 (see FIGS. 21A and 21B). Here, such a different structure will be described in detail, and the above description is referred to for the other similar structures.

The divider 113 includes graphene oxide and has lower conductivity than the first electrode 111 and the second electrode 112.

The element 100B includes the first electrode 111 and the second electrode 112 which are separated by the divider 113 including graphene oxide. Thus, a capacitor including the first electrode 111 and the second electrode 112 can be formed. As a result, a novel element can be provided.

Individual components included in the element 100B are described below. Note that in some cases, these components cannot be clearly distinguished and one component may also serve as another component or include part of another component.

For example, in some cases, a mixed region of the first electrode 111 and the divider 113 or a mixed region of the second electrode 112 and the divider 113 might be placed between the first electrode 111 and the divider 113 or between the second electrode 112 and the divider 113, so that a boundary between the first electrode 111 and the divider 113 or between the second electrode 112 and the divider 113 might be unclear.

<<Divider>>

The divider 113 includes graphene oxide. Graphene oxide included in the divider 113 includes carbon and oxygen, and the percentage of oxygen in the graphene oxide calculated from the results of XPS is more than or equal to 20 atomic % and less than or equal to 40 atomic %, preferably more than or equal to 30 atomic % and less than or equal to 40 atomic %. In addition, a thin sheet of graphene oxide has a lateral length, which is a length from one end to the other end, of more than or equal to 0.5 μm and less than or equal to 1000 μm, preferably more than or equal to 10 μm and less than or equal to 500 μm.

For example, the sheet resistance of the divider 113 is more than or equal to $10^7 \Omega/\square$ and less than or equal to $10^9 \Omega/\square$.

<Element Structure Example 5>

Another structure of the element of one embodiment of the present invention is described with reference to FIGS. 22A to 22C.

Figure 22A:
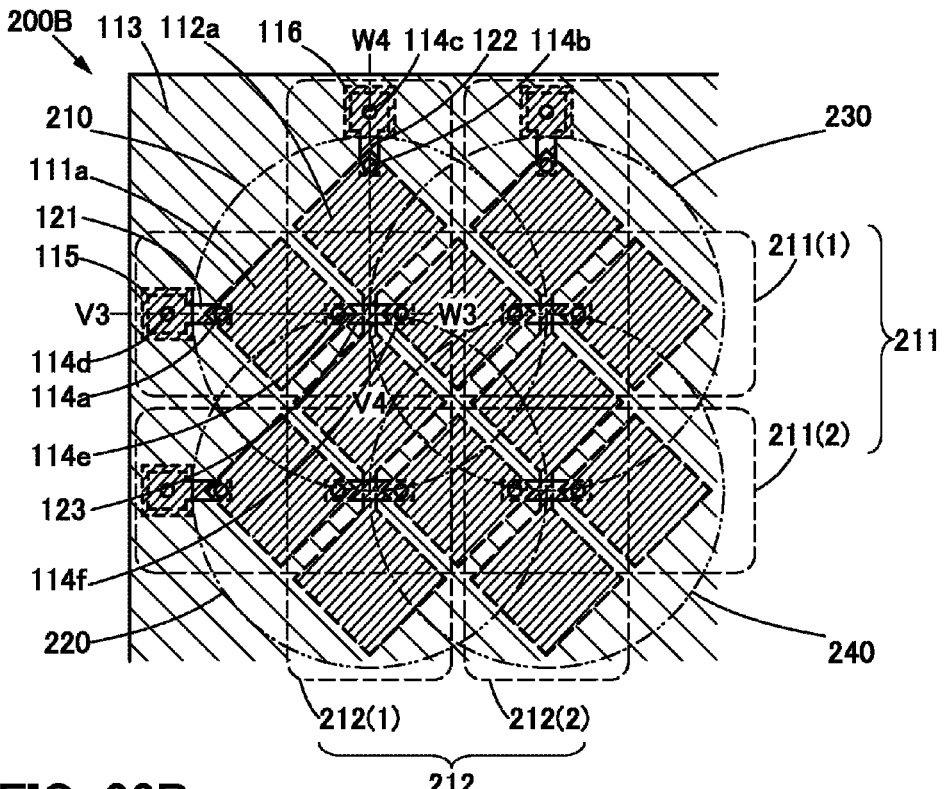
FIGS. 22A to 22C illustrate a structure of an element of an embodiment.
Figure 22B:
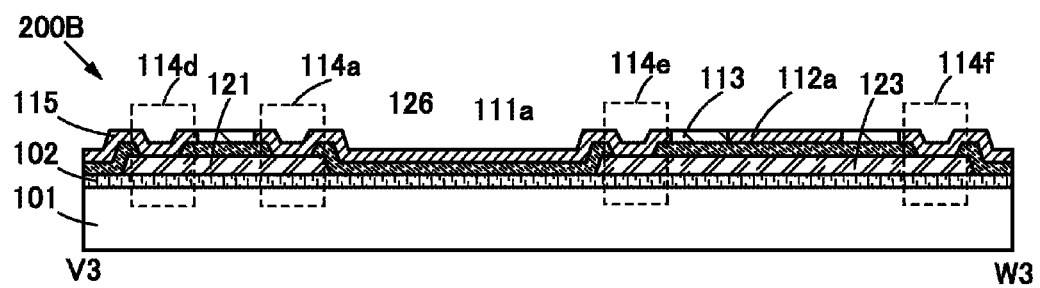
Figure 22C:
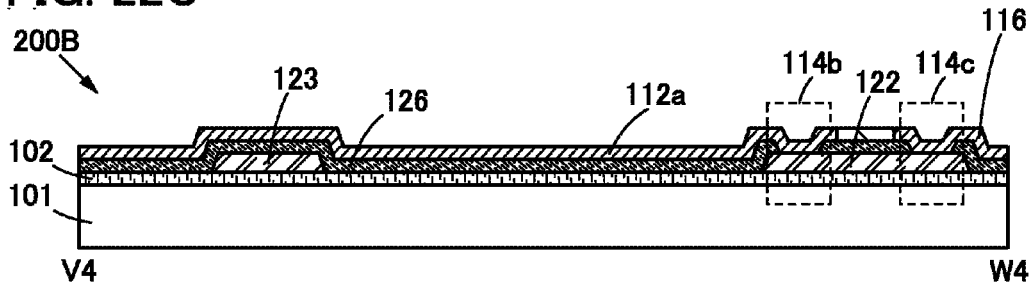

FIGS. 22A to 22C illustrate a structure of an element 200B of one embodiment of the present invention.

FIG. 22A is a top view of the element 200B of one embodiment of the present invention.

FIG. 22B is a cross-sectional view of the structure of the element 200B along V3-W3 in FIG. 22A.

FIG. 22C is a cross-sectional view of the structure of the element 200B along V4-W4 in FIG. 22A.

The element 200B described in this embodiment is different from the element 200 described with reference to FIGS. 2A to 2C in including the divider 113 placed between the first electrode 211(1) and the second electrode 212(1) and between the second electrode 212(1) and the second electrode 212(2) (see FIGS. 22A to 22C). Here, such a different structure will be described in detail, and the above description is referred to for the other similar structures.

The element 200B includes the first electrode 211(1) and the second electrode 212(2) which are separated from each other by the divider 113 including graphene oxide. Accordingly, a group of capacitors formed using the first electrode group 211 and the second electrode group 212 and arranged in a matrix can be formed. As a result, a novel element can be provided.

Note that, in some cases, a mixed region of the first electrode 211(1) and the divider 113 or a mixed region of the second electrode 212(1) and the divider 113 might be placed between the first electrode 211(1) and the divider 113 or between the second electrode 212(1) and the divider 113, so that a boundary between the first electrode 211(1) and the divider 113 or between the second electrode 212(1) and the divider 113 might be unclear.

<Element Structure Example 6>

Another structure of the element of one embodiment of the present invention is described with reference to FIGS. 23A and 23B.

Figure 23A:
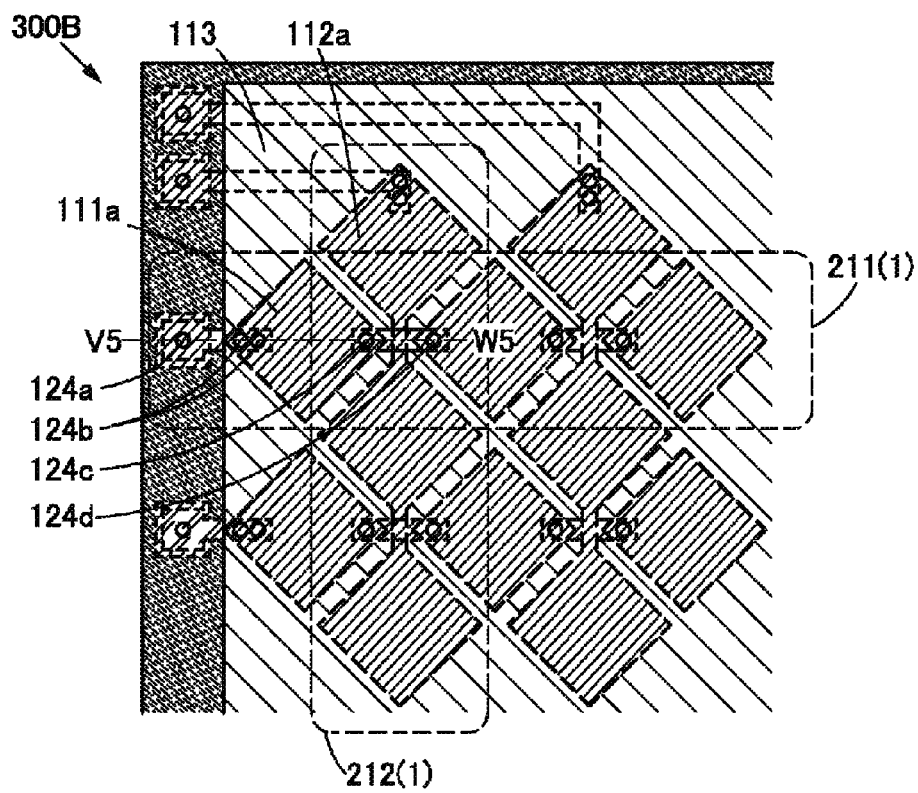
FIGS. 23A and 23B illustrate a structure of an element of an embodiment.
Figure 23B:
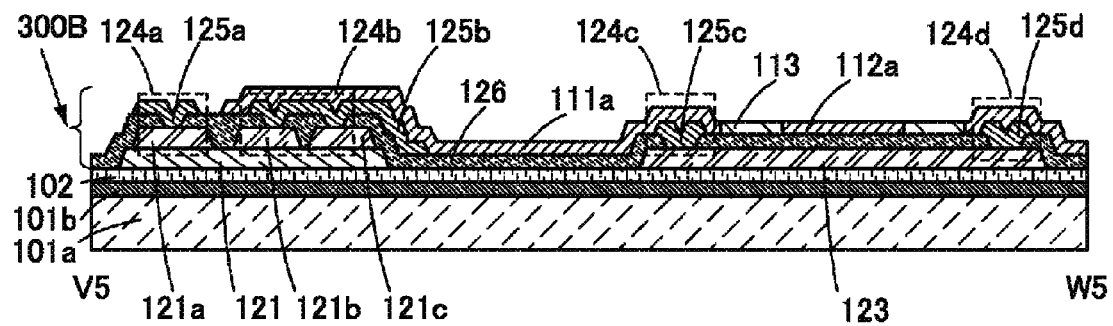

FIGS. 23A and 23B illustrate a structure of an element 300B of one embodiment of the present invention.

FIG. 23A is a top view of the element 300B of one embodiment of the present invention.

FIG. 23B is a cross-sectional view of the structure of the element 300B along V5-W5 in FIG. 23A.

The element 300B described in this embodiment is different from the element 300 described with reference to FIGS. 5A to 5D in including the divider 113 placed between the piece 111a and the electrode 112a (see FIGS. 23A and 23B). Here, such a different structure will be described in detail, and the above description is referred to for the other similar structures.

The divider 113 includes graphene oxide and has lower conductivity than the piece 111a and the electrode 112a.

<Touch Sensor Structure Example 1>

A structure of a touch sensor 400 of one embodiment of the present invention will be described with reference to FIGS. 6A and 6B. Furthermore, modification examples of the touch sensor 400 will be described with reference to FIGS. 7A and 7B.

Figure 6A:
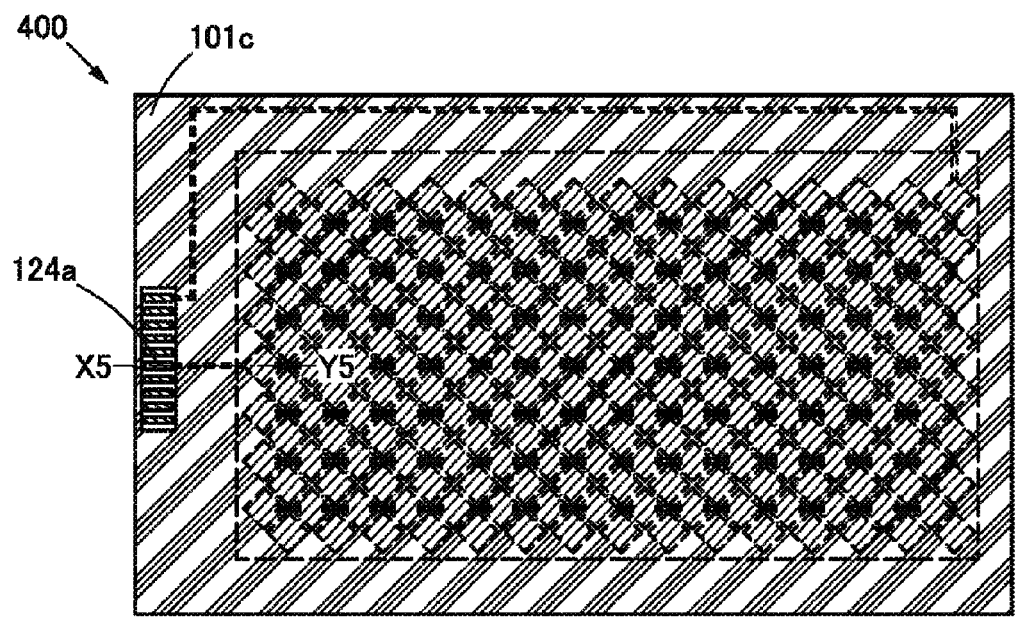
FIGS. 6A and 6B illustrate a structure of a touch sensor of an embodiment.
Figure 6B:
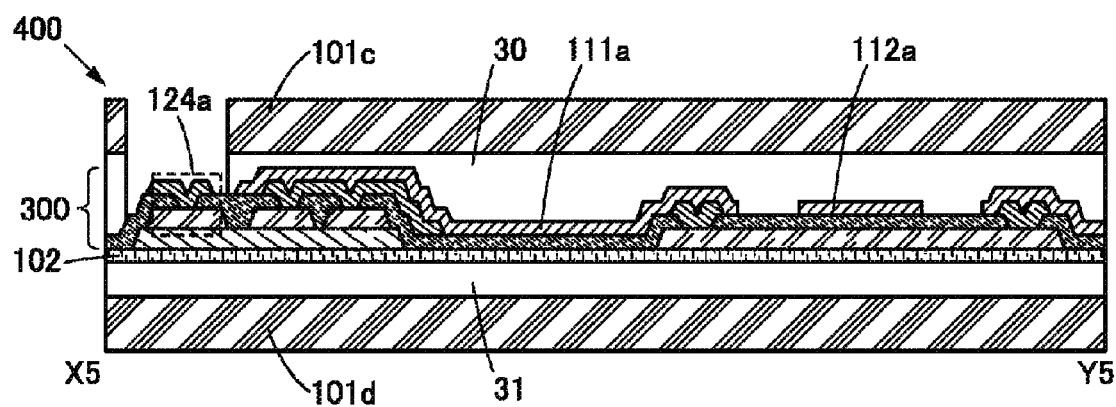

FIGS. 6A and 6B illustrate a structure of the touch sensor 400 that uses the element 300 of one embodiment of the present invention. FIG. 6A is a top view of the touch sensor 400, and FIG. 6B is a cross-sectional view of the touch sensor 400 along X5-Y5 in FIG. 6A.

Figure 7A:
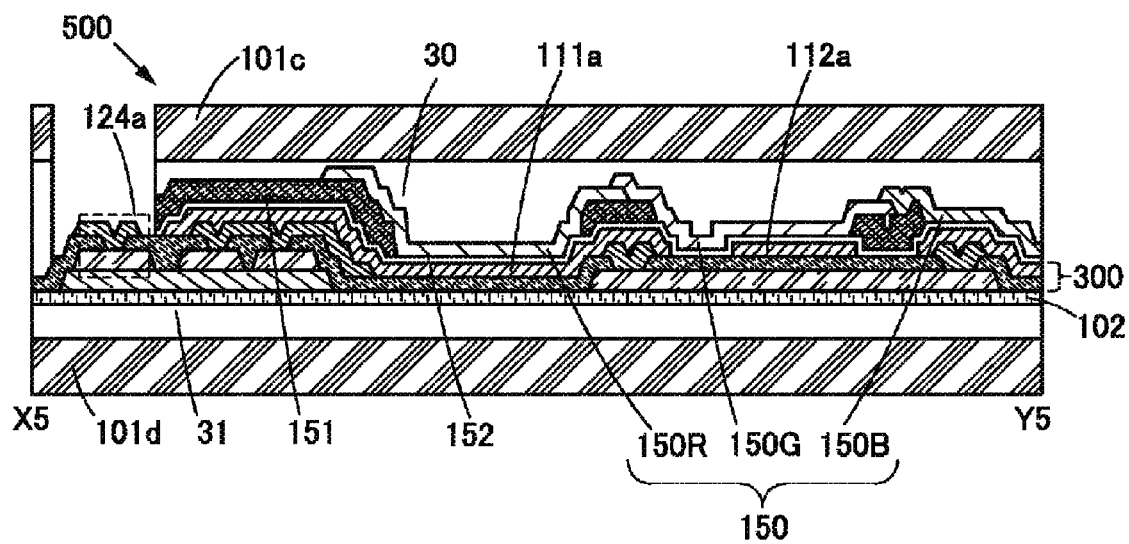
FIGS. 7A and 7B each illustrate a structure of a touch sensor of an embodiment.
Figure 7B:
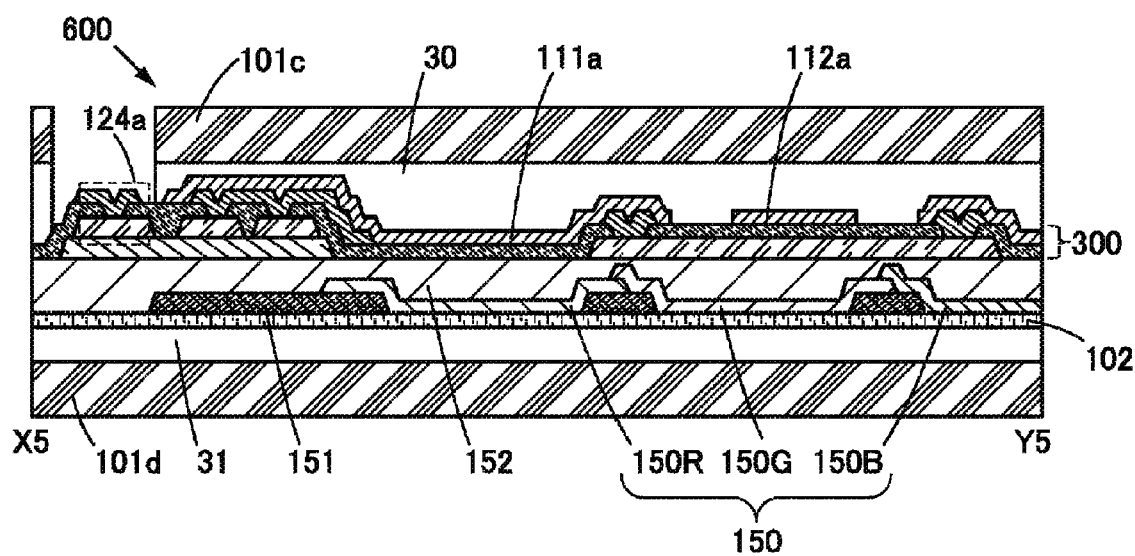

FIGS. 7A and 7B illustrate structures of a touch sensor 500 and a touch sensor 600, respectively, that each use the element 300 of one embodiment of the present invention. FIG. 7A is a cross-sectional view of the touch sensor 500, and FIG. 7B is a cross-sectional view of the touch sensor 600.

The touch sensor 400 includes the element 300; and a substrate 101c and a substrate 101d between which the element 300 is sandwiched (see FIGS. 6A and 6B). The substrate 101d is bonded to the base film 102 with an adhesive layer 31, and the substrate 101c is bonded to the pieces 111a of the first electrode 211(1) and/or the electrode 112a of the second electrode 212(1) with a bonding layer 30.

Note that the element 300 has the same structure as that described with reference to FIGS. 5A to 5D.

The touch sensor 500 and the touch sensor 600 have the same structure as the touch sensor 400 except for including a color filter 150, a colored layer 151, and an insulating film 152 in a position overlapping with the element 300 (see FIGS. 7A and 7B).

The touch sensor 500 includes the color filter 150 and the colored layer 151 between the element 300 and the substrate 101c. Specifically, the color filter 150 is provided between the colored layer 151 and the substrate 101c, and the insulating film 152 is provided between the element 300 and the color filter 150 (see FIG. 7A).

The touch sensor 600 includes the color filter 150 and the colored layer 151 between the element 300 and the substrate 101d. Specifically, the color filter 150 is provided between the colored layer 151 and the element 300, and the insulating film 152 is provided between the element 300 and the color filter 150 (see FIG. 7B).

The color filter 150 includes, for example, a coloring layer 150R that transmits red light, a coloring layer 150G that transmits green light, and a coloring layer 150B that transmits blue light.

The colored layer 151 is a layer that absorbs light and is, for example, colored black. The colored layer 151 is placed so as to overlap with an end portion of the coloring layer 150R, 150G, or 150B.

<<Substrate>>

Any of the materials that can be used for the substrate 101 described in Element structure example 1 can be used for the substrates 101c and 101d.

The element 300 has the pieces 111a having flexibility and the electrode 112a having flexibility.

When a flexible material is used for the substrates 101c and 101d, a flexible touch sensor can be provided.

<Touch Sensor Structure Example 2>

A structure of a touch sensor 400B of one embodiment of the present invention will be described with reference to FIGS. 24A and 24B.

Figure 24A:
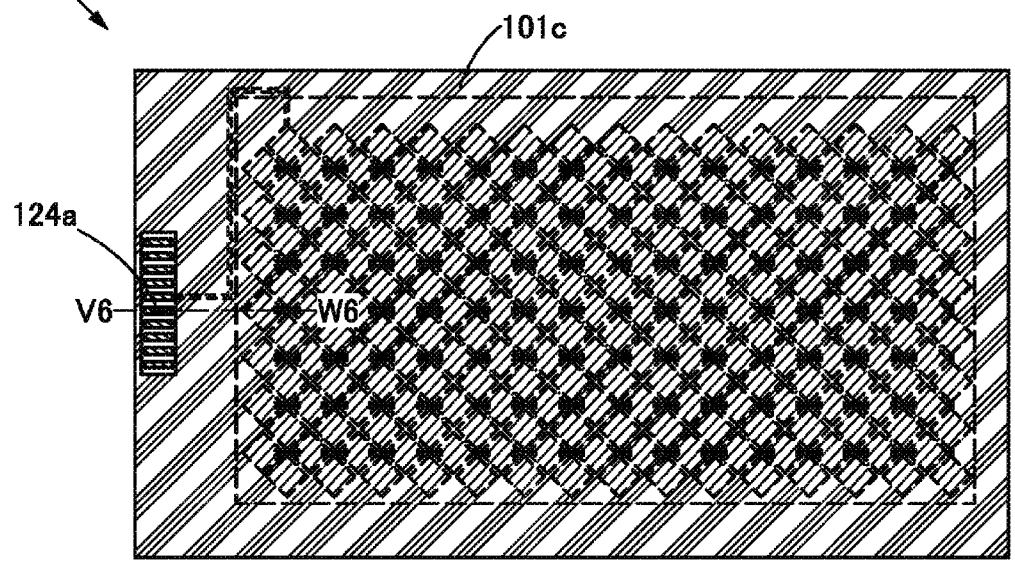
FIGS. 24A and 24B illustrate a structure of a touch sensor of an embodiment.
Figure 24B:
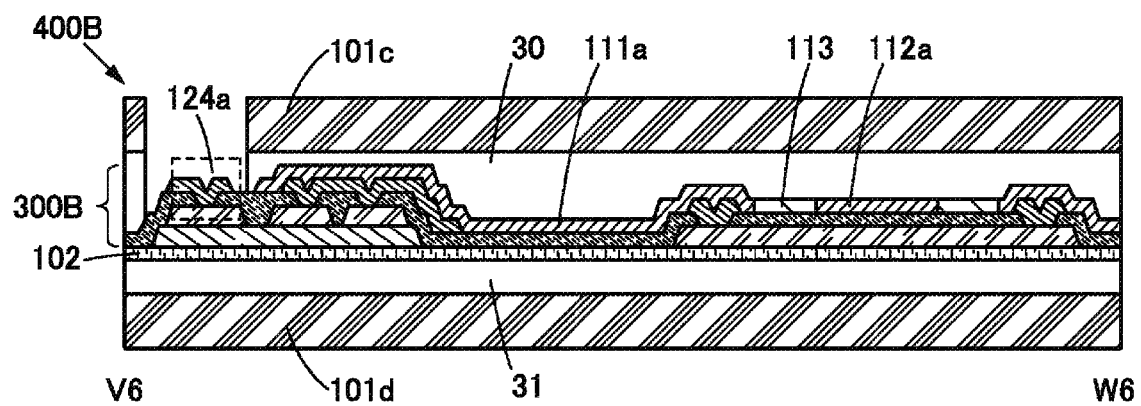

FIGS. 24A and 24B illustrate a structure of the touch sensor 400B that uses the element 300B of one embodiment of the present invention. FIG. 24A is a top view of the touch sensor 400B, and FIG. 24B is a cross-sectional view of the touch sensor 400B along V6-W6 in FIG. 24A.

The touch sensor 400B described in this embodiment is different from the touch sensor 400 described with reference to FIGS. 6A and 6B in including the element 300B instead of the element 300.

In Embodiment 1, one embodiment of the present invention has been described. Other embodiments of the present invention are described in Embodiments 2 to 7. However, embodiments of the present invention are not limited to these embodiments. For example, although an example of including graphene or graphene oxide in an electrode or the like has been described in one embodiment of the present invention, one embodiment of the present invention is not limited to this example. For example, depending on the case or situation, another material may be used in one embodiment of the present invention. Furthermore, for example, depending on the case or situation, it is not necessary to include graphene or graphene oxide.

This embodiment can be combined as appropriate with any of the other embodiments and examples of this specification.

Embodiment 2

In this embodiment, a formation method of a film having conductivity that can be used in an element of one embodiment of the present invention will be described with reference to FIG. 3A.

Figure 3A:
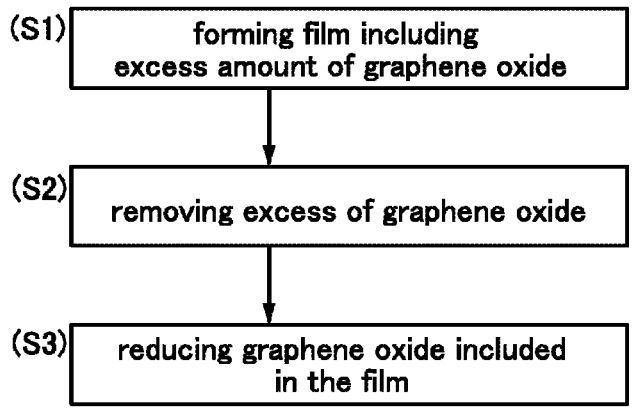
FIGS. 3A to 3C are flow charts each showing a formation method of a film of an embodiment or a manufacturing method of an element of an embodiment.

FIG. 3A is a flow chart showing a formation method of a film of one embodiment of the present invention.

<Film Formation Method 1>

The formation method of a film of this embodiment includes the following steps.

<<First Step>>

In the first step, a film including an excess amount of graphene oxide is formed over a substrate (see (S1) in FIG. 3A).

<<Second Step>>

In the second step, an excess of graphene oxide is removed (see (S2) in FIG. 3A).

<<Third Step>>

In the third step, graphene oxide included in the film is reduced (see (S3) in FIG. 3A).

The formation method of a film of this embodiment includes the step of forming a film including an excess amount of graphene oxide over a substrate, the step of removing an excess of graphene oxide, and the step of reducing graphene oxide remaining on a surface of the substrate. In this way, a thin film including graphene can be formed on the surface of the substrate. As a result, a novel formation method of a film can be provided.

Individual steps for forming a film having conductivity are described below. Note that these steps cannot be clearly distinguished and one step may also serve as another step or include part of other steps in some cases.

<Whole Structure>>

The method for forming a film having conductivity includes the step of forming a film including graphene oxide and the step of heating the film including graphene oxide.

<<First Step>>

The film including an excess amount of graphene oxide is formed.

For example, a dispersion liquid including graphene oxide is applied onto a substrate on which a base film is formed using a blade, and then dispersion medium is removed from the dispersion liquid of graphene oxide applied on the substrate.

For example, 1 mL of dispersion liquid of graphene oxide is applied using a blade having a 50-μm gap and a 250-mm width.

Note that a dispersion liquid obtained by dispersing graphene oxide into water can be used. For example, a dispersion liquid obtained by dispersing graphene oxide into water at a concentration of 10 mg/mL can be used.

As a surface on which the film is formed has higher hydrophilicity, the thickness of the film can be more uniform. For example, the film is preferably formed over a hydrophilic base film formed over the surface of the substrate. Specifically, a silicon oxynitride film in which the element proportions of silicon, oxygen, and nitrogen are 31, 66, and 1 or less by calculation from the results of XPS or a silicon oxide film, can be used.

Furthermore, treatment for increasing the hydrophilicity of the surface on which the film is formed may be performed. For example, plasma treatment, chemical liquid treatment, or both of them may be performed on the surface on which the film is formed. Moreover, to control the hydrophilicity of the surface on which the film is formed, treatment for decreasing the hydrophilicity may be performed in combination.

Any of various substrates can be used. For example, a borosilicate glass with a thickness of 0.7 mm can be used as the substrate.

A dispersion medium is removed from the dispersion liquid of graphene oxide applied on the substrate, so that the film including an excess amount of graphene oxide is formed. For example, water is removed by heating the substrate with a hot plate. Specifically, heating is performed using a hot plate at 110° C. for 10 minutes.

Note that the film formed through this step includes an excess amount of graphene oxide. For example, the excess amount of graphene oxide absorbs light, so that the film looks brown. Further, aggregated graphene oxide can be observed in some cases.

<<Second Step>>

The excess of graphene oxide is removed.

For example, the substrate over which the film including an excess amount of graphene oxide is formed is immersed in a liquid and then washed. The liquid for immersion is preferably alkaline. The washing is preferably performed with running water.

Specifically, immersion is performed in a room-temperature aqueous solution including tetra-methyl ammonium hydroxide (TMAH) at 2.38% for approximately 0.5 minutes to 1 minute. Then, the substrate is exposed to running water for several seconds. Note that after the washing with running water, the substrate may be blow-dried with a nitrogen stream.

After this step, graphene oxide remains attached to the surface of the base film 102, and the excess of graphene oxide is removed. For example, it becomes difficult to observe the film including graphene oxide with one's eyes.

<<Third Step>>

Graphene oxide is reduced.

Various treatments can be used. For example, chemically reducing treatment using a reducing agent and/or thermally reducing treatment using heat can be used.

For example, chemically reducing treatment using an ascorbic acid or the like as a reducing agent can be used.

Specifically, the substrate from which the excess of graphene oxide has been removed is immersed in an ethanol solution including an ascorbic acid. More specifically, the immersion is performed for 1 hour in an ethanol solution including 2.7 g of an ascorbic acid per 200 mL that is kept at 60° C.

Then, washing is performed with pure water or ethanol. Note that after this washing, blow-drying with a nitrogen stream may be performed.

For example, thermally reducing treatment can be performed by heating in a reduced-pressure atmosphere.

Specifically, heating is performed at a pressure of lower than or equal to 1.0 kPa at temperatures of, for example, higher than or equal to 200° C. and lower than 300° C. for several hours.

Furthermore, the reducing treatment may be performed more than once. By performing the reducing treatment more than once, graphene oxide can be more surely reduced to graphene.

Furthermore, the chemically reducing treatment and the thermally reducing treatment can be performed in combination. When the chemically reducing treatment and the thermally reducing treatment are performed in combination, the heating temperature can be set lower in the thermally reducing treatment as compared with the case in which only the thermally reducing treatment is performed. Therefore, the film including graphene can be directly formed over a flexible substrate with low heat resistance.

In this embodiment, because the film including graphene formed over the substrate is an extremely thin film, it has an excellent light-transmitting property. Furthermore, in this embodiment, a dispersion liquid including graphene oxide is applied, dispersion medium is removed from the dispersion liquid applied onto the substrate to form a film including graphene oxide, and the film including graphene oxide is reduced to form the film including graphene. Therefore, an expensive film formation apparatus (e.g., a plasma CVD apparatus or a sputtering apparatus) is unnecessary, so that the film including graphene can be formed at low cost. Furthermore, in this embodiment, since an excess amount of graphene oxide in which the existence of aggregated graphene oxide is observed is removed, the film including graphene in which the existence of aggregates is hardly observed can be formed. Accordingly, the film including graphene can be formed at high yield.

<Film Formation Method 2>

Another example of the formation method of a film of one embodiment of the present invention will be described with reference to FIGS. 15A to 15C.

In Film formation method 1, the film including an excess amount of graphene oxide in which the existence of aggregated graphene oxide is observed is formed, an excess amount of graphene oxide is removed, and the reducing treatment is performed; as a result, the extremely thin film including graphene in which the existence of aggregates is hardly observed is formed. Here, as another example of the formation method of a film of one embodiment of the present invention, a method for forming a film including graphene with excellent conductivity in which the existence of aggregates is hardly observed will be described. Here, different structures will be described in detail, and the above description in Film formation method 1 is referred to for the other similar structures.

<<First Step>>

Figure 15A:
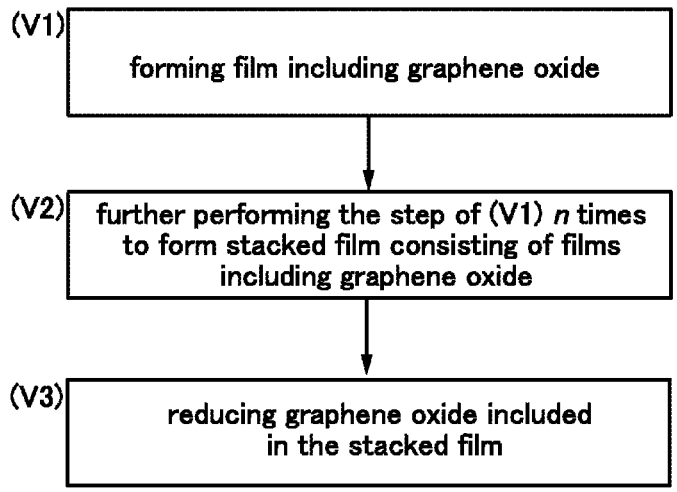
FIGS. 15A to 15C illustrate a formation method of a film of an embodiment.
Figure 15B:
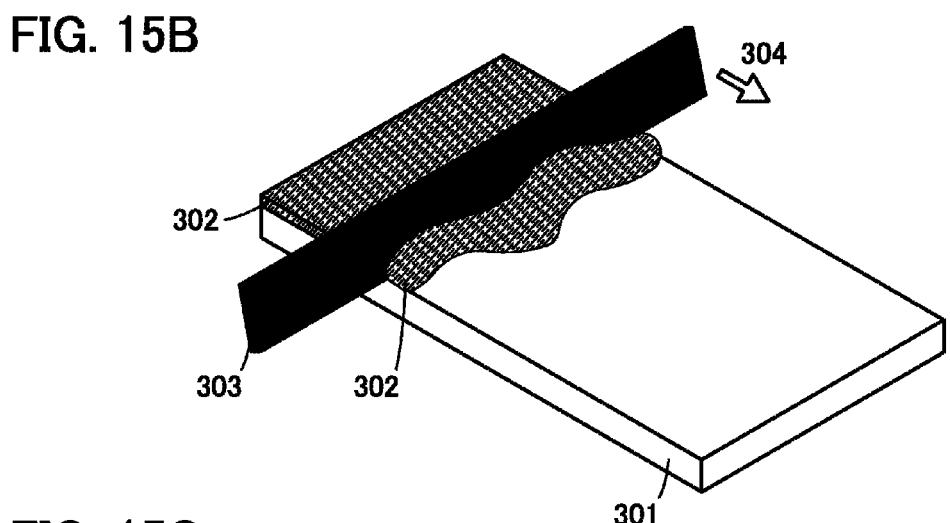
Figure 15C:
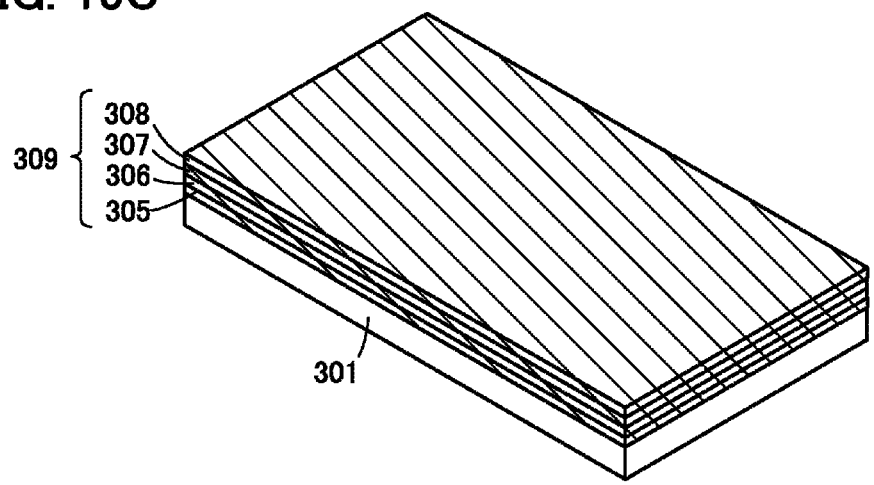

In the first step, a film including graphene oxide is formed over a substrate (see (V1) in FIG. 15A). As illustrated in FIG. 15B, a dispersion liquid 302 in which graphene oxide is dispersed is leveled off with a blade 303 so as to be applied evenly over a substrate 301. Specifically, the distance between a surface of the substrate 301 and the blade 303 is set extremely small in such an extent that the blade 303 does not touch the substrate 301, and the blade 303 is moved in the direction indicated by an arrow 304; in this way, the dispersion liquid 302 is applied evenly over the substrate 301. Then, drying treatment for removing a dispersion medium from the dispersion liquid 302 applied evenly over the substrate 301 is performed. As a result, a film 305 including graphene oxide is formed (see FIG. 15C).

At this time, by setting the distance between the surface of the substrate 301 and the blade 303 extremely small, aggregated graphene oxide that is originally included in the dispersion liquid 302 can be removed from the surface of the substrate 301 at the time of moving the blade 303 in the direction indicated by the arrow 304 to level off the dispersion liquid 302. Moreover, setting the distance between the surface of the substrate 301 and the blade 303 extremely small makes the dispersion liquid 302 be applied extremely thin, which prevents generation of aggregated graphene oxide in the dispersion liquid 302 during the application step. Accordingly, the film 305 including graphene oxide in which the existence of aggregates is hardly observed can be formed over the substrate 301.

For example, the distance between the surface of the substrate 301 and the blade 303 may be set at 100 µm or less, preferably 10 µm or less, further preferably 5 µm or less. Moreover, the thickness of the film 305 including graphene oxide formed over the substrate 301 can be more than or equal to 0.3 nm and less than or equal to 100 nm, for example.

<<Second Step>>

In the second step, the first step (see (V1) in FIG. 15A) is further performed n times (n is a natural number of 1 or more) to form a stacked film consisting of films including graphene oxide over the substrate (see (V2) in FIG. 15A). For example, as illustrated in FIG. 15C, by the process similar to that of the film 305 including graphene oxide, films 306, 307, and 308 including graphene oxide are formed, so that a stacked film 309 of the films including graphene oxide is formed.

Note that at the formation of the film 306 including graphene oxide, the distance between a surface of the film 305 including graphene oxide and the blade 303 may be set at 100 µm or less, preferably 10 µm or less, further preferably 5 µm or less. In addition, at the formation of the films 307 and 308 including graphene oxide, the distance between the surface on which the dispersion liquid 302 is applied and the blade 303 may be set at 100 µm or less, preferably 10 µm or less, further preferably 5 µm or less. Furthermore, the thickness of each of the films 306, 307, and 308 including graphene oxide can be more than or equal to 0.3 nm and less than or equal to 100 nm, for example. The thickness of the stacked film 309 of the films including graphene oxide can be more than or equal to 1.2 nm and less than or equal to 400 nm, for example.

<<Third Step>>

In the third step, graphene oxide included in the stacked film 309 is reduced (see (V3) in FIG. 15A).

Through the above-described steps, the film including graphene can be formed. Although the films 305, 306, 307, and 308 including graphene oxide are each a thin film, the formation of the stacked film 309 consisting of such films and the reducing treatment on the stacked film 309 lead to formation of a film including graphene having a certain thickness. Thus, the film including graphene with excellent conductivity can be formed.

Of course, for forming a film including graphene with an excellent light-transmitting property, the step (V2) in FIG. 15A may be omitted and only the film 305 including graphene oxide may be subjected to the reducing treatment. The film including graphene formed by reducing the film 305 including graphene oxide is an extremely thin film and thus has an excellent light-transmitting property.

In this embodiment, since the film including graphene formed over the substrate has a certain thickness, it has excellent conductivity. Furthermore, in this embodiment, a dispersion liquid including graphene oxide is applied, dispersion medium is removed from the dispersion liquid applied onto the substrate to form a film including graphene oxide, and the film including graphene oxide is reduced to form the film including graphene; therefore, an expensive film formation apparatus (e.g., a plasma CVD apparatus or a sputtering apparatus) is unnecessary, so that the film including graphene can be formed at low cost. Moreover in this embodiment, since the film including graphene oxide in which the existence of aggregates is hardly observed can be formed over the substrate, the film including graphene can be formed at high yield.

<Film Formation Method 3>

Another example of the formation method of a film of one embodiment of the present invention will be described with reference to FIGS. 25A to 25B.

Figure 25A:
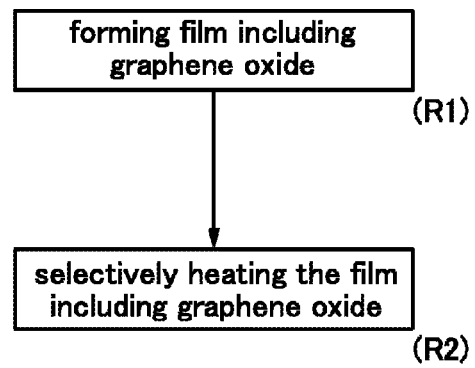
FIG. 25A is a flow chart showing a formation method of a film of an embodiment and FIG. 25B is a schematic diagram of a heating device.
Figure 25B:
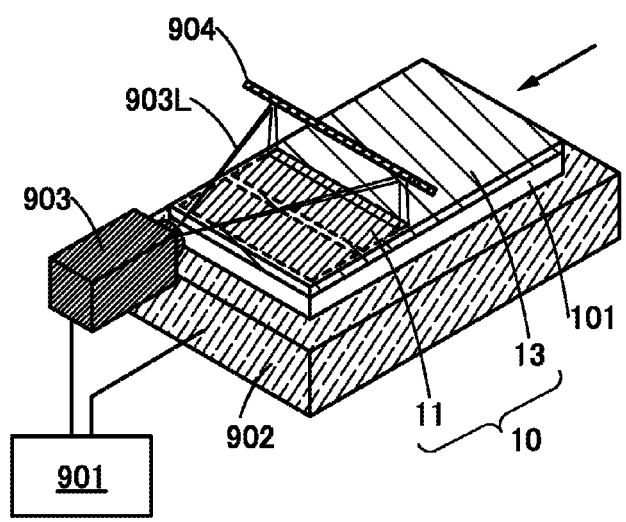

FIGS. 25A and 25B illustrate the formation method of a film of one embodiment of the present invention. FIG. 25A is a flow chart showing the formation method of a film of one embodiment of the present invention. FIG. 25B is a projection drawing of a device that is capable of selective heating.

The formation method of a film of this embodiment includes the following steps.

In the first step, a film including graphene oxide is formed over a substrate (see (R1) in FIG. 25A).

In the second step, the film including graphene oxide is selectively heated, so that a first region 11 that includes graphene and a second region 13 that includes graphene oxide and is adjacent to the first region are formed (see (R2) in FIG. 25A).

The film formation method includes the step of forming the film including graphene oxide and the step of selective heating. In this way, the conductivity of the first region can be selectively made higher than that of the second region. As a result, a novel film formation method can be provided.

Individual steps for forming the film are described below. Note that these steps cannot be clearly distinguished and one step may also serve as another step or include part of other steps in some cases.

Note that this film formation method is different from Film formation method 1 described with reference to FIG. 3A in selectively heating the film including graphene oxide in the second step. Here, such a different structure will be described in detail, and the above description is referred to for the other similar structures.

<<Second Step>>

An excess of graphene oxide is removed.

For example, the substrate over which the film including an excess amount of graphene oxide is formed is immersed in a liquid and then washed. The liquid for immersion is preferably alkaline. The washing is preferably performed with running water.

Specifically, immersion is performed in a room-temperature aqueous solution including tetra-methyl ammonium hydroxide (TMAH) at 2.38% for approximately 0.5 minutes to 1 minute. Then, the substrate is exposed to running water for several seconds. Note that after the washing with running water, the substrate may be blow-dried with a nitrogen stream.

After this step, graphene oxide remains attached to the surface of the base film 102, and the excess of graphene oxide is removed. For example, it becomes difficult to observe the film including graphene oxide with one's eyes.

<Heating Device>

An example of a heating device that is capable of selective heating is described with reference to FIG. 25B.

A heating device 900 includes a control portion 901 that supplies a first control signal and a second control signal that synchronizes with the first control signal, a stage 902 to which the first control signal is supplied and which can move in at least one axis direction in accordance with the first control signal, a laser device 903 to which the second control signal is supplied and which emits a laser beam 903L, and a reflector 904 that reflects the supplied laser beam 903L in a predetermined direction.

The first control signal includes a signal for controlling the movement of the stage 902.

The second control signal includes a signal for controlling the laser device 903 so that the laser device 903 can perform selective irradiation with the laser beam 903L in synchronization with the first control signal.

The laser beam 903L is at least the one that can heat the film including graphene oxide. For example, an Nd:YAG laser, an argon ion laser, an excimer laser, or the like can be used. A continuous-wave laser or a pulsed laser can be used. Furthermore, ultraviolet light or visible light that graphene oxide absorbs can be used for heating.

Note that graphene oxide absorbs visible light while graphene does not absorb visible light. When visible light is used for heating, supply of excessive heat to the reduced graphene can be avoided. Specifically, a second harmonic (wavelength: 532 nm) of an Nd:YAG laser or an argon ion laser beam (wavelength: 488 nm to 514 nm) is particularly preferable.

When the irradiation area is irradiated with a laser beam, under a reduced pressure or with a nitrogen gas blown on the irradiation area, the generated graphene can be prevented from reacting with oxygen in the atmosphere and producing carbon dioxide.

The heating temperature is preferably high in such an extent that a substrate or a base film is not damaged. At a higher heating temperature, more graphene oxide can be reduced to graphene.

Note that the stage 902 on the laser beam 903L irradiation side can be supported by the substrate 101.

For example, by selectively heating the film including graphene oxide using the heating device 900, the first region 11 including graphene and the second region 13 including graphene oxide can be formed.

<Film Structure Example>

Structures of a film that can be formed using Film formation method 3 of this embodiment will be described with reference to FIGS. 26A to 26D.

Figure 26A:
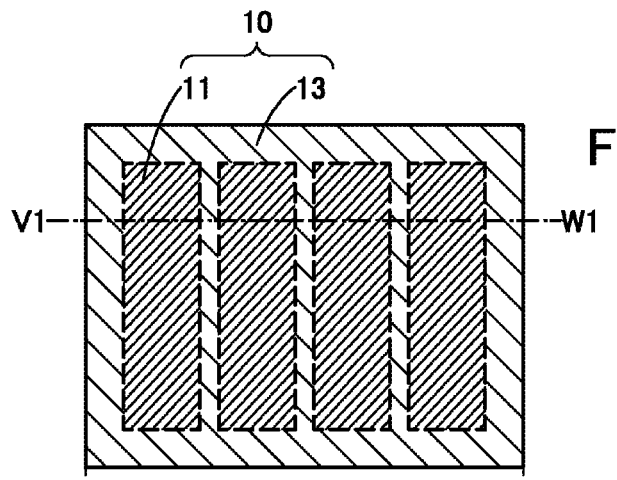
FIGS. 26A to 26D each illustrate a structure of a film of an embodiment.
Figure 26B:
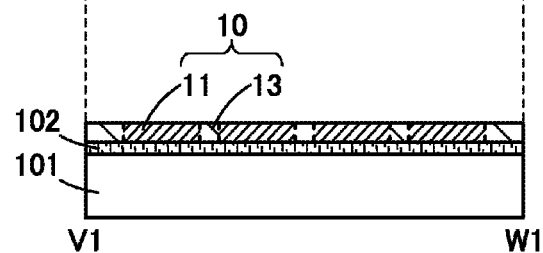
Figure 26C:
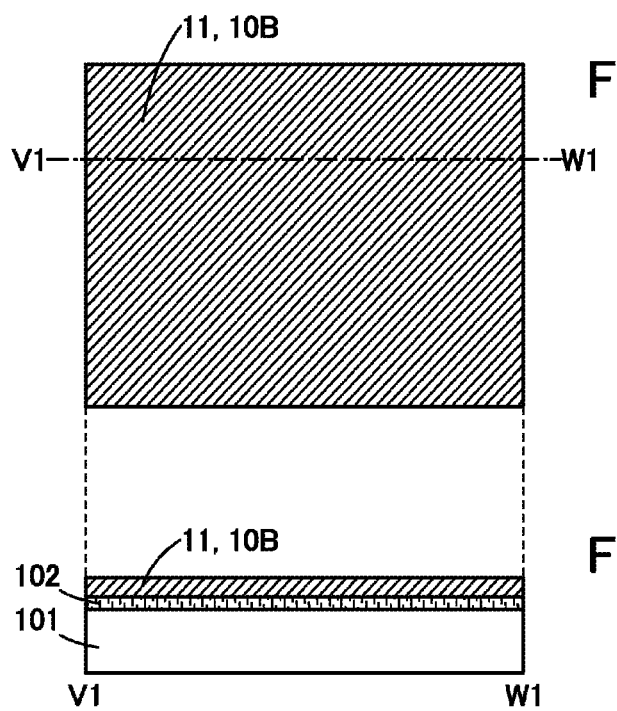
Figure 26D:
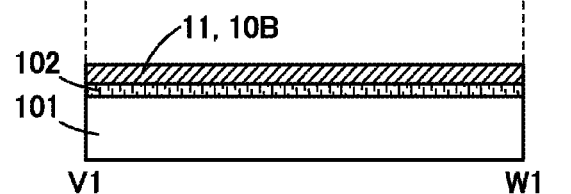

FIGS. 26A to 26D each illustrate the structure of the film of one embodiment of the present invention. FIG. 26A is a top view of the film of one embodiment of the present invention, and FIG. 26B is a cross-sectional view of the structure of the film along V1-W1 in FIG. 26A. FIG. 26C is a top view of the film of one embodiment of the present invention, and FIG. 26D is a cross-sectional view of the structure of the film along V1-W1 in FIG. 26C.

A film 10 includes the first region 11 including graphene and the second region 13 including graphene oxide and being adjacent to the first region 11. The conductivity of the first region 11 is higher than the conductivity of the second region 13 (see FIG. 26A).

The film 10 is preferably flexible.

The film 10 preferably transmits visible light.

The film 10 described in this embodiment includes the first region 11 including graphene and the second region 13 including graphene oxide. The conductivity of the first region 11 can be higher than the conductivity of the second region 13. As a result, a novel film can be provided.

Note that the film 10 may be supported by the substrate 101 (see FIG. 26B). The base film 102 may be provided between the film 10 and the substrate 101.

Individual components included in the film 10 are described below. Note that in some cases, these components cannot be clearly distinguished and one component may also serve as another component or include part of another component.

For example, in some cases, a mixed region of the first region 11 and the second region 13 might be placed between the first region 11 and the second region 13, so that a boundary between the first region 11 and the second region 13 might be unclear.

The film 10 includes the first region 11 and the second region 13.

The film 10 transmits visible light. For example, the film 10 transmits 80% or more of light having wavelengths from 300 nm to 900 nm.

The film 10 is thin to have flexibility and, for example, has a thickness of more than or equal to 0.3 nm and less than or equal to 50 nm.

As the substrate 101 that supports the film 10, a flexible substrate can be used. The film 10 formed over the flexible substrate can be bent together with the substrate 101. For example, bending at a curvature radius of 5 mm or less is possible.

The first region 11 includes graphene. Graphene included in the first region 11 includes carbon and oxygen, and the percentage of oxygen in the graphene calculated from the results of X-ray photoelectron spectroscopy (XPS) is more than or equal to 0 atomic % and less than or equal to 20 atomic %, preferably more than or equal to 0 atomic % and less than or equal to 10 atomic %. In addition, a thin sheet of graphene has a lateral length, which is a length from one end to the other end, of more than or equal to 0.5 µm and less than or equal to 1000 µm, preferably more than or equal to 10 µm and less than or equal to 500 µm.

The second region 13 includes graphene oxide. Graphene oxide included in the second region 13 includes carbon and oxygen, and the percentage of oxygen in the graphene oxide calculated from the results of XPS is more than or equal to 20 atomic % and less than or equal to 40 atomic %, preferably more than or equal to 30 atomic % and less than or equal to 40 atomic %. In addition, a thin sheet of graphene oxide has a lateral length, which is a length from one end to the other end, of more than or equal to 0.5 µm and less than or equal to 1000 µm, preferably more than or equal to 10 µm and less than or equal to 500 µm.

The first region 11 has higher conductivity than the second region 13; for example, the first region 11 has a sheet resistance of more than or equal to $10\Omega/\square$ and less than or equal to $10^4\Omega/\square$, and the second region 13 has a sheet resistance of more than or equal to $10^7\Omega/\square$ and less than or equal to $10^9\Omega/\square$.

The film 10B illustrated in FIGS. 26C and 26D is different from the film 10 illustrated in FIGS. 26A and 26B in not including the second region 13.

This embodiment can be combined as appropriate with any of the other embodiments and examples of this specification.

Embodiment 3

In this embodiment, a manufacturing method of an element of one embodiment of the present invention will be described with reference to FIGS. 3B and 3C and FIGS. 4A to 4D. Specifically, a manufacturing method of the element 100 described in Embodiment 1 will be described.

Figure 3B:
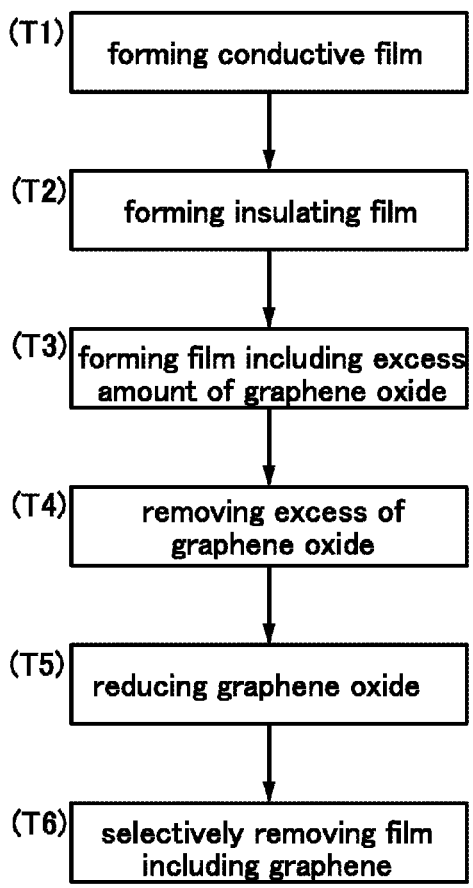
Figure 3C:
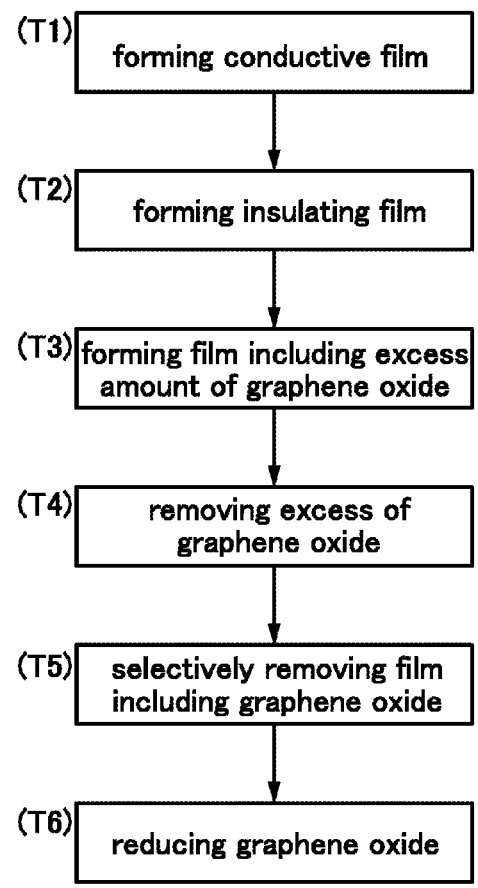

FIGS. 3B and 3C are flow charts showing the manufacturing method of an element of one embodiment of the present invention.

FIGS. 4A to 4D are cross-sectional views each illustrating the structure after a step in the manufacturing method of an element of one embodiment of the present invention has finished.

<Element Manufacturing Method>

The manufacturing method of the element 100 described in this embodiment includes the following steps.

<<First Step>>

Figure 4A:
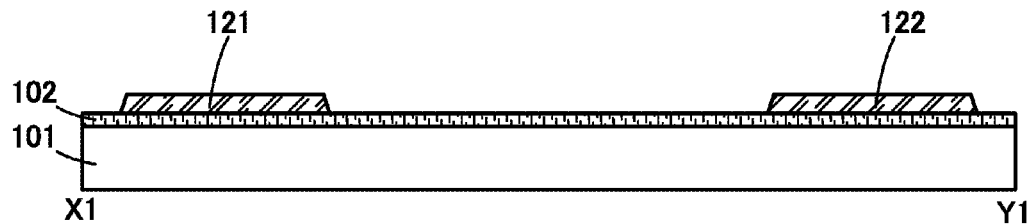
FIGS. 4A to 4D illustrate a manufacturing method of an element of an embodiment.

The first conductive film 121 and the second conductive film 122 are formed (see (T1) in FIG. 3B, (T1) in FIG. 3C, and FIG. 4A).

For example, the substrate 101 over which the base film 102 is formed is prepared, and a conductive film is formed over the base film 102 and patterned into an islands.

The conductive film can be formed by any of a variety of methods: specifically, a sputtering method, a CVD method, a spin coating method, or the like can be used. The conductive film can be patterned into islands by any of a variety of methods; a photolithography technique or an etching method can be used for example.

<<Second Step>>

Figure 4B:
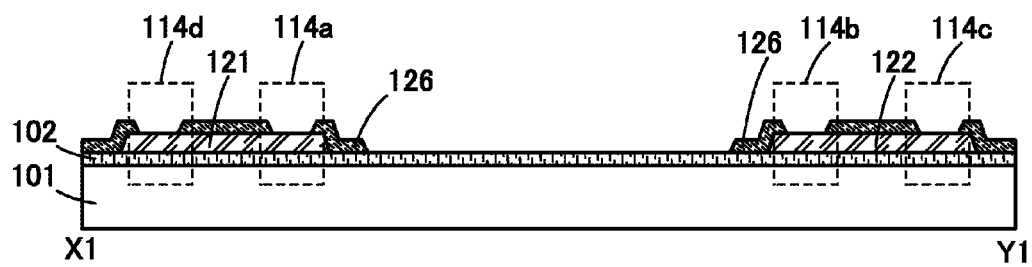

The insulating film 126 that covers end portions of the first conductive film 121 and the second conductive film 122 and is provided with the first opening 114a, the second opening 114b, the third opening 114c, and the fourth opening 114d is formed (see (T2) in FIG. 3B, (T2) in FIG. 3C, and FIG. 4B).

For example, an insulating film that covers the first conductive film 121, the second conductive film 122, and the base film 102 is formed, and the formed insulating film is patterned into islands.

The insulating film can be formed by any of a variety of methods; specifically, a sputtering method, a CVD method, a spin coating method, or the like can be used. The insulating film can be patterned into islands by any of a variety of methods; a photolithography technique can be used for example.

<<Third Step>>

A film including an excess amount of graphene oxide that covers the first opening 114a, the second opening 114b, the third opening 114c, and the fourth opening 114d is formed (see (T3) in FIG. 3B and (T3) in FIG. 3C).

For example, the film including an excess amount of graphene oxide is formed using the method described in the first step of Film formation method 1 in Embodiment 2.

<<Fourth Step>>

Figure 4C:
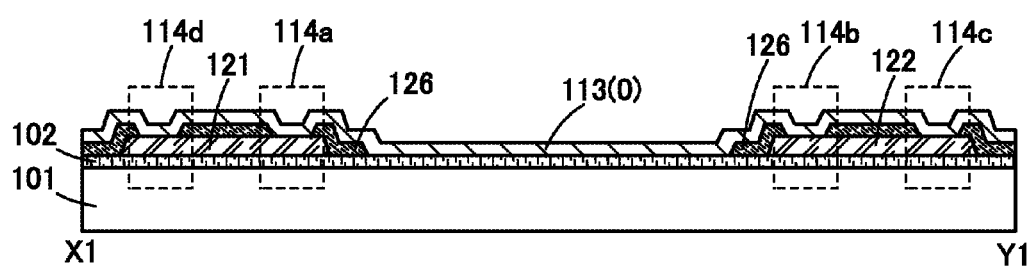
Figure 4D:
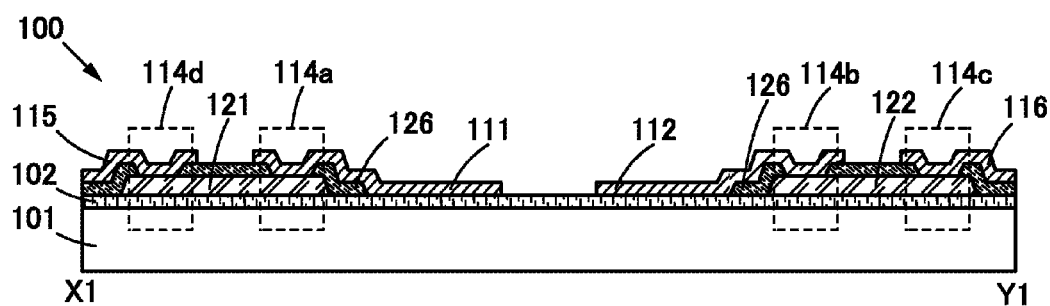

The excess of graphene oxide is removed to form an extremely thin film 113(0) including graphene oxide (see (T4) in FIG. 3B, (T4) in FIG. 3C, and FIG. 4C).

For example, the excess of graphene oxide is removed using the method described in the second step of Film formation method 1 in Embodiment 2.

As the formation method of the film including graphene oxide, the method described in the first step and the second step of Film formation method 2 in Embodiment 2 may be used. Specifically, the film 113(0) including graphene oxide illustrated in FIG. 4C can be made to have the structure like the stacked film 309 in FIG. 15C consisting of films including graphene oxide. More specifically, the steps shown in (T3) in FIG. 3B and (T4) in FIG. 3B can be replaced by the steps shown in (V) in FIG. 15A and (V2) in FIG. 15A. Moreover, the steps shown in (T3) in FIG. 3C and (T4) in FIG. 3C can be replaced by the steps shown in (V1) in FIG. 15A and (V2) in FIG. 15A.

<<Fifth Step>>

The film 113(0) including graphene oxide is subjected to reducing treatment to form a film including graphene (see (T5) in FIG. 3B).

For example, the film including graphene is formed using the method described in the third step of Film formation method 1 in Embodiment 2.

<<Sixth Step>>

The first electrode 111 and the second electrode 112 located apart from the first electrode are formed from the film including graphene. In addition, the electrode 115 and the electrode 116 are formed from the film including graphene (see (T6) in FIG. 3B and FIG. 4D).

The first electrode 111, the second electrode 112, the electrode 115, and the electrode 116 can be formed using any of a variety of methods for patterning the film including graphene into islands. For example, a photolithography technique can be used.

Specifically, a resist mask is formed so as to overlap with areas that are to remain in island shapes of the film including graphene, and an unnecessary portion is etched to form the island shapes. For example, as the etching treatment, ashing treatment in which irradiation with oxygen plasma is performed or the like can be used.

Alternatively, the fifth step and the sixth step can be reversed (see (T5) in FIG. 3C and (T6) in FIG. 3C). Specifically, after the film including graphene oxide is selectively removed and patterned into islands, graphene oxide included in the remaining film can be reduced.

Since graphene oxide is an oxide, its surface has many oxygen atoms. Accordingly, a surface of the film including graphene oxide has a higher hydrophilicity than that of the film including graphene. For this reason, when using a resist mask in a photolithography technique for example, the resist can be applied more evenly in the case of applying the resist on the surface of the film including graphene oxide before the reducing treatment than in the case of applying the resist on the surface of the film including graphene after the reducing treatment.

<<Additional Step>>

Since the film including graphene oxide can be easily peeled, it is preferable to perform treatment for increasing the resistance to peeling of the film including graphene oxide.

When the film including graphene oxide is exposed to an alkaline solution, part of the film might be peeled. For example, when forming a resist mask in a photolithography technique, the film including graphene oxide might be partly peeled by being exposed to an alkaline developer.

From the experiment by the present inventors, it has been revealed that immersing the film including graphene oxide in an acidic solution before exposure to an alkaline solution is effective to prevent such a phenomenon. For example, immersing the film including graphene oxide in an acidic solution before forming a resist mask in a photolithography technique can prevent the film including graphene oxide from being partly peeled even when exposed to an alkaline developer in forming a resist mask in a photolithography technique.

The time for immersing the film including graphene oxide in an acidic solution is preferably shorter than or equal to 10 minutes, further preferably shorter than or equal to 3 minutes. Furthermore, the temperature of the acidic solution may be higher than or equal to room temperature. Moreover, the acidic solution is adjusted to have a hydrogen ion exponent (pH) of preferably 6 or less, further preferably more than or equal to 3 and less than or equal to 6.

For example, as the acidic solution, a solution of the same kind as a solution that is used for separating the resist mask can be used. In this case, there is no need to purchase a new kind of solution as the acidic solution, which is preferable.

The manufacturing method of the element 100 described in this embodiment includes the step of forming the film including graphene oxide and the step of selectively removing the film including graphene oxide or the film including graphene. Accordingly, the first electrode 111 and the second electrode 112 can be formed. As a result, a novel manufacturing method of an element can be provided.

Modification Example

An example of the manufacturing method of an element of one embodiment of the present invention will be described with reference to FIG. 27 and FIGS. 28A and 28B. Specifically, the manufacturing method of the element 100B described in Embodiment 1 will be described.

Figure 27:
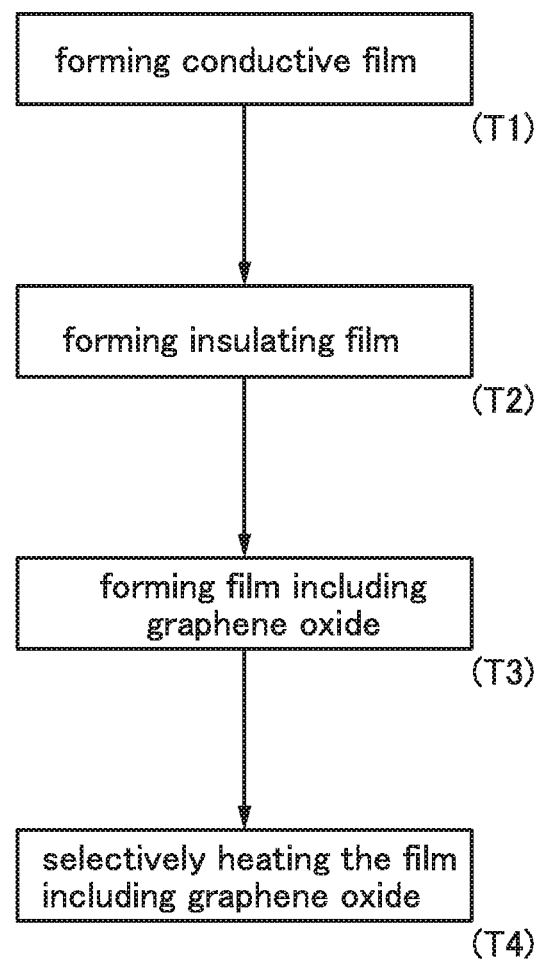
FIG. 27 is a flow chart showing a formation method of a film of an embodiment.

FIG. 27 is a flow chart showing the manufacturing method of an element of one embodiment of the present invention.

Figure 28A:
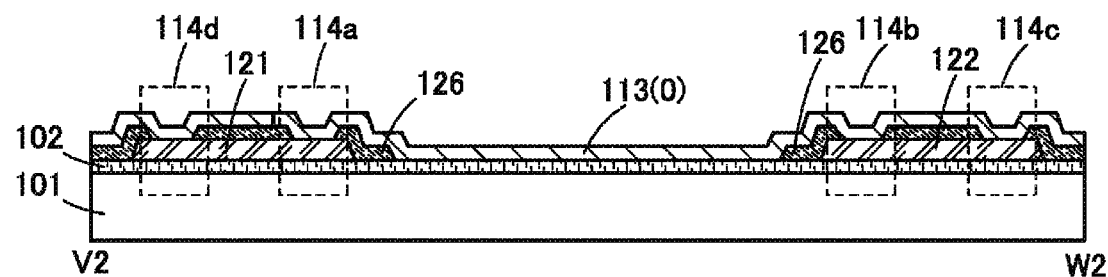
FIGS. 28A and 28B illustrate a manufacturing method of an element of an embodiment.
Figure 28B:
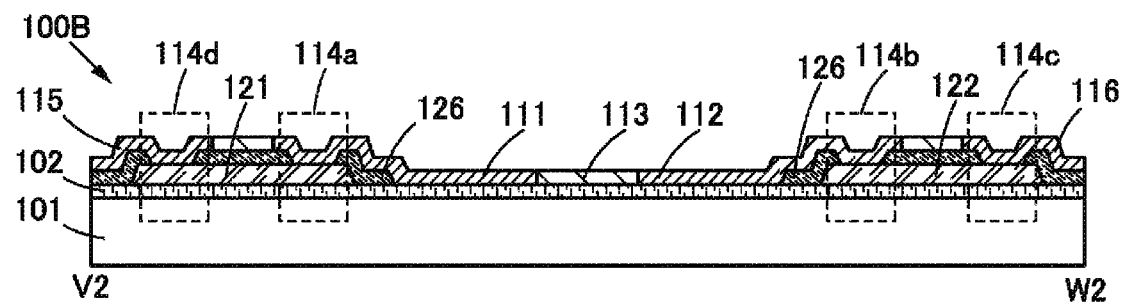

FIGS. 28A and 28B are cross-sectional views illustrating the structure in particular steps in the manufacturing method of an element of one embodiment of the present invention.
<Element Manufacturing Method>

The manufacturing method of the element 100B of one embodiment of the present invention is different from the manufacturing method of the element 100 described with reference to FIGS. 3A to 3C in that the film including graphene oxide is formed in the third step and that the film including graphene oxide is selectively heated in the fourth step. Different steps will be described in detail below, and the above description is referred to for the other similar steps.
<<Third Step>>

The film 113(0) including graphene oxide that covers the first opening 114*a* and the second opening 114*b* is formed (see (T3) in FIG. 27 and FIG. 28A).

For example, the film 113(0) including graphene oxide is formed using the method described in the first step of Film formation method 1 in Embodiment 2.
<<Fourth Step>>

The film 113(0) including graphene oxide in at least a region overlapping with the first opening 114*a* and a region overlapping with the second opening 114*b* is selectively heated, so that the first electrode 111 including graphene, the second electrode 112 including graphene, and the divider 113 including graphene oxide between the first electrode 111 and the second electrode 112 are formed (see (T4) in FIG. 27 and FIG. 28B).

For example, the film including graphene oxide is selectively heated using the method described in the second step in Film formation method 3 of Embodiment 2 to form the first electrode 111 and the second electrode 112.

The manufacturing method of the element 100B described in this embodiment includes the step of forming the film including graphene oxide and the step of selective heating. Accordingly, the conductivities of the first electrode 111 and the second electrode 112 can be selectively made higher than that of the divider. As a result, a novel manufacturing method of an element can be provided.

This embodiment can be combined as appropriate with any of the other embodiments and examples of this specification.

Embodiment 4

In this embodiment, a manufacturing method of a touch sensor of one embodiment of the present invention will be described with reference to FIGS. 8A and 8B, FIGS. 9A to 9F, and FIGS. 10A to 10I. Specifically, a manufacturing method of the touch sensor 400 described in Embodiment 1 will be described.

Figure 8A:
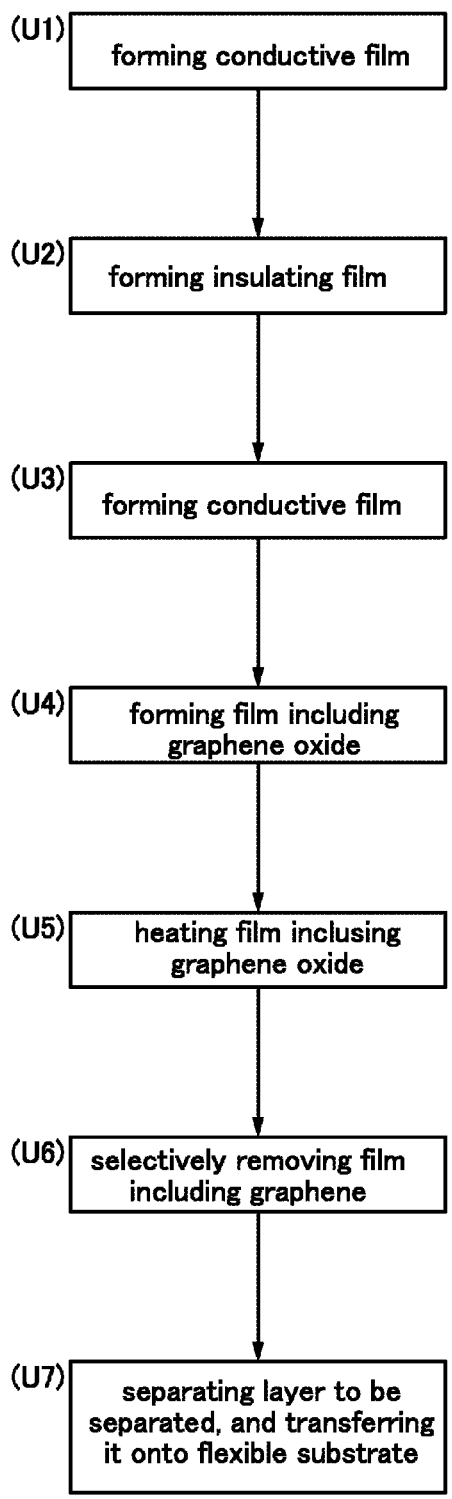
FIGS. 8A and 8B are flow charts each showing a manufacturing method of a touch sensor of an embodiment.
Figure 8B:
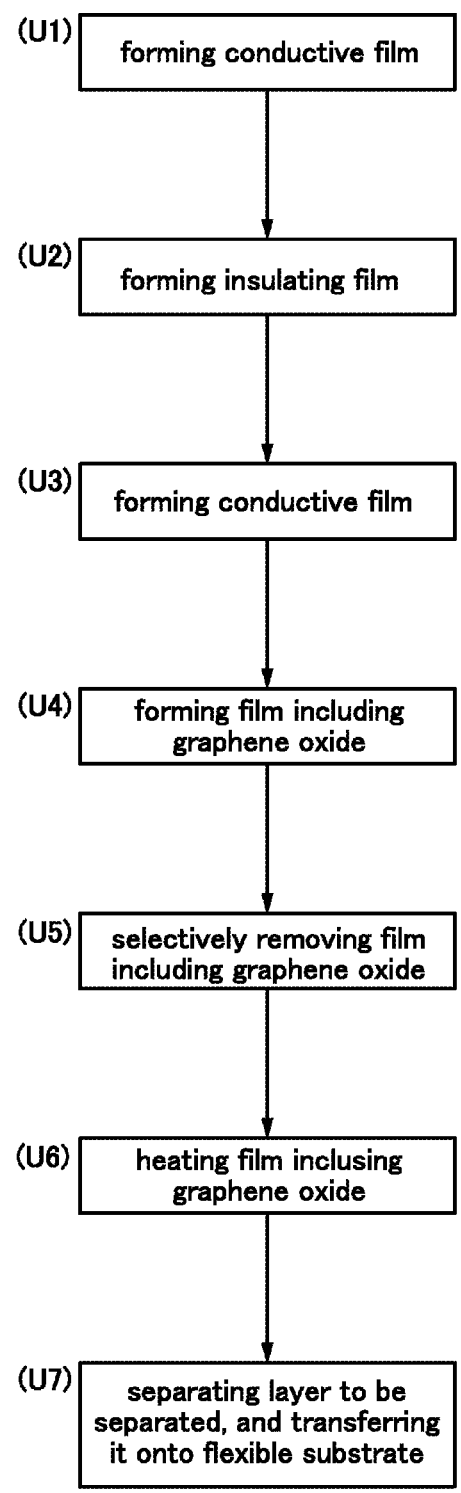

FIGS. 8A and 8B are flow charts each showing a manufacturing method of the touch sensor 400.

FIGS. 9A to 9F are cross-sectional views each illustrating the structure after a step in the manufacturing method of the touch sensor 400 has finished.

FIGS. 10A to 10I illustrate steps for separating a layer to be separated including the element 300 from a processing member 80 and transferring the layer onto another substrate.
<Touch Sensor Manufacturing Method 1>

In this embodiment, a method of forming the layer to be separated including the element 300 over a substrate for the manufacturing process over which a separation layer is formed and transferring the element 300 onto a flexible substrate to manufacture the touch sensor 400 will be described. This method includes the following steps.
<<First Step>>

The substrate 101*a* over which the separation layer 101*b* is formed is prepared, and a layer that can be separated from the separation layer 101*b* in a later step is formed.
<<Separation Layer>>

As a material that can be used for the separation layer, an inorganic material, an organic material, or the like can be given.

Specific examples of the inorganic material include a metal element selected from tungsten, molybdenum, titanium, tantalum, niobium, nickel, cobalt, zirconium, zinc, ruthenium, rhodium, palladium, osmium, iridium, and silicon; an alloy or a compound that contains any of the above metal elements, and the like.

Specifically, examples of the organic material are polyimide, polyester, polyolefin, polyamide, polycarbonate, and an acrylic resin. In particular, polyimide is preferable because of its superiority in heat resistance over other materials.

The structure the separation layer can employ may be a single-layer structure or a stacked-layer structure. For example, a stacked-layer structure including a layer including tungsten and a layer including an oxide of tungsten can be employed.

The layer containing an oxide of tungsten may be formed by stacking another layer with a layer containing tungsten, for example, by stacking a film containing oxygen, such as a silicon oxide film or a silicon oxynitride film, with a layer containing tungsten.

The layer containing an oxide of tungsten may be formed by performing thermal oxidation treatment, oxygen plasma treatment, nitrous oxide ($N_2O$) plasma treatment, treatment with a solution having strong oxidizing power (e.g., ozone water), or the like on a surface of a layer containing tungsten.

<<Layer to be Separated>>

There is no particular limitation on the layer to be separated as long as the layer to be separated can be separated from the separation layer and has heat resistance high enough to withstand the manufacturing process.

As a material that can be used for the layer to be separated, an inorganic material, an organic material, or the like can be given.

The layer to be separated may have a single-layer structure, a stacked-layer structure, or the like. For example, a structure may be employed in which a functional layer overlapping with the separation layer and an insulating layer that is provided between the separation layer and the functional layer to prevent diffusion of impurities that impair the characteristics of the functional layer are stacked. Specifically, a structure can be employed in which a silicon oxynitride layer, a silicon nitride layer, and the functional layer are stacked in this order over the separation layer.

The functional layer that can be used for the layer to be separated is, for example, a layer including a functional circuit, a functional element, an optical element, an element, or a functional film or a layer including a plurality of components selected from these examples.

Specifically, examples of the organic material are polyimide, polyester, polyolefin, polyamide, polycarbonate, and an acrylic resin. In particular, polyimide is preferable because of its superiority in heat resistance over other materials. With polyimide, the thickness of the layer to be separated can be made large easily; accordingly, the mechanical strength of the layer to be separated can be increased.

Here, a case of using the separation layer 101b and the base film 102 that is in contact with the separation layer 101b will be described. Note that the base film 102 can be separated from the separation layer 101b in a later step (see FIG. 9A).

Specifically, a non-alkali glass and a film containing tungsten oxide are used as the substrate 101a and the separation layer 101b, respectively. Furthermore, a film containing silicon oxynitride is used as the base film 102.

The method that combines the film containing tungsten oxide with the film containing silicon oxynitride is superior in heat resistance to the method using an organic material such as polyimide as the separation layer or the layer to be separated. Thus, treatment that requires high temperatures can be employed in the formation step of the layer to be separated. As a result, the layer to be separated can have favorable quality or a high function.

A conductive film is formed over the base film 102 and patterned into predetermined island shapes to form a layer including the first conductive film 121.

Figure 9A:
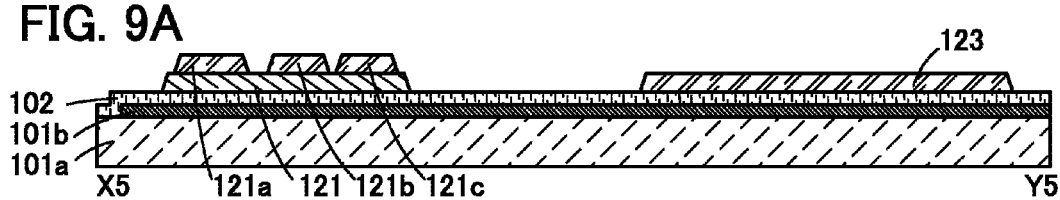
FIGS. 9A to 9F illustrate a manufacturing method of a touch sensor of an embodiment.

Next, another conductive film is formed and patterned into predetermined island shapes to form a layer including the conductive film 121a, the conductive film 121b, the conductive film 121c, and the third conductive film 123 (see (U1) in FIG. 8A, (U1) in FIG. 8B, and FIG. 9A).

The layer including the first conductive film 121 can be formed of a metal or the like. Note that in the step for forming the first conductive film 121, various wirings may be formed.

A material that does not easily cause a reduction in characteristics due to oxidation in the manufacturing process (e.g., lowering of the conductivity of the conductive film in contact with graphene oxide due to oxidization of the conductive film), such as a conductive metal oxide, can be used for the another conductive film. In particular, when using a light-transmitting conductive film, the touch sensor 400 with an excellent light-transmitting property can be manufactured.

Note that the conductive film can be formed by a sputtering method, a CVD method, or the like. The conductive film can be patterned into a predetermined shape by an etching method or the like.

<<Second Step>>

Figure 9B:
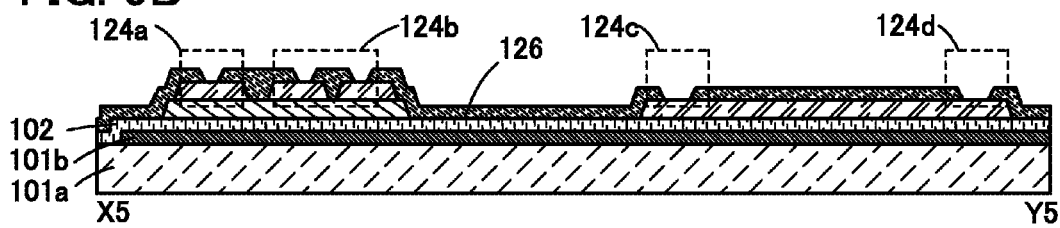

An insulating film is formed and patterned into a predetermined shape including the first opening 124a, the second opening 124b, the third opening 124c, and the fourth opening 124d to form the insulating film 126 (see (U2) in FIG. 8A, (U2) in FIG. 8B, and FIG. 9B).

Note that the insulating film can be formed by a sputtering method, a CVD method, or the like. The insulating film can be patterned into a predetermined shape by an etching method or the like.

<<Third Step>>

Figure 9C:
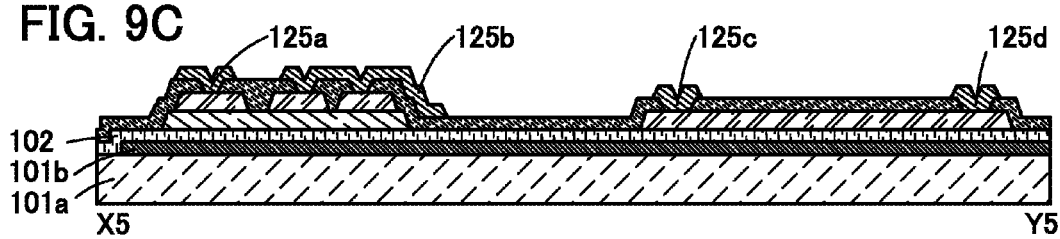

A conductive film is formed and patterned into predetermined island shapes to form a layer including the conductive film 125a electrically connected to the conductive film 121a, the conductive film 125b electrically connected to the conductive film 121b and the conductive film 121c, and the conductive film 125c and the conductive film 125d electrically connected to the third conductive film 123 (see (U3) in FIG. 8A, (U3) in FIG. 8B, and FIG. 9C).

In order not to cause disconnection of the film including graphene, which is to be formed in a later step, by steps at the end portions of the conductive films 125b, 125c, and 125d, the end portions of the conductive films 125b, 125c, and 125d are formed to have a gentle slope.

<<Fourth Step>>

A film including an excess amount of graphene oxide is formed.

For example, the film including an excess amount of graphene oxide is formed using the method described in the first step of Film formation method 1 in Embodiment 2.

<<Fifth Step>>

Figure 9D:
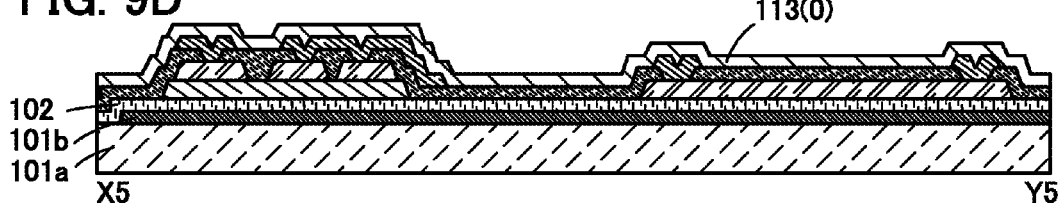

An excess of graphene oxide is removed to form an extremely thin film 113(0) including graphene oxide (see (U4) in FIG. 8A, (U4) in FIG. 8B, and FIG. 9D).

For example, the excess of graphene oxide is removed using the method described in the second step of Film formation method 1 in Embodiment 2.

As the formation method of the film including graphene oxide, the method described in the first step and the second step of Film formation method 2 in Embodiment 2 may be used. Specifically, the film 113(0) including graphene oxide illustrated in FIG. 9D can be made to have the structure like the stacked film 309 in FIG. 15C consisting of films including graphene oxide. More specifically, the step shown in (U4) in FIG. 8A can be replaced by the steps shown in (V1) in FIG. 15A and (V2) in FIG. 15A. Moreover, the step shown in (U4) in FIG. 8B can be replaced by the steps shown in (V1) in FIG. 15A and (V2) in FIG. 15A.

<<Sixth Step>>

The film 113(0) including graphene oxide is subjected to reducing treatment to form a film including graphene (see (U5) in FIG. 8A).

For example, graphene oxide is reduced using the method described in the third step of Film formation method 1 in Embodiment 2.

<<Seventh Step>>

Figure 9E:
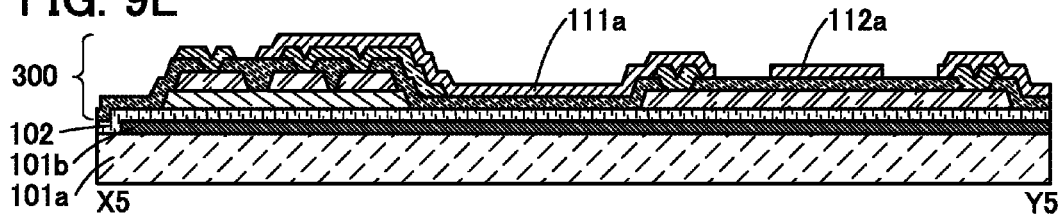

The piece 111*a* and the electrode 112*a* which are located apart from each other are formed from the film including graphene (see (U6) in FIG. 8A and FIG. 9E).

The piece 111*a* and the electrode 112*a* can be formed using any of a variety of methods for patterning the film including graphene into islands. For example, a photolithography technique can be used.

Specifically, a resist mask is formed so as to overlap with areas that are to remain in island shapes of the film including graphene, and an unnecessary portion is etched to form the island shapes. For example, as the etching treatment, ashing treatment in which irradiation with oxygen plasma is performed or the like can be used.

Alternatively, the sixth step and the seventh step can be reversed (see (U5) in FIG. 8B and (U6) in FIG. 8B). Specifically, after the film including graphene oxide is selectively removed and patterned into islands, graphene oxide included in the remaining film can be reduced.

Since graphene oxide is an oxide, its surface has many oxygen atoms. Accordingly, a surface of the film including graphene oxide has a higher hydrophilicity than that of the film including graphene. For this reason, when using a resist mask in a photolithography technique for example, the resist can be applied more evenly in the case of applying the resist on the surface of the film including graphene oxide before the reducing treatment than in the case of applying the resist on the surface of the film including graphene after the reducing treatment.

At the end of the seventh step, the element 300 is completed. Additional step described in Embodiment 3 can be performed here.

<<Eighth Step>>

Figure 9F:
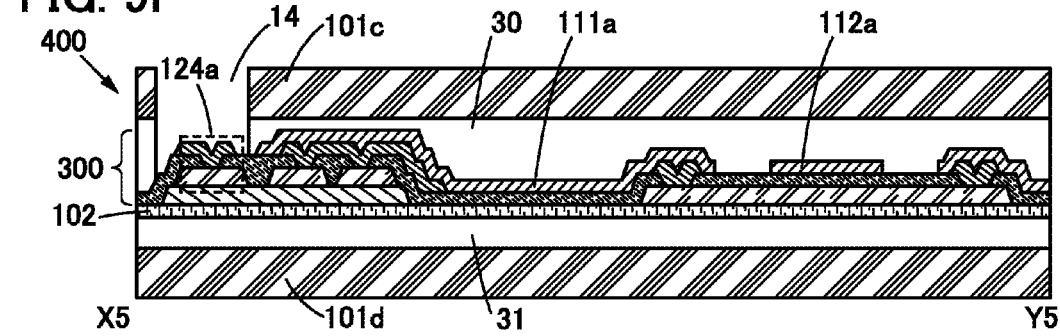

The layer to be separated including the element 300 is separated from the substrate 101*a* to which the separation layer 101*b* is attached, and transferred onto the substrate 101*d* having flexibility (see (U7) in FIG. 8A, (U7) in FIG. 8B, and FIG. 9F).

Details of the eighth step is described with reference to FIGS. 10A to 10I. FIGS. 10A to 10I schematically illustrate the layer to be separated including the element 300.

The top views of the layer to be separated including the element 300 are shown on the right side and the cross-sectional views along X6-Y6 are shown on the left side.

<<Eighth Step—1>>

Figure 10A:
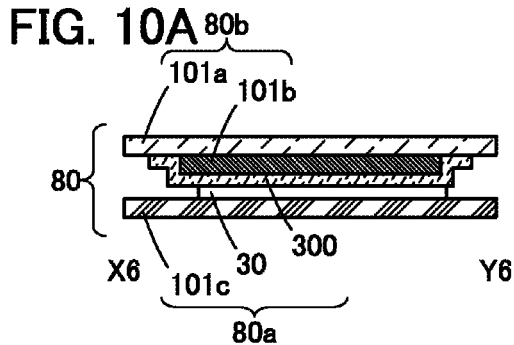
FIGS. 10A to 10I illustrate a method for separating a layer to be separated and transferring the layer onto a substrate according to an embodiment.
Figure 10B:
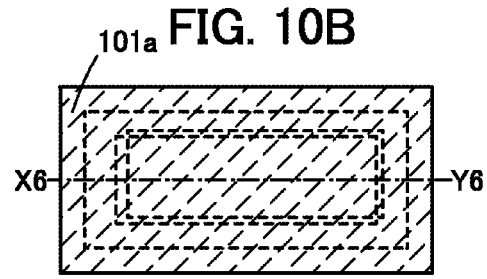

The layer to be separated including the element 300 is bonded to the substrate 101*c* having flexibility with the bonding layer 30 (see FIGS. 10A and 10B).

Note that the processing member 80 includes the substrate 101*a*, the separation layer 101*b* on the substrate 101*a*, the layer to be separated including the element 300 and having one surface in contact with the separation layer 101*b*, the bonding layer 30 having one surface in contact with the other surface of the layer to be separated including the element 300, and the substrate 101*c* having flexibility and being in contact with the other surface of the bonding layer 30.

<<Eighth Step—2>>

Figure 10C:
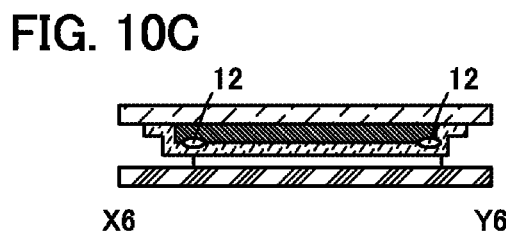
Figure 10D:
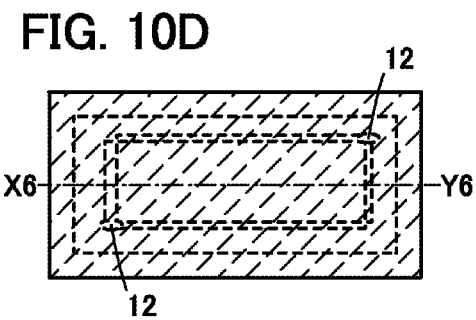
Figure 10E:
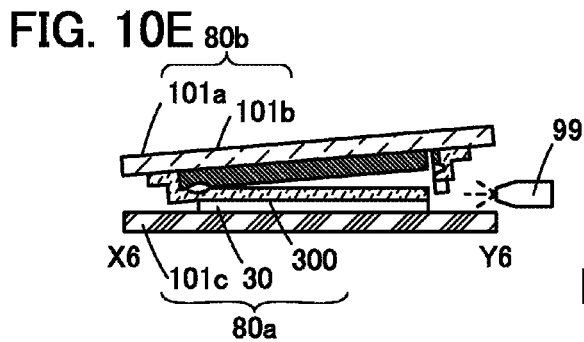
Figure 10G:
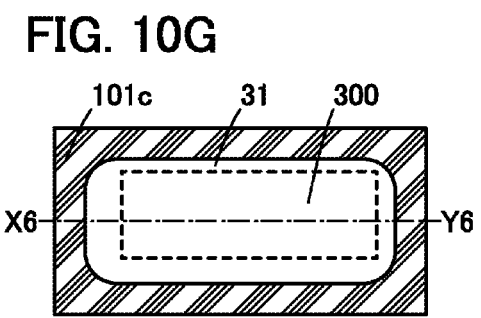
Figure 10F:
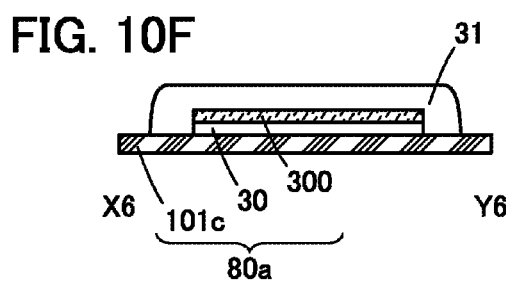
Figure 10I:
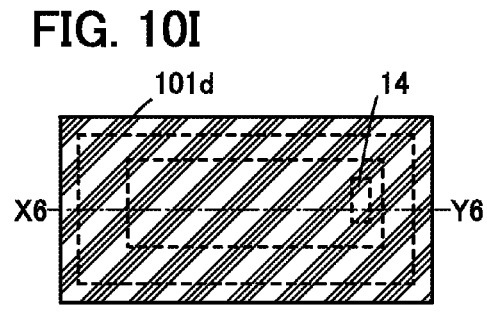
Figure 10H:
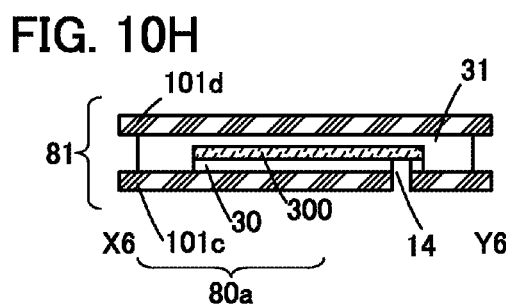

A separation trigger 12 is formed in the vicinity of the end portion of the bonding layer 30 (see FIGS. 10C and 10D). Note that the separation trigger 12 is formed by separating part of the element 300 from the separation layer 101*b*.

To form the separation trigger 12, part of the element 300 can be separated from the separation layer 101*b* by pricking the element 300 with a sharp tip or by using a noncontact method with a laser or the like (e.g., a laser ablation method).

<<Eighth Step—3>>

One surface layer 80*b* of the processing member 80 is separated. Specifically, the substrate 101*a* and the separation layer 101*b* are separated from the element 300, from the separation trigger 12 formed in the vicinity of the end portions of the bonding layer 30 (see FIG. 10E).

In separation of the element 300 from the separation layer 101*b*, a liquid is injected to an interface between the separation layer 101*b* and the element 300. Alternatively, the liquid may be ejected and sprayed from a nozzle 99. For example, as the injected or sprayed liquid, water, a polar solvent, or the like can be used. By injecting the liquid, an influence of static electricity and the like generated with the separation can be reduced. Alternatively, the separation may be performed while a liquid that dissolves the separation layer is injected.

In particular, in the case where a film containing tungsten oxide is used as the separation layer 101*b*, it is preferable that separation be performed while a liquid containing water is injected or sprayed because stress applied to the element in the layer to be separated due to the separation can be reduced.

By this step, a remaining portion 80*a* is obtained from the processing member 80. Specifically, the remaining portion 80*a* includes the element 300, the bonding layer 30 having the one surface in contact with the element 300, and the substrate 101*c* in contact with the other surface of the bonding layer 30.

<<Eighth Step—4>>

The adhesive layer 31 is formed over the remaining portion 80*a* (see FIGS. 10F and 10G), and the remaining portion 80*a* is bonded to the substrate 101*d* having flexibility with the adhesive layer 31.

By this step, a stack 81 is obtained from the remaining portion 80*a*. Specifically, the stack 81 includes the substrate 101*d* with flexibility, the adhesive layer 31, the separated layer including the element 300, the bonding layer 30 having the one surface in contact with the separated layer, and the substrate 101*c* having flexibility in contact with the other surface of the bonding layer 30 (see FIGS. 10H and 10I).

By a method in which part of the substrate 101*c* is removed and the exposed bonding layer 30 is dissolved or swelled to be physically removed, a window-like opening 14 reaching the element 300 can be formed, for example. Specifically, the opening 14 can be formed by the following method: a resin film in which an opening can be cut out, such as an aramid film, is used as the substrate 101*c*; an opening is cut out; the bonding layer 30, such as an epoxy resin, exposed from the opening is swelled with an organic solvent and removed.

By this method, the opening 14 that reaches a terminal portion provided in the element 300 can be formed. The touch sensor 400 can be connected to another device using the terminal portion exposed from the opening 14.

<Touch Sensor Manufacturing Method 2>

A manufacturing method of the touch sensor 400B of one embodiment of the present invention will be described with reference to FIG. 29 and FIGS. 30A to 30C.

Figure 29:
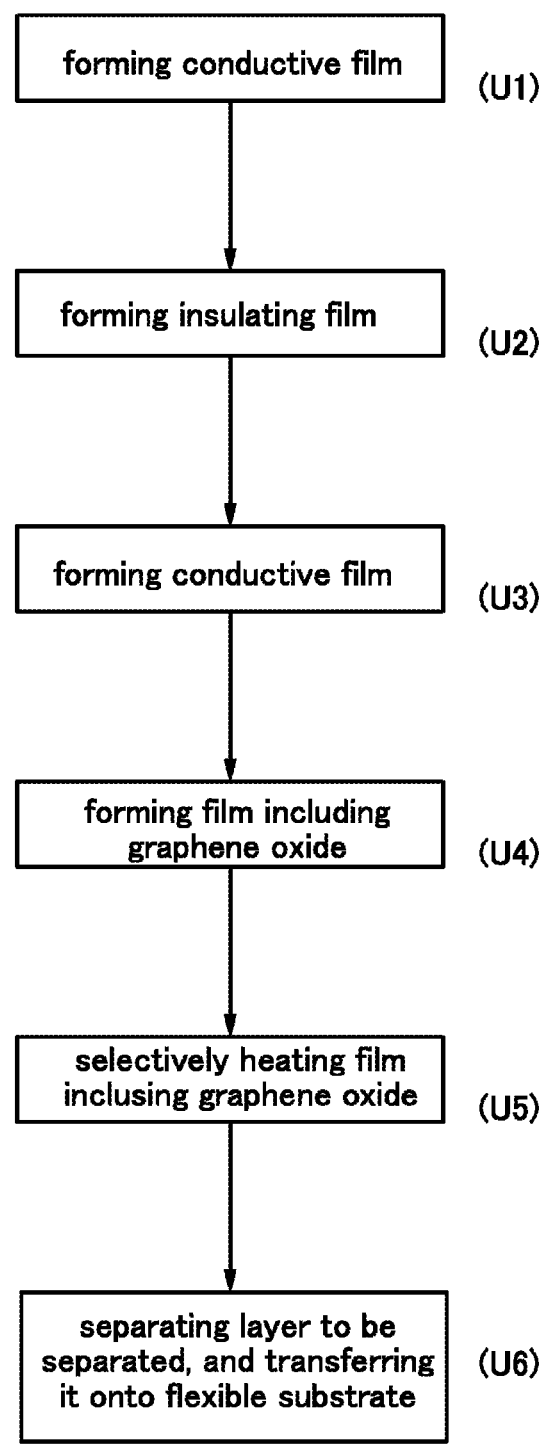
FIG. 29 is a flow chart showing a manufacturing method of a touch sensor of an embodiment.

FIG. 29 is a flow chart showing the manufacturing method of the touch sensor 400B.

Figure 30A:
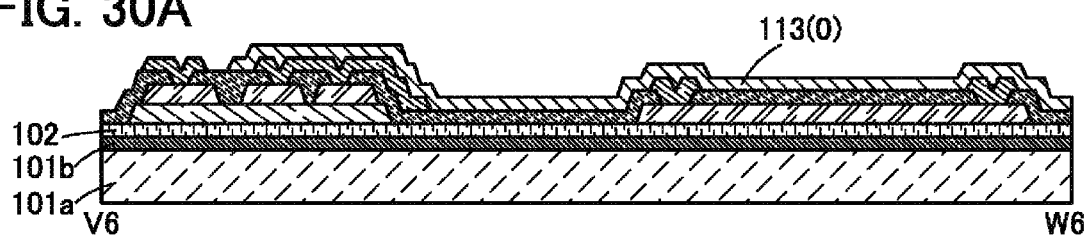
FIGS. 30A to 30C illustrate a manufacturing method of a touch sensor of an embodiment.
Figure 30B:
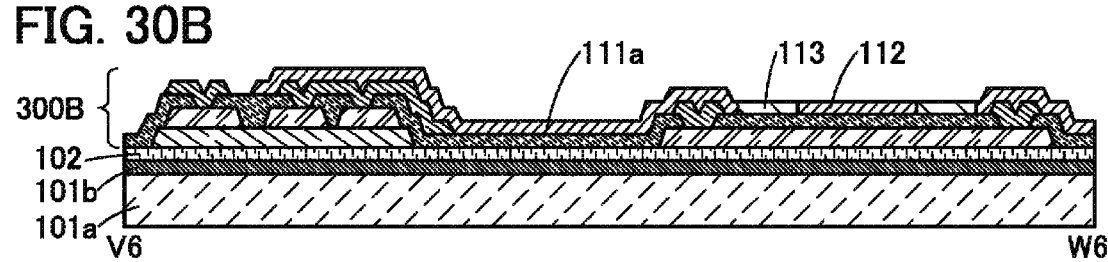
Figure 30C:
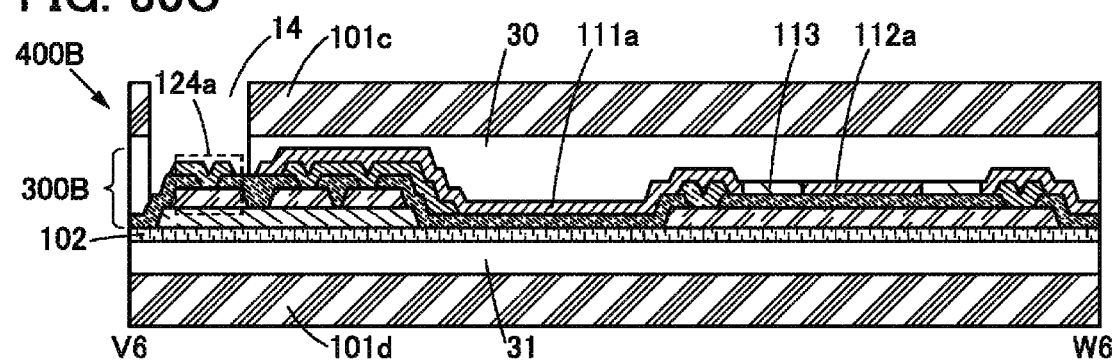

FIGS. 30A to 30C are cross-sectional views each illustrating the structure after a step in the manufacturing method of the touch sensor 400B has finished.

The manufacturing method of the touch sensor 400B of one embodiment of the present invention is different from the manufacturing method of the touch sensor 400 described with reference to FIGS. 8A and 8B in selectively heating the film including graphene oxide in the fifth step. Different steps will be described in detail below, and the above description is referred to for the other similar steps.

<<Fourth Step>>

The film 113(0) including graphene oxide that covers the conductive film 125b and the conductive film 125c is formed (see (U4) in FIG. 29 and FIG. 30A).

For example, the film 113(0) including graphene oxide is formed using the method described in the first step of Film formation method 3 in Embodiment 2.

<<Fifth Step>>

The film 113(0) including graphene oxide in at least a region overlapping with the conductive film 125b and a region not overlapping with the conductive film 125b is selectively heated, so that the piece 111a including graphene, the second electrode 112 including graphene, and the divider 113 including graphene oxide between the piece 111a and the second electrode 112 are formed (see (U5) in FIG. 29 and FIG. 30B).

For example, the film including graphene oxide is selectively heated using the method described in the second step in Film formation method 3 of Embodiment 2 to form the piece 111a and the second electrode 112.

At the end of the fifth step, the element 300B is completed.

<<Sixth Step>>

The layer to be separated including the element 300B is separated from the substrate 101a to which the separation layer 101b is attached, and transferred onto the substrate 101d having flexibility (see (U6) in FIG. 29 and FIG. 30C).

Since the sixth step can be performed in a manner similar to that of the eighth step of Touch sensor manufacturing method 1, the above description can be referred to.

This embodiment can be combined as appropriate with any of the other embodiments and examples of this specification.

Embodiment 5

In this embodiment, a structure of a foldable touch panel that includes the element of one embodiment of the present invention will be described with reference to FIGS. 11A and 11B and FIGS. 12A to 12C.

Figure 11A:
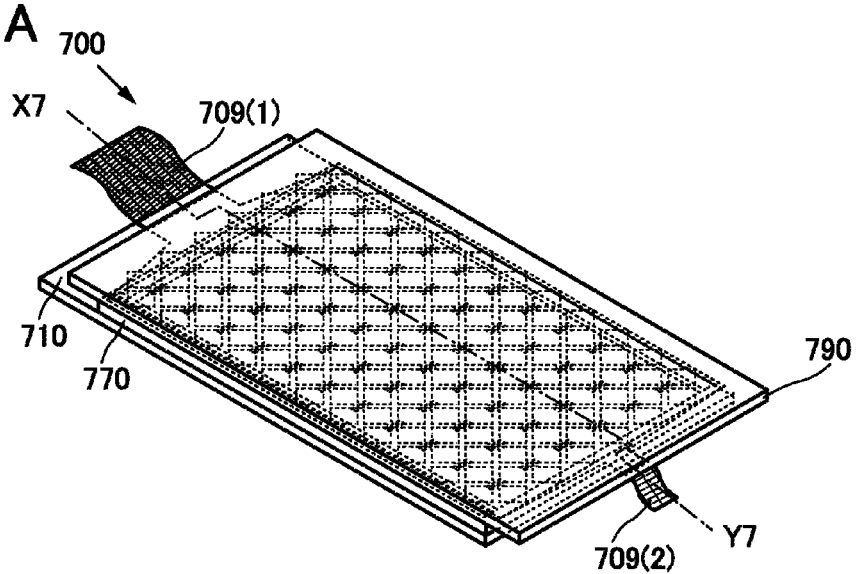
FIGS. 11A and 11B illustrate a structure of a touch panel that can be used in a data processing device of an embodiment.
Figure 11B:
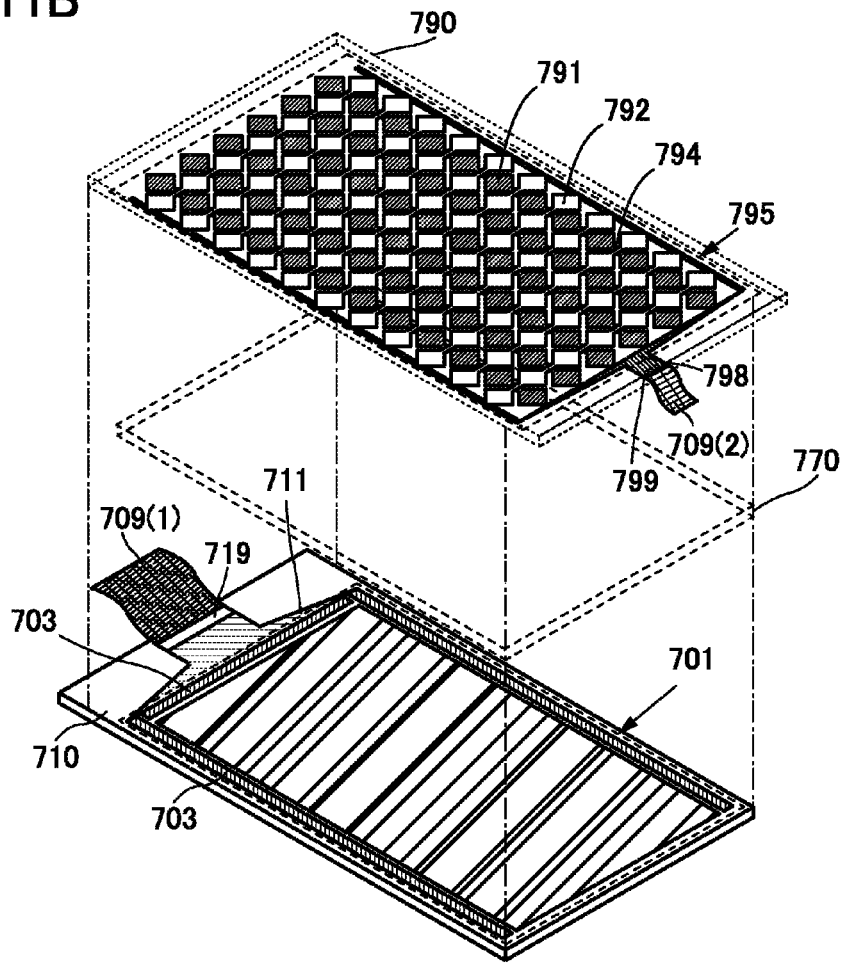

FIG. 11A is a perspective view of a touch panel 700 described in this embodiment as an example. Note that FIGS. 11A and 11B illustrate typical components for simplicity. FIG. 11B is a perspective view of the touch panel 700.

Figure 12A:
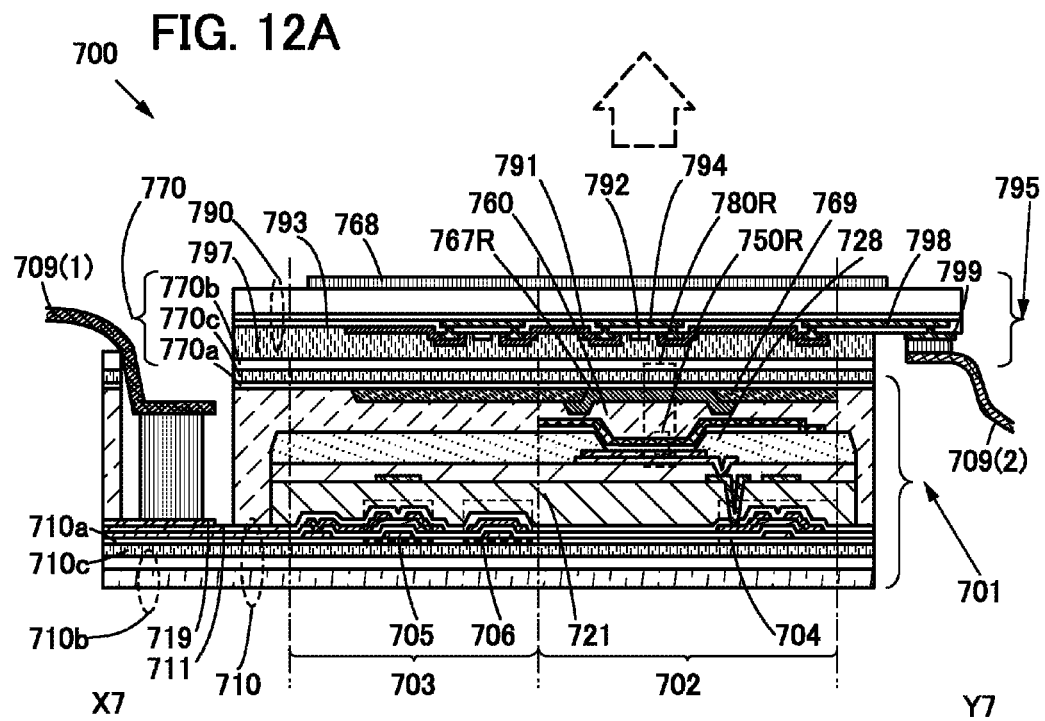
FIGS. 12A to 12C illustrate structures of a touch panel that can be used in a data processing device of an embodiment.

FIG. 12A is a cross-sectional view of the touch panel 700 taken along line X7-Y7 in FIG. 11A.

The touch panel 700 includes a display portion 701 and a touch sensor 795 (see FIG. 11B). Furthermore, the touch panel 700 includes a substrate 710, a substrate 770, and a substrate 790. Note that the substrate 710, the substrate 770, and the substrate 790 each have flexibility.

The display portion 701 includes the substrate 710, a plurality of pixels over the substrate 710, and a plurality of wirings 711 through which signals are supplied to the pixels. The plurality of wirings 711 are led to a peripheral portion of the substrate 710, and part of the plurality of wirings 711 forms a terminal 719. The terminal 719 is electrically connected to an FPC 709(1).

<Touch Sensor>

The substrate 790 includes the touch sensor 795 and a plurality of wirings 798 electrically connected to the touch sensor 795. The plurality of wirings 798 are led to a peripheral portion of the substrate 790, and part of the plurality of wirings 798 forms a terminal. The terminal is electrically connected to an FPC 709(2). Note that in FIG. 11B, electrodes, wirings, and the like of the touch sensor 795 provided on the back side of the substrate 790 (the side facing the substrate 790) are indicated by solid lines for clarity.

As the touch sensor 795, a capacitive touch sensor can be used, for example. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive touch sensor is preferable because multiple points can be sensed simultaneously.

An example of using a projected capacitive touch sensor will be described below with reference to FIG. 11B.

Note that a variety of sensors that can sense the closeness or the contact of a sensing target such as a finger, can be used.

The projected capacitive touch sensor 795 includes electrodes 791 and electrodes 792. The electrodes 791 are electrically connected to any of the plurality of wirings 798, and the electrodes 792 are electrically connected to any of the other wirings 798.

The electrodes 792 each have a shape of a plurality of quadrangles arranged in one direction with one corner of a quadrangle connected to one corner of another quadrangle as illustrated in FIGS. 11A and 11B.

A plurality of electrodes 791 each have a quadrangular shape and are arranged in a direction intersecting with the direction in which the electrodes 792 extend.

A wiring 794 electrically connects two electrodes 791 between which the electrode 792 is positioned. The intersecting area of the electrode 792 and the wiring 794 is preferably as small as possible. Such a structure allows a reduction in the area of a region where the electrodes are not provided, reducing unevenness in transmittance. As a result, unevenness in luminance of light from the touch sensor 795 can be reduced.

Note that the shapes of the electrodes 791 and the electrodes 792 are not limited to the above-mentioned shapes and can be any of a variety of shapes. For example, the plurality of electrodes 791 may be provided so that space between the electrodes 791 are reduced as much as possible, and a plurality of electrodes 792 may be provided with an insulating film sandwiched between the electrodes 791 and the electrodes 792 and may be spaced apart from each other to form a region not overlapping with the electrodes 791. In that case, between two adjacent electrodes 792, it is preferable to provide a dummy electrode which is electrically insulated from these electrodes, whereby the area of a region having a different transmittance can be reduced.

A structure of the touch sensor 795 will be described with reference to FIGS. 12A to 12C.

The touch sensor 795 includes the substrate 790, the electrodes 791 and the electrodes 792 provided in a staggered arrangement on the substrate 790, an insulating film 793, and the wiring 794 that electrically connects the adjacent electrodes 791 to each other.

A resin layer 797 attaches the substrate 790 to the substrate 770 so that the touch sensor 795 overlaps with the display portion 701.

The electrodes 791 and the electrodes 792 are formed using a light-transmitting conductive material. As the light-transmitting conductive material, a film including graphene may be used. The film including graphene can be formed, for example, by reducing a film including graphene oxide. As a reducing method, a method with application of heat or the like can be employed.

The electrodes 791 and the electrodes 792 may be formed by removing an unnecessary portion by any of various patterning techniques such as photolithography.

Examples of a material for the insulating film 793 are a resin such as acrylic or epoxy resin, a resin having a siloxane bond, and an inorganic insulating material such as silicon oxide, silicon oxynitride, or aluminum oxide.

Furthermore, openings reaching the electrodes 791 are formed in the insulating film 793, and the wiring 794 electrically connects the adjacent electrodes 791. A light-transmitting conductive material can be favorably used as the wiring 794 because the aperture ratio of the touch panel can be increased. Moreover, a material with higher conductivity than the conductivities of the electrodes 791 and 792 can be favorably used because electric resistance can be reduced.

One electrode 792 extends in one direction, and a plurality of electrodes 792 are provided in the form of stripes.

The wiring 794 intersects with the electrode 792.

Adjacent electrodes 791 are provided with one electrode 792 provided therebetween. The wiring 794 electrically connects the adjacent electrodes 791.

Note that the plurality of electrodes 791 are not necessarily arranged in the direction orthogonal to one electrode 792 and may be arranged to intersect with one electrode 792 at an angle of less than 90 degrees.

One wiring 798 is electrically connected to any of the electrodes 791 and 792. Part of the wiring 798 serves as a terminal. For the wiring 798, a metal material such as aluminum, gold, platinum, silver, nickel, titanium, tungsten, chromium, molybdenum, iron, cobalt, copper, or palladium or an alloy material containing any of these metal materials can be used.

Note that an insulating film that covers the insulating film 793 and the wiring 794 may be provided to protect the touch sensor 795.

Furthermore, a connection layer 799 electrically connects the wiring 798 to the FPC 709(2).

As the connection layer 799, any of various anisotropic conductive films (ACF), anisotropic conductive pastes (ACP), or the like can be used.

The resin layer 797 has a light-transmitting property. For example, a thermosetting resin or an ultraviolet curable resin can be used; specifically, a resin such as acrylic resin, urethane resin, epoxy resin, or a resin having a siloxane bond can be used.

<Display Portion>

The display portion 701 includes a plurality of pixels arranged in a matrix. Each of the pixels includes a display element and a pixel circuit for driving the display element.

In this embodiment, an example of using an organic electroluminescent element that emits white light as a display element will be described; however, the display element is not limited to such element.

For example, organic electroluminescent elements that emit light of different colors may be included in sub-pixels so that the light of different colors can be emitted from the respective sub-pixels.

Other than organic electroluminescent elements, any of various display elements such as display elements (electronic ink) that perform display by an electrophoretic method, an electronic liquid powder method, an electrowetting method, or the like; MEMS shutter display elements; optical interference type MEMS display elements; and liquid crystal elements can be used. Furthermore, this embodiment can be used in a transmissive liquid crystal display, a transflective liquid crystal display, a reflective liquid crystal display, a direct-view liquid crystal display, or the like. A structure suitable for employed display elements can be selected from among a variety of structures of pixel circuits. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

In the display portion, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since these elements can be formed with a smaller number of manufacturing steps, manufacturing cost can be reduced or yield can be improved. Furthermore, since the size of these elements is small, the aperture ratio can be improved, so that power consumption can be reduced or higher luminance can be achieved.

As a method other than an active matrix method, a passive matrix method in which an active element (a non-linear element) is not used can also be used. Since an active element (a non-linear element) is not used, the number of manufacturing steps is small, so that manufacturing cost can be reduced or yield can be improved. Furthermore, since an active element (a non-linear element) is not used, the aperture ratio can be improved, so that power consumption can be reduced or higher luminance can be achieved, for example.

Flexible materials can be favorably used in the substrate 710 and the substrate 770.

Materials with which unintended passage of impurities is inhibited can be favorably used in the substrate 710 and the substrate 770. For example, materials with a vapor permeability of lower than or equal to $10^{-5}$ g/m$^2$·day, preferably lower than or equal to $10^{-6}$ g/m$^2$·day can be favorably used.

The substrate 710 can be favorably formed using a material whose coefficient of linear expansion is substantially equal to that of the substrate 770. For example, the coefficient of linear expansion of the materials are preferably lower than or equal to $1 \times 10^{-3}$/K, further preferably lower than or equal to $5 \times 10^{-5}$/K, and still further preferably lower than or equal to $1 \times 10^{-5}$/K.

The substrate 710 is a stacked body in which a flexible substrate 710b, a barrier film 710a that prevents diffusion of impurities to light-emitting elements, and a resin layer 710c that attaches the barrier film 710a to the substrate 710b are stacked.

For example, materials that include polyester, polyolefin, polyamide (e.g., nylon, aramid), polyimide, polycarbonate, acrylic resin, urethane resin, epoxy resin, or a resin having a siloxane bond can be used for the resin layer 710c.

The substrate 770 is a stacked body in which a flexible substrate 770b, a barrier film 770a that prevents diffusion of impurities to the light-emitting elements, and a resin layer 770c that attaches the barrier film 770a to the substrate 770b are stacked.

A sealant 760 attaches the substrate 770 to the substrate 710. The sealant 760 has a refractive index higher than that of air. In the case of extracting light to the sealant 760 side, the sealant 760 serves as an optical adhesive layer. The pixel circuits and the light-emitting elements (e.g., a first light-emitting element 750R) are provided between the substrate 710 and the substrate 770.

<<Pixel Structure>>

A pixel includes a sub-pixel 702, and the sub-pixel 702 includes a light-emitting module 780R.

The sub-pixel 702 includes the first light-emitting element 750R and the pixel circuit that can supply electric power to the first light-emitting element 750R and includes a transistor 704. Furthermore, the light-emitting module 780R includes the first light-emitting element 750R and an optical element (e.g., a first coloring layer 767R).

The first light-emitting element 750R includes a lower electrode, an upper electrode, and a layer containing a light-emitting organic compound between the lower electrode and the upper electrode.

The light-emitting module 780R includes the first coloring layer 767R on the light extraction side. The coloring layer transmits light of a particular wavelength and is, for example, a layer that selectively transmits light of red, green, or blue color. Note that in another sub-pixel, a region that transmits light emitted from the light-emitting element as it is may be provided as well.

In the case where the sealant 760 is provided on the light extraction side, the sealant 760 is in contact with the first light-emitting element 750R and the first coloring layer 767R.

The first coloring layer 767R is positioned in a region overlapping with the first light-emitting element 750R. Accordingly, part of light emitted from the first light-emitting element 750R passes through the first coloring layer 767R and is emitted to the outside of the light-emitting module 780R in the direction indicated by an arrow in FIG. 12A.

<<Structure of Display Portion>>

The display portion 701 includes a light-blocking layer 769 on the light extraction side. The light-blocking layer 769 is provided so as to surround the coloring layer (e.g., the first coloring layer 767R).

The display portion 701 includes an anti-reflective layer 768 positioned in a region overlapping with pixels. As the anti-reflective layer 768, a circular polarizing plate can be used, for example.

The display portion 701 includes an insulating film 721. The insulating film 721 covers the transistor 704. Note that the insulating film 721 can be used as a layer for planarizing unevenness caused by the pixel circuits. A stacked film including a layer that can prevent diffusion of impurities can be used as the insulating film 721. This can prevent the reliability of the transistor 704 or the like from being lowered by diffusion of impurities.

The display portion 701 includes the light-emitting elements (e.g., the first light-emitting element 750R) over the insulating film 721.

The display portion 701 includes, over the insulating film 721, a partition wall 728 that overlaps with an end portion of a first lower electrode. In addition, a spacer that controls the distance between the substrate 710 and the substrate 770 is provided on the partition wall 728.

<<Structure of Driver Circuit>>

A driver circuit 703 includes a transistor 705 and a capacitor 706. Note that the driver circuit can be formed in the same process and over the same substrate as those of the pixel circuits.

<<Other Structures>>

The display portion 701 includes the wirings 711 through which signals can be supplied. The wirings 711 are provided with the terminal 719. Note that the FPC 709(1) through which a signal such as an image signal or a synchronization signal can be supplied is electrically connected to the terminal 719.

Note that a printed wiring board (PWB) may be attached to the FPC 709(1).

The display portion 701 includes wirings such as scan lines, signal lines, and power supply lines. Any of various conductive films can be used as the wirings.

Specifically, a metal element selected from aluminum, chromium, copper, tantalum, titanium, molybdenum, tungsten, nickel, yttrium, zirconium, silver, and manganese; an alloy including any of the above-described metal elements, an alloy including any of the above-described metal elements in combination; or the like can be used. In particular, one or more elements selected from aluminum, chromium, copper, tantalum, titanium, molybdenum, and tungsten are preferably included. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Specifically, a stacked structure in which an alloy film or a nitride film which contains one or more elements selected from titanium, tantalum, tungsten, molybdenum, chromium, neodymium, and scandium is stacked over an aluminum film can be used.

Alternatively, a light-transmitting conductive material including indium oxide, tin oxide, or zinc oxide may be used. Specifically, indium tin oxide containing silicon oxide, indium tin oxide, zinc oxide, indium zinc oxide, zinc oxide to which gallium is added, or the like can be used.

<Modification Example 1 of Display Portion>

Any of various kinds of transistors can be used in the display portion 701.

Figure 12B:
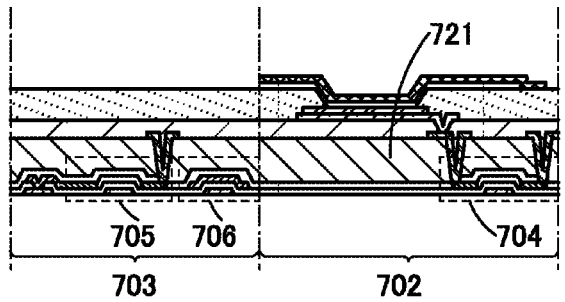

A structure in the case of using bottom-gate transistors in the display portion 701 is illustrated in FIGS. 12A and 12B.

For example, a semiconductor layer containing an oxide semiconductor, amorphous silicon, or the like can be used in the transistor 704 and the transistor 705 illustrated in FIG. 12A.

For example, a film represented by an In-M-Zn oxide that contains at least indium (In), zinc (Zn), and M (M is a metal such as Al, Ga, Ge, Y, Zr, Sn, La, Ce, or Hf) is preferably included. Moreover, both In and Zn are preferably contained.

As a stabilizer, gallium (Ga), tin (Sn), hafnium (Hf), aluminum (Al), zirconium (Zr), or the like can be used. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be used.

As an oxide semiconductor included in an oxide semiconductor film, any of the followings can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, and an In—Ga-based oxide.

Note that here, for example, an "In—Ga—Zn-based oxide" means an oxide containing In, Ga, and Zn as its main components and there is no limitation on the ratio of In:Ga:Zn. The In—Ga—Z-based oxide may contain another metal element in addition to In, Ga, and Zn.

For example, a semiconductor layer containing polycrystalline silicon that is obtained by crystallization process such as laser annealing can be used in the transistor 704 and the transistor 705 illustrated in FIG. 12B.

Figure 12C:
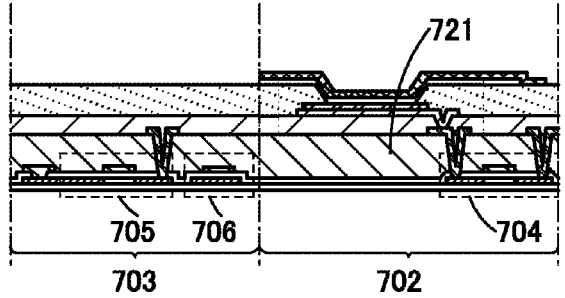

A structure in the case of using top-gate transistors in the display portion 701 is illustrated in FIG. 12C.

For example, a semiconductor layer including polycrystalline silicon, a single crystal silicon film that is transferred from a single crystal silicon substrate, or the like can be used in the transistor 704 and the transistor 705 illustrated in FIG. 12C.

This embodiment can be combined as appropriate with any of the other embodiments and examples of this specification.

Embodiment 6

In this embodiment, a structure of a foldable touch panel that includes the element of one embodiment of the present invention will be described with reference to FIGS. 13A to 13C.

Figure 13A:
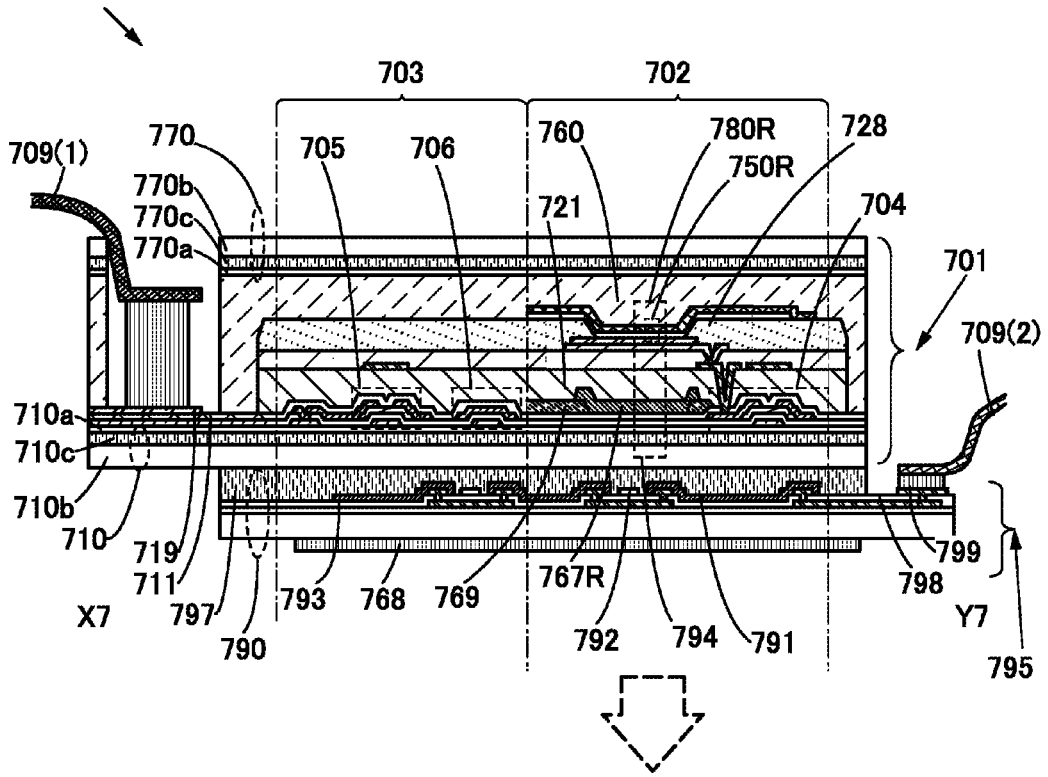
FIGS. 13A to 13C illustrate structures of a touch panel that can be used in a data processing device of one embodiment.
Figure 13B:
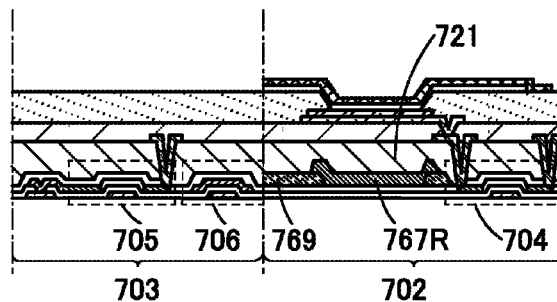
Figure 13C:
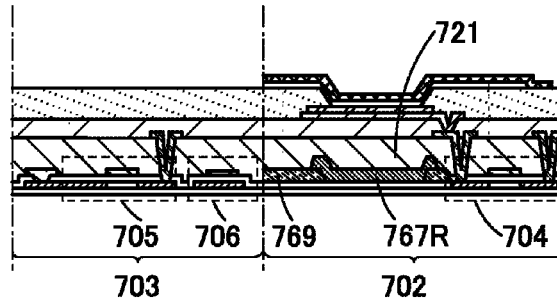

FIGS. 13A to 13C are cross-sectional views of a touch panel 800.

The touch panel 800 described in this embodiment is different from the touch panel 700 described in Embodiment 5 in that the display portion 701 displays received image data to the side where the transistors are provided and that the touch sensor is provided on the substrate 710 side of the display portion. Here, such different structures will be described in detail, and the above description is referred to for the other similar structures.

<Display Portion>

The display portion 701 includes a plurality of pixels arranged in a matrix. Each of the pixels includes a display element and a pixel circuit for driving the display element.

<<Pixel Structure>>

A pixel includes the sub-pixel 702, and the sub-pixel 702 includes a light-emitting module 780R.

The sub-pixel 702 includes the first light-emitting element 750R and the pixel circuit that can supply electric power to the first light-emitting element 750R and includes the transistor 704.

The light-emitting module 780R includes the first light-emitting element 750R and an optical element (e.g., the first coloring layer 767R).

The first light-emitting element 750R includes a lower electrode, an upper electrode, and a layer containing a light-emitting organic compound between the lower electrode and the upper electrode.

The light-emitting module 780R includes the first coloring layer 767R on the light extraction side. The coloring layer transmits light of a particular wavelength and is, for example, a layer that selectively transmits light of red, green, or blue color. Note that in another sub-pixel, a region that transmits light emitted from the light-emitting element as it is may be provided as well.

The first coloring layer 767R is positioned in a region overlapping with the first light-emitting element 750R. The first light-emitting element 750R illustrated in FIG. 13A emits light to the side where the transistor 704 is provided. Accordingly, part of light emitted from the first light-emitting element 750R passes through the first coloring layer 767R and is emitted to the outside of the light-emitting module 780R in the direction indicated by an arrow in FIG. 13A.

<<Structure of Display Portion>>

The display portion 701 includes a light-blocking layer 769 on the light extraction side. The light-blocking layer 769 is provided so as to surround the coloring layer (e.g., the first coloring layer 767R).

The display portion 701 includes an insulating film 721. The insulating film 721 covers the transistor 704. Note that the insulating film 721 can be used as a layer for planarizing unevenness caused by the pixel circuits. A stacked film including a layer that can prevent diffusion of impurities can be used as the insulating film 721. This can prevent reliability of the transistor 704 or the like from being lowered by diffusion of impurities from the first coloring layer 767R.

<Touch Sensor>

The touch sensor 795 is provided on the substrate 710 side of the display portion 701 (see FIG. 13A).

The resin layer 797 is provided between the substrate 710 and the substrate 790 and attaches the touch sensor 795 to the display portion 701.

<Modification Example 1 of Display Portion>

Any of various kinds of transistors can be used in the display portion 701.

A structure in the case of using bottom-gate transistors in the display portion 701 is illustrated in FIGS. 13A and 13B.

For example, a semiconductor layer containing an oxide semiconductor, amorphous silicon, or the like can be used in the transistor 704 and the transistor 705 illustrated in FIG. 13A. In the transistors, a channel formation region may be sandwiched between upper and lower gate electrodes, in which case variations in characteristics of the transistors can be prevented and thus the reliability can be increased.

For example, a semiconductor layer containing polycrystalline silicon or the like can be used in the transistor 704 and the transistor 705 illustrated in FIG. 13B.

A structure in the case of using top-gate transistors in the display portion 701 is illustrated in FIG. 13C.

For example, a semiconductor layer including polycrystalline silicon, a transferred single crystal silicon film, or the like can be used in the transistor 704 and the transistor 705 illustrated in FIG. 13C.

This embodiment can be combined as appropriate with any of the other embodiments and examples of this specification.

Embodiment 7

In this embodiment, a data processing device including a bendable touch panel that uses an element of one embodiment of the present invention will be described with reference to FIGS. 14A to 14G.

FIGS. 14A to 14G illustrate a data processing device of one embodiment of the present invention.

Figure 14A:
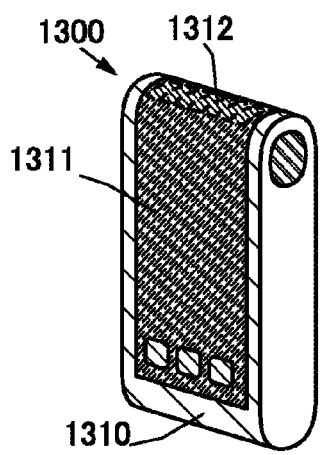
FIGS. 14A to 14G each illustrate a data processing device of an embodiment.
Figure 14B:
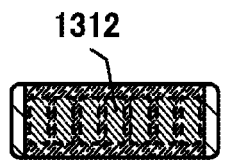
Figure 14C:
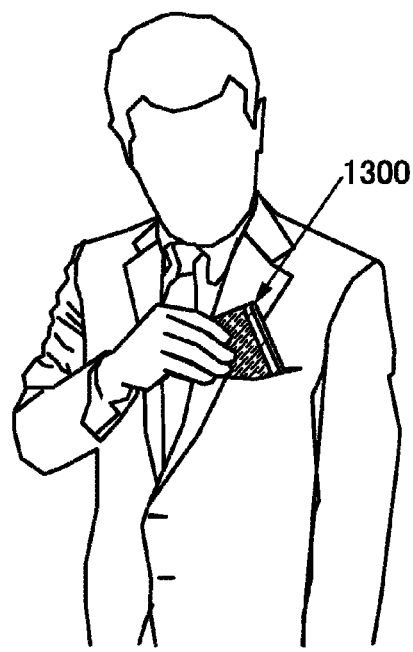

FIG. 14A is a perspective view illustrating an external shape of a portable data processing device 1300. FIG. 14B is a top view of the portable data processing device 1300. FIG. 14C illustrates a usage state of the portable data processing device 1300.

Figure 14D:
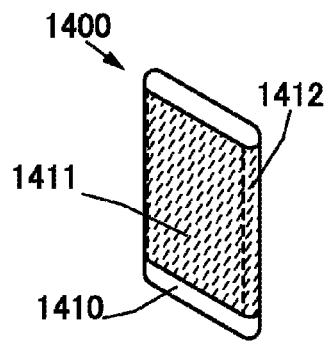
Figure 14E:
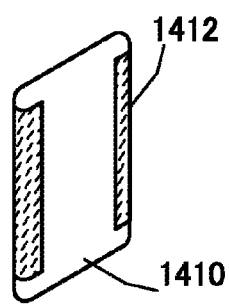

FIGS. 14D and 14E are perspective views illustrating an external shape of a portable data processing device 1400.

Figure 14F:
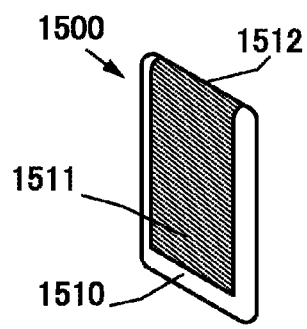
Figure 14G:
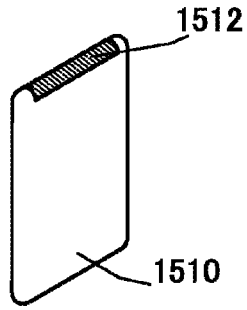

FIGS. 14F and 14G are perspective views illustrating an external shape of a portable data processing device 1500.

<Portable Data Processing Device>

The portable data processing device 1300 serves one or more functions of a telephone set, an e-mail creation and viewing device, a notebook, an information browsing system, and the like, for example. Specifically, the portable data processing device 1300 can be used as a cellular phone or a smartphone.

An input/output device is provided along a plurality of sides of a housing 1310. For example, the input/output device having flexibility is placed along the inner sides of the housing. With this structure, character information, image information, and the like can be displayed on a first region 1311 and/or a second region 1312.

For example, images used for three operations can be displayed on the first region 1311 (see FIG. 14A). Furthermore, character information and the like can be displayed on the second region 1312 as indicated by dashed rectangles in the drawing (see FIG. 14B).

In a case where the second region 1312 is on the upper portion of the portable data processing device 1300, a user can easily see character or image information displayed on the second region 1312 of the portable data processing device 1300 while the portable data processing device 1300 is placed in a breast pocket of the user's clothes (see FIG. 14C). For example, the user can see the phone number, name, and the like of the caller of an incoming call, from above the portable data processing device 1300.

Note that the portable data processing device 1300 can be provided with a vibration sensor or the like and a memory device that stores a program for shifting a mode into an incoming call rejection mode based on vibration sensed by the vibration sensor or the like. Thus, the user can shift the mode into the incoming call rejection mode by tapping the portable data processing device 1300 over his/her clothes to apply vibration.

<Portable Data Processing Device>

The portable data processing device 1400 includes an input/output unit having a first region 1411 and a second region 1412, and a housing 1410 that supports the input/output unit.

The housing 1410 has a plurality of bend portions, and the longest bend portion in the housing 1410 is between the first region 1411 and the second region 1412.

The portable data processing device 1400 can be used with the second region 1412 provided along the longest bend portion facing sideward.

<Portable Data Processing Device>

The portable data processing device 1500 includes an input/output unit having a first region 1511 and a second region 1512, and a housing 1510 that supports the input/output unit.

The housing 1510 has a plurality of bend portions, and the second longest bend portion in the housing 1510 is between the first region 1511 and the second region 1512.

The portable data processing device 1500 can be used with the second region 1512 facing upward.

This embodiment can be combined as appropriate with any of the other embodiments and examples of this specification.

Example 1

In this example, the film including graphene was formed and an element including the film including graphene was formed. The results are described below.

A glass substrate was used as the substrate. A conductive film formed of tungsten with a thickness of approximately 200 nm was formed over the glass substrate. The conductive film corresponds to the first conductive film 121 illustrated in FIG. 9A, for example. Next, a conductive film formed of indium tin oxide containing silicon oxide with a thickness of approximately 220 nm was formed. The conductive film corresponds to the conductive film 121a, the conductive film 121b, the conductive film 121c, and the third conductive film 123 illustrated in FIG. 9A, for example. Next, a stacked film including an insulating film of silicon oxynitride with a thickness of approximately 500 nm and an insulating film of silicon nitride with a thickness of approximately 100 nm was formed. The stacked film corresponds to the insulating film 126 illustrated in FIG. 9B, for example. Then, a conductive film of indium tin oxide containing silicon oxide with a thickness of approximately 220 nm was formed. The conductive film corresponds to the conductive film 125a, the conductive film 125b, the conductive film 125c, and the conductive film 125d illustrated in FIG. 9C, for example.

Next, treatment for increasing the hydrophilicity of a surface of the substrate was performed by irradiating the substrate surface over which the insulating films and the conductive films were formed with oxygen plasma. Specifically, oxygen plasma irradiation was performed at an oxygen flow rate of 100 sccm, a pressure of 500 mTorr, a power of 500 W for 40 seconds. According to the experiment by the present inventors, when the hydrophilicity of the substrate surface is too high, even if a dispersion liquid in which graphene oxide is dispersed looks to be applied evenly at a first glance, the film including graphene oxide might be uneven after removing dispersion medium from the dispersion liquid applied onto the substrate. Therefore, after the treatment for increasing the hydrophilicity of the substrate surface, treatment for slightly decreasing the hydrophilicity of the substrate surface was performed. Specifically as the treatment for slightly decreasing the hydrophilicity, a resist was formed over the substrate surface and then separated. After that, the substrate was washed with a rinse liquid, isopropyl alcohol, and pure water.

Next, a dispersion liquid in which graphene oxide was dispersed was applied over the substrate surface. The solvent of the dispersion liquid was water, and the concentration of graphene oxide was 0.86 wt %. Specifically, a blade as illustrated in FIG. 15B was used, the distance between the substrate surface and the blade was set extremely small in such an extent that the blade did not touch the substrate surface, and the dispersion liquid was applied extremely thin over the substrate. Specifically, the blade was positioned so that the distance between the substrate surface and the blade was 10 µm or less, and the dispersion liquid was applied extremely thin over the substrate.

Next, a treatment for removing the dispersion medium from the applied dispersion liquid in which graphene oxide was dispersed was performed, so that the film including graphene oxide was formed over the substrate. Specifically, using a forced-air dryer, drying treatment was performed at approximately 95° C. for 10 minutes.

Next, the above-described step was performed three more times, so that a stacked film in which four films including graphene oxide were stacked was formed. Note that in forming the second film including graphene oxide from the glass substrate side, the position of the blade was set 15 µm higher than the position of the blade for forming the first film including graphene oxide. Furthermore, in forming the third film including graphene oxide, the position of the blade was set 5 µm higher than the position of the blade for forming the second film including graphene oxide. Moreover, in forming the fourth film including graphene oxide, the position of the blade was set 5 µm higher than the position of the blade for forming the third film including graphene oxide.

Figure 16A:
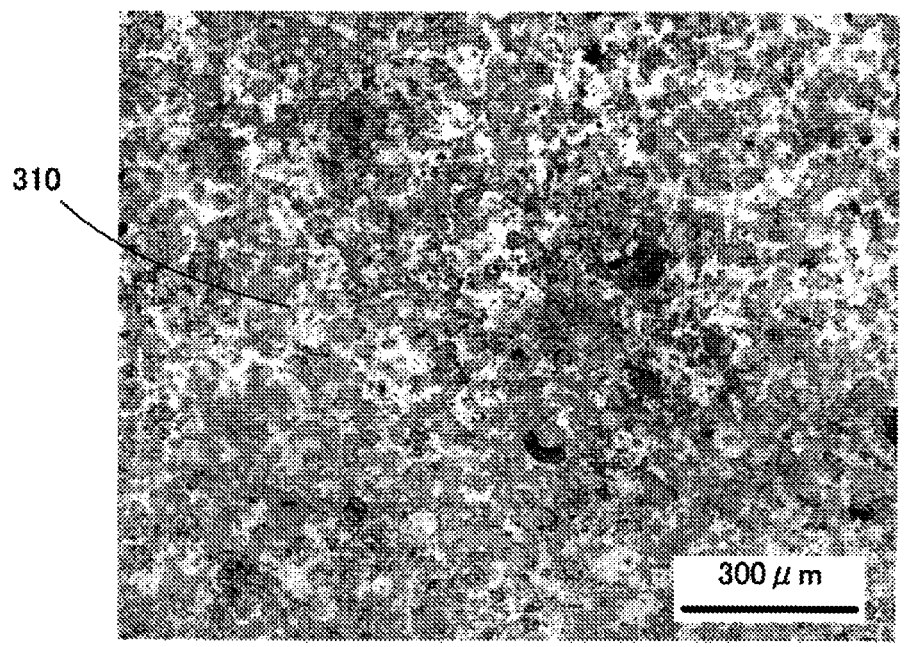
FIGS. 16A and 16B are optical micrographs of films formed in an example.
Figure 16B:
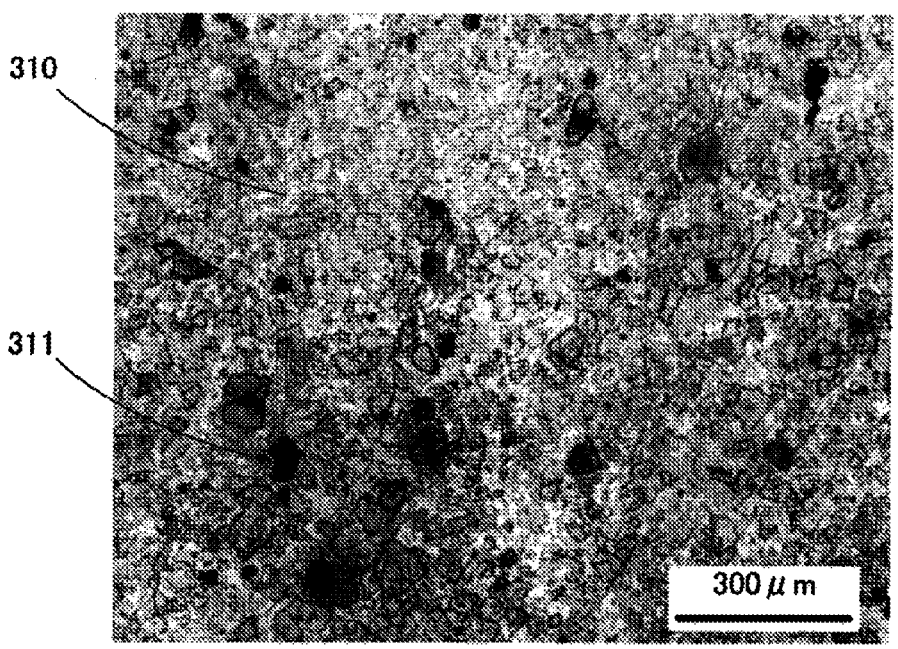

Here, an optical micrograph of the stacked film formed in this example is shown in FIG. 16A. For comparison, an optical micrograph of a single-layer film including graphene oxide with approximately the same thickness as the stacked film is shown in FIG. 16B. The single-layer film was formed by applying the dispersion liquid once over the substrate with the distance between the substrate surface and the blade set relatively large. For example, the single-layer film corresponds to the film including an excess amount of graphene oxide of (S1) in FIG. 3A.

The single-layer film shown in FIG. 16B included more aggregations 311 in addition to graphene oxide 310 than the stacked film shown in FIG. 16A. This shows that when the distance between the substrate surface and the blade is set extremely small and the dispersion liquid is applied extremely thin over the substrate surface, the film including graphene oxide with few aggregations can be formed.

Next, treatment for immersing the stacked film in an acidic solution was performed in order to increase the resistance to peeling of the film including graphene oxide. This time, a resist stripper used for separating a resist mask was used as the acidic solution. Specifically, "STRIP-710" produced by Tokyo Ohka Kogyo Co., Ltd. that contains o-dichlorobenzene, phenol, and alkyl benzene sulfonate as main components (hereinafter simply referred to as "710-stripper") was used. For example, the acidic solution can contain o-dichlorobenzene, phenol, and alkyl benzene sulfonate at more than or equal to 40 wt % and less than or equal to 70 wt %, more than or equal to 20 wt % and less than or equal to 30 wt %, and more than or equal to 10 wt % and less than or equal to 30 wt %, respectively. The 710-stripper used here as the acidic solution contains o-dichlorobenzene, phenol, and alkyl benzene sulfonate at 56 wt %, 23 wt %, 21 wt %, respectively. The temperature of the 710-stripper was set at approximately 55° C., and the substrate was immersed in the 710-stripper for 1 minute. Then, the substrate was washed with a rinse liquid, isopropyl alcohol, and ethanol.

Next, a resist mask was formed over the stacked film consisting of the films including graphene oxide by a photolithography technique. Specifically, the resist mask was formed by forming a resist with a thickness of approximately 2.7 µm by spin coating and performing light exposure for 9 seconds and development for 55 seconds. At this time, an alkaline solution was used as the developer, but the stacked film consisting of the films including graphene oxide was not peeled. Specifically, as the developer, "NMD-3" produced by Tokyo Ohka Kogyo Co., Ltd. that contains tetra-methyl ammonium hydroxide (TMAH) at 2.38% was used.

Next, using the resist mask as a mask, the stacked film consisting of the films including graphene oxide was processed by dry etching. Then, the resist mask was removed using the 710-stripper. After that, the substrate was washed with a rinse liquid, isopropyl alcohol, and ethanol.

Next, graphene oxide included in the stacked film was chemically reduced using a mixed solution containing 4.05 g of an ascorbic acid, 30 mL of pure water, and 270 mL of NMP (also called N-methylpyrrolidone, 1-methyl-2-pyrrolidone, or N-methyl-2-pyrrolidone). More specifically, the temperature of the mixed solution was set at approximately 50° C., and the substrate over which the stacked film was formed was immersed in the mixed solution for 1 hour. Then, the substrate was washed with ethanol.

Furthermore, the substrate over which the stacked film was formed was heated in a reduced-pressure atmosphere to perform thermal reducing treatment. Specifically, heating at 130° C. was performed for 3.5 hours, then heating at 170° C. was performed for 2 hours, and further heating at 220° C. was performed for 10 hours.

Through the above-described process, the film including graphene was formed, and an element including the film including graphene was formed.

Figure 17A:
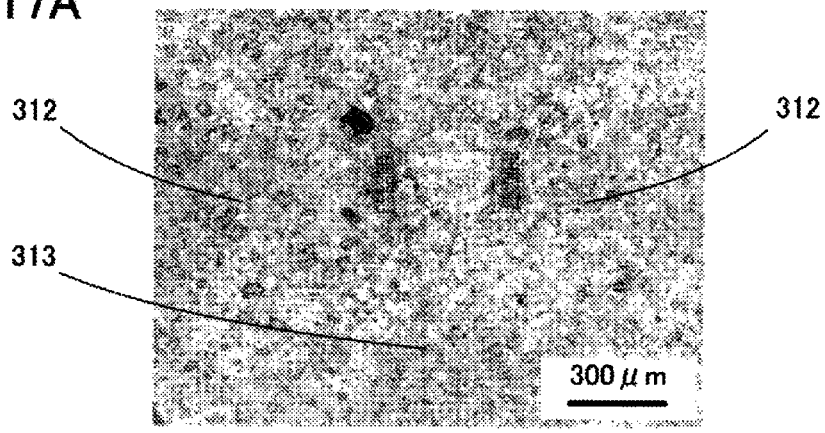
FIGS. 17A to 17C are optical micrographs of an element fabricated in an example.
Figure 17B:
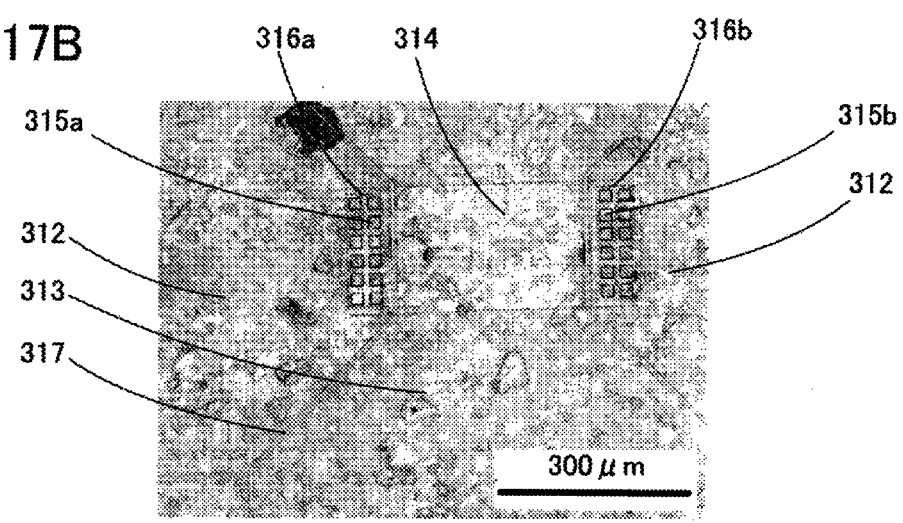
Figure 17C:
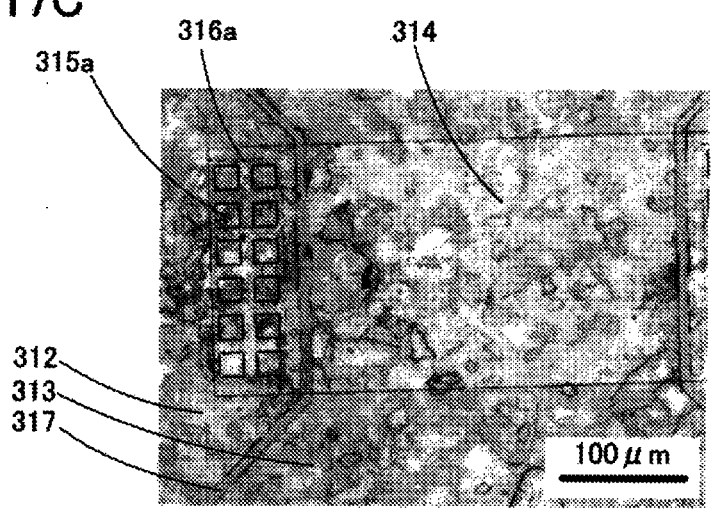

Here, an optical micrograph of the element including the film including graphene formed in this example is shown in FIG. 17A. FIG. 17B is an enlarged view of FIG. 17A, and FIG. 17C is an enlarged view of FIG. 17B.

For example, an electrode 312 corresponds to the piece 111a of the element 300 described in Embodiment 1, and an electrode 313 corresponds to the electrode 112a of the element 300 described in Embodiment 1. Furthermore, the electrode 312 and the electrode 313 are separated from each other by a region 317 where the film including graphene is removed.

An electrode 314 corresponds to the third conductive film 123 of the element 300 described in Embodiment 1, and an opening 315a corresponds to the third opening 124c of the element 300 described in Embodiment 1. Furthermore, an opening 315b corresponds to the fourth opening 124d of the element 300 described in Embodiment 1.

An electrode 316a corresponds to the conductive film 125c of the element 300 described in Embodiment 1. Although unclear from FIG. 17C, uneven surfaces like the left end portion of the conductive film 125c illustrated in FIG. 5C exist at the left end portion of the electrode 316a. Furthermore, an electrode 316b corresponds to the conductive film 125d of the element 300 described in Embodiment 1.

Figure 18A:
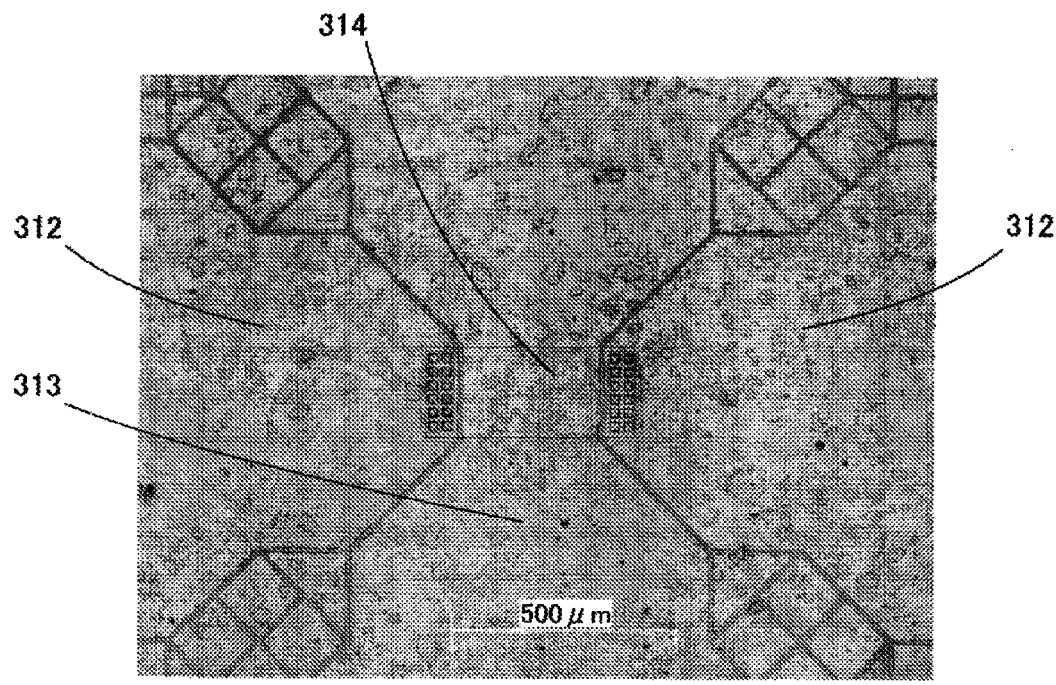
FIGS. 18A and 18B are optical micrographs of an element fabricated in an example.
Figure 18B:
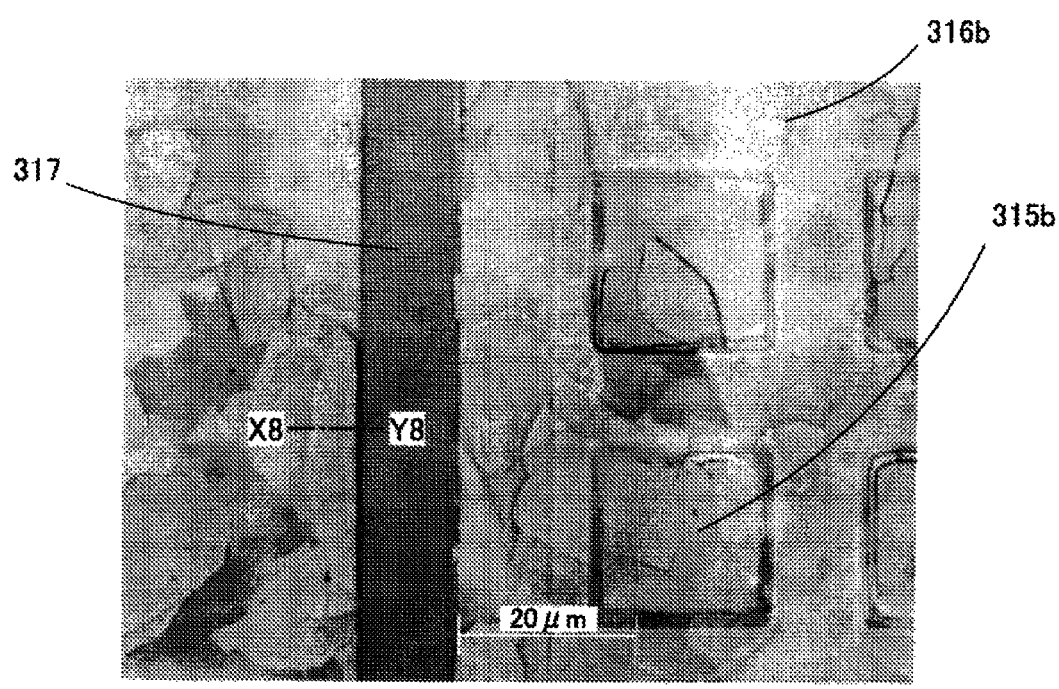
Figure 19A:
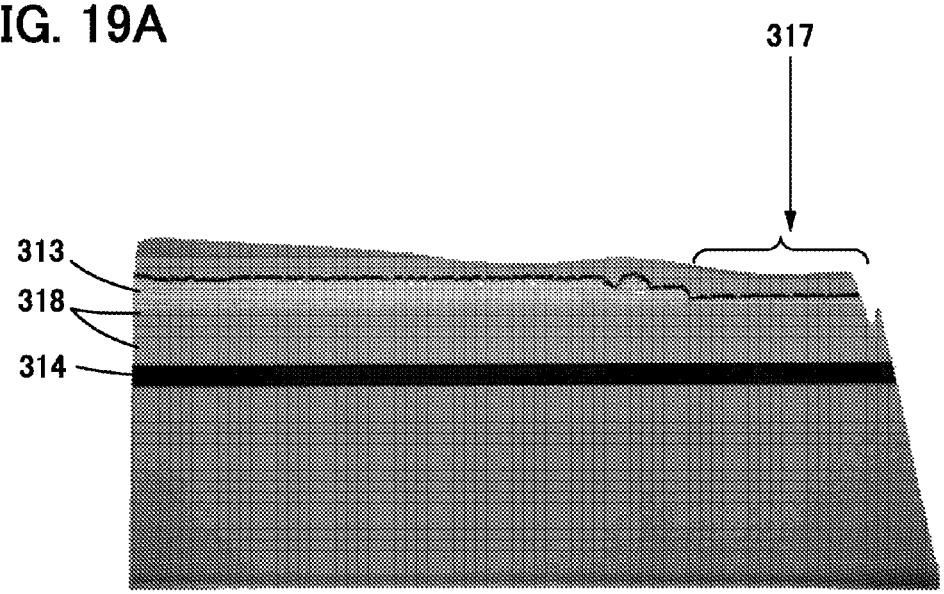
FIGS. 19A and 19B are transmission electron microscopy images of an element fabricated in an example.
Figure 19B:
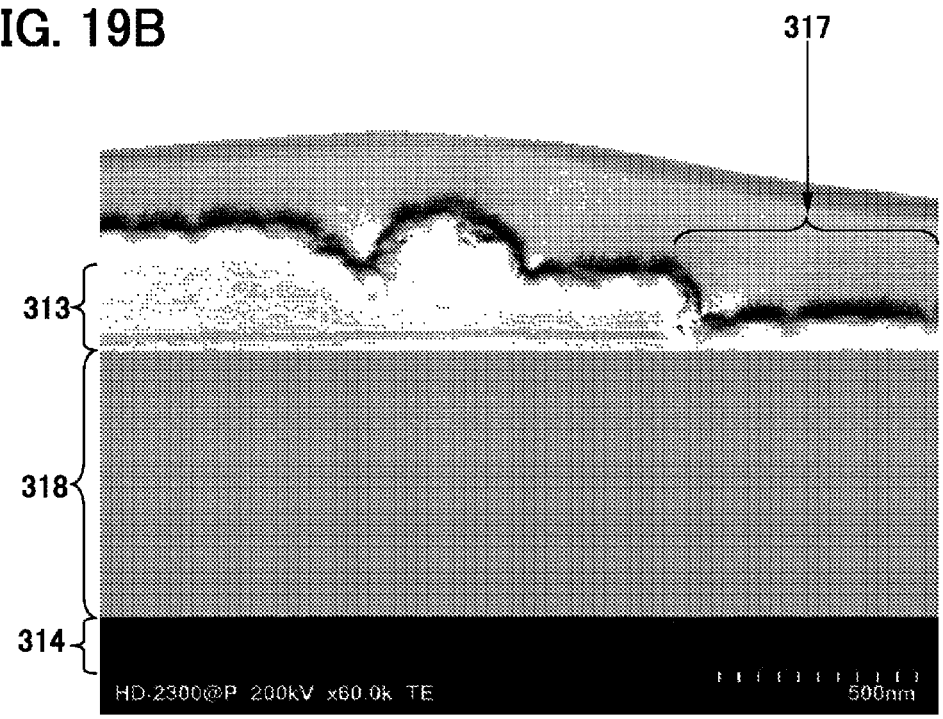

Here, a cross-sectional shape of the element including the film including graphene formed in this example is described. FIG. 18A is an optical micrograph of the element including the film including graphene formed in this example, and FIG. 18B is an enlarged view of FIG. 18A. Transmission electron microscope (TEM) images along X8-Y8 in FIG. 18B are shown in FIGS. 19A and 19B. FIG. 19B is an enlarged view of FIG. 19A. In FIGS. 19A and 19B, the electrode 314 is a conductive film of indium tin oxide containing silicon oxide, the insulating film 318 is the stacked film including an insulating film of silicon oxynitride and an insulating film of silicon nitride, and the electrode 313 is the film including graphene. The electrode 313 was removed selectively by a photolithography technique to form the region 317. Note that the films formed over the electrode 313 in FIGS. 19A and 19B are the films formed only for taking the TEM images and do not form the element.

It was confirmed that the electrode 312 and the electrode 313 shown in FIGS. 17A to 17C and FIGS. 18A and 18B formed a capacitor, and the element was able to detect a change in capacitance in a space between the electrode 312 and the electrode 313.

Example 2

In this example, evaluation results of optical properties of the element formed in Example 1 will be described.

Figure 20:
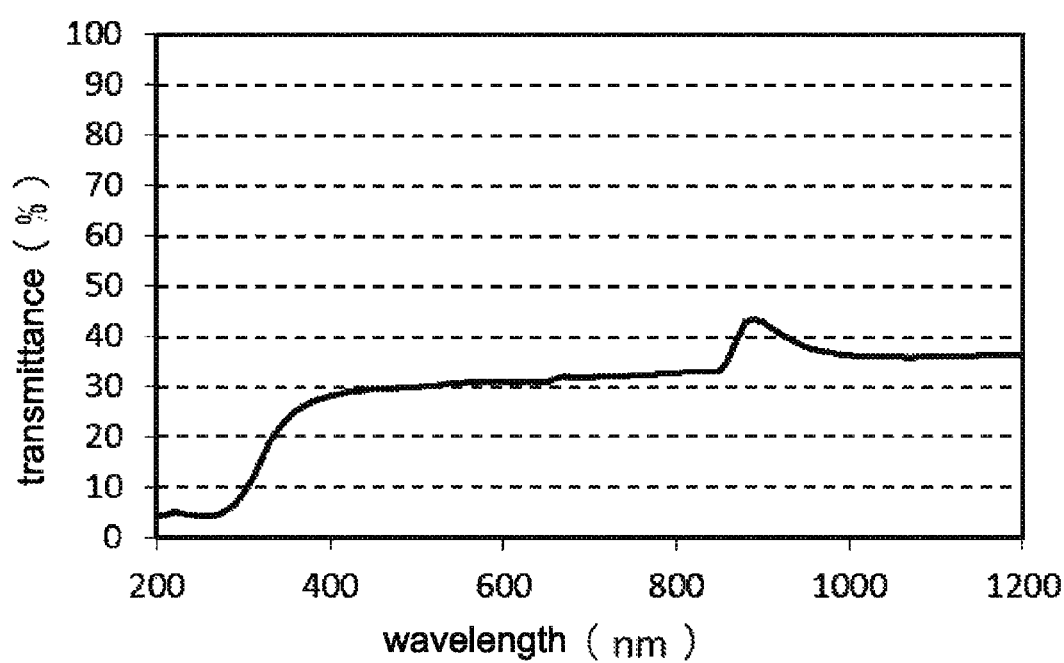
FIG. 20 shows optical properties of an element fabricated in an example.

The transmittance of the element formed in Example 1 with respect to the wavelength of incident light was measured. The results are shown in FIG. 20. The transmittance was measured with the use of a spectrophotometer, U-4100, manufactured by Hitachi High-Technologies Corporation.

According to FIG. 20, the element formed in Example 1 has an average transmittance of 30.5% in the wavelength range of from 450 nm to 650 nm. This shows that increasing the thickness of the film including graphene allows the electrode formed of the film including graphene to have a light-blocking function in addition to the conducting function, for example. That is, in the case where the film including graphene formed by the method described in any of the above embodiments is used to form an electrode of a capacitor provided overlapping with a display device, the electrode can also function as a light-blocking layer of the display device.

This application is based on Japanese Patent Application serial no. 2013-249210 filed with Japan Patent Office on Dec. 2, 2013, Japanese Patent Application serial no. 2013-249212 filed with Japan Patent Office on Dec. 2, 2013, and Japanese Patent Application serial no. 2014-121142 filed with Japan Patent Office on Jun. 12, 2014, the entire contents of which are hereby incorporated by reference.

What is claimed is:

1. An element comprising:
a base film;
a conductive film over the base film;
an insulating film over the conductive film; and
a graphene film over the insulating film;
wherein the insulating film has an opening,
wherein the graphene film is electrically connected to the conductive film through the opening,
wherein the insulating film has an inclined surface on end portion of the insulating film,
wherein an angle between the inclined surface and a surface of the base film at the end portion is less than or equal to 30°.

2. The element according to claim 1,
wherein the angle between the inclined surface and the surface of the base film at the end portion is more than 0° and less than or equal to 15°.

3. The element according to claim 1,
wherein the angle is increased from the end portion of the insulating film toward a thickness of the insulating film increasing direction of the insulating film.

4. The element according to claim 1,
wherein the graphene film covers the inclined surface.

5. The element according to claim 1,
wherein the graphene film includes oxygen.

6. The element according to claim 1,
wherein the insulating film covers an end portion of the conductive film.

7. The element according to claim 1,
wherein the opening is overlapping with the conductive film.

8. A touch panel comprising:
a display portion; and
a touch sensor comprising the element according to claim 1.

9. A portable data processing device comprising the touch panel according to claim 8.

10. An element comprising:
a base film;
a conductive film over the base film;
an insulating film over the conductive film; and
a graphene film over the insulating film;
wherein the insulating film has an opening,
wherein the graphene film is electrically connected to the conductive film through the opening,
wherein the insulating film has an inclined surface on end portion of the insulating film,
wherein an angle between the inclined surface and a surface of the conductive film at the end portion is less than or equal to 30°.

11. The element according to claim 10,
wherein the angle between the inclined surface and the surface of the conductive film at the end portion is more than 0° and less than or equal to 15°.

12. The element according to claim 10,
wherein the angle is increased from the end portion of the insulating film toward a thickness of the insulating film increasing direction of the insulating film.

13. The element according to claim 10,
wherein the graphene film covers the inclined surface.

14. The element according to claim 10,
wherein the graphene film includes oxygen.

15. The element according to claim 10,
wherein the insulating film covers an end portion of the conductive film.

16. The element according to claim 10,
wherein the opening is overlapping with the conductive film.

17. A touch panel comprising:
a display portion; and
a touch sensor comprising the element according to claim 10.

18. A portable data processing device comprising the touch panel according to claim 17.

* * * * *